United States Patent
Park

(10) Patent No.: US 12,402,527 B2
(45) Date of Patent: Aug. 26, 2025

(54) LIGHT-EMITTING DEVICE, METHOD OF MANUFACTURING THE SAME, AND ELECTRONIC APPARATUS INCLUDING THE LIGHT-EMITTING DEVICE

(71) Applicant: Samsung Display Co., Ltd., Yongin-si (KR)

(72) Inventor: Hyejeong Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 899 days.

(21) Appl. No.: 17/127,218

(22) Filed: Dec. 18, 2020

(65) Prior Publication Data

US 2021/0399222 A1    Dec. 23, 2021

(30) Foreign Application Priority Data

Jun. 19, 2020    (KR) .......................... 10-2020-0074956

(51) Int. Cl.
*H10K 85/60*    (2023.01)
*H10K 50/15*    (2023.01)
(Continued)

(52) U.S. Cl.
CPC ........... *H10K 85/636* (2023.02); *H10K 50/15* (2023.02); *H10K 50/156* (2023.02);
(Continued)

(58) Field of Classification Search
CPC .. H10K 85/633; H10K 85/40; H10K 85/6572; H10K 85/6574; H10K 85/6576;
(Continued)

(56) References Cited

U.S. PATENT DOCUMENTS 8,183,762 B2    5/2012    Kim et al.
9,978,473 B2    5/2018    Seshadri et al.
(Continued)

FOREIGN PATENT DOCUMENTS

CN    1950479 A    4/2007
CN    103483208 A    1/2014
(Continued)

OTHER PUBLICATIONS

Adachi, Chihaya, Kazukiyo Nagai, and Nozomu Tamoto. "Molecular design of hole transport materials for obtaining high durability in organic electroluminescent diodes." Applied Physics Letters 66.20 (1995): 2679-2681. (Year: 1995).*

(Continued)

*Primary Examiner* — Dawn L Garrett
(74) *Attorney, Agent, or Firm* — Lerner David LLP

(57) ABSTRACT

A light-emitting device includes a first electrode; a second electrode facing the first electrode; and an interlayer disposed between the first electrode and the second electrode. The interlayer includes an emission layer and a hole transport region disposed between the first electrode and the emission layer. The hole transport region includes a hole injection layer and a hole transport layer disposed between the hole injection layer and the emission layer. The hole injection layer includes a first compound, the hole transport layer includes a second compound, and a glass transition temperature of the first compound is lower than a glass transition temperature of the second compound.

19 Claims, 3 Drawing Sheets

(51) Int. Cl.
*H10K 50/17* (2023.01)
*H10K 101/20* (2023.01)

(52) U.S. Cl.
CPC ....... *H10K 85/633* (2023.02); *H10K 85/6572* (2023.02); *H10K 50/17* (2023.02); *H10K 2101/20* (2023.02)

(58) Field of Classification Search
CPC .... H10K 50/155; H10K 50/171; H10K 50/15; H10K 50/17; H10K 85/342; H10K 85/636; H10K 71/00; H10K 85/324; H10K 85/346; H10K 85/348; H10K 85/615; H10K 85/622; H10K 85/624; H10K 85/626; H10K 85/631; H10K 85/654; H10K 85/657; H10K 59/00; H10K 2101/00
See application file for complete search history.

(56) References Cited

U.S. PATENT DOCUMENTS

| | | | |
|---|---|---|---|
| 2002/0057050 A1* | 5/2002 | Shi | C07C 211/54 548/440 |
| 2006/0083925 A1* | 4/2006 | Laine | C07F 7/21 428/405 |
| 2008/0199726 A1 | 8/2008 | Schafer et al. | |
| 2013/0328021 A1 | 12/2013 | Lim et al. | |
| 2014/0197399 A1 | 7/2014 | Taka | |
| 2014/0353619 A1* | 12/2014 | Park | H10K 50/844 438/34 |
| 2015/0236261 A1* | 8/2015 | Stoessel | H10K 85/40 252/500 |
| 2017/0062727 A1* | 3/2017 | Hwang | H10K 85/636 |

FOREIGN PATENT DOCUMENTS

| | | | | |
|---|---|---|---|---|
| CN | 108929234 A | * | 12/2018 | ........... C07C 211/54 |
| JP | 2007088430 A | * | 4/2007 | ......... H01L 51/5056 |
| JP | 5892924 | | 3/2016 | |
| JP | 6160485 | | 7/2017 | |
| KR | 10-2007-0024409 | | 3/2007 | |
| KR | 10-2008-0048339 | | 6/2008 | |
| KR | 20090041040 A | * | 4/2009 | |
| KR | 10-2010-0123172 | | 11/2010 | |
| KR | 10-1329047 | | 11/2013 | |
| KR | 10-2014-0089364 | | 7/2014 | |
| KR | 10-1424266 | | 7/2014 | |
| KR | 10-2015-0058396 | | 5/2015 | |
| KR | 10-2017-0023372 | | 3/2017 | |

OTHER PUBLICATIONS

Huang, Xiao-Lan, et al. "A high Tg small-molecule arylamine derivative as a doped hole-injection/transport material for stable organic light-emitting diodes." Organic Electronics 58 (2018): 139-144. (Year: 2018).*
Machine translation for JP 2007-088430 A (publication date: Apr. 2007). (Year: 2007).*
Machine translation for KR 10-2009-0041040 A (publication date Apr. 2009). (Year: 2009).*
Machine translation for CN-108929234-A (publication date Dec. 2018). (Year: 2018).*
O'Brien, D. F., Burrows, P. E., Forrest, S. R., Koene, B. E., Loy, D. E., & Thompson, M. E. (1998). Hole transporting materials with high glass transition temperatures for use in organic light-emitting devices. Advanced Materials, 10(14), 1108-1112. (Year: 1998).*

* cited by examiner

LIGHT-EMITTING DEVICE, METHOD OF MANUFACTURING THE SAME, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2020-0074956 under 35 U.S.C. § 119, filed on Jun. 19, 2020 in the Korean Intellectual Property Office, the entire contents of which are incorporated herein by reference.

BACKGROUND

1. Technical Field

Embodiments relate to a light-emitting device, a method of manufacturing the light-emitting device and an electronic apparatus including the same.

2. Description of the Related Art

Light-emitting devices are devices that convert electrical energy into light energy. Examples of such light-emitting devices include organic light-emitting devices using organic materials for an emission layer, quantum dot light-emitting devices using quantum dots for an emission layer, and the like.

In a light-emitting device, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

Embodiments relate to a light-emitting device, a method of manufacturing the same, and an electronic apparatus including the light-emitting device. Embodiments relate to a light-emitting device including a hole injection layer and a hole transport layer, wherein a glass transition temperature of a compound included in the hole injection layer is lower than that of a compound included in the hole transport layer.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, and an interlayer disposed between the first electrode and the second electrode,
  wherein the interlayer may include an emission layer and
    a hole transport region disposed between the first electrode and the emission layer,
  the hole transport region may include a hole injection layer, and a hole transport layer disposed between the hole injection layer and the emission layer,
  the hole injection layer may include a first compound, the hole transport layer may include a second compound, and
  a glass transition temperature of the first compound may be lower than a glass transition temperature of the second compound.

In an embodiment, the hole injection layer may further include a third compound having a glass transition temperature higher than the glass transition temperature of the first compound.

In an embodiment, the third compound may be identical to the second compound included in the hole transport layer.

In an embodiment, a weight ratio of the first compound to the third compound in the hole injection layer may be in a range of about 9:1 to about 1:9.

In an embodiment, the first compound may be an amine compound represented by Formula 1, and the second compound may be an amine compound represented by Formula 2:

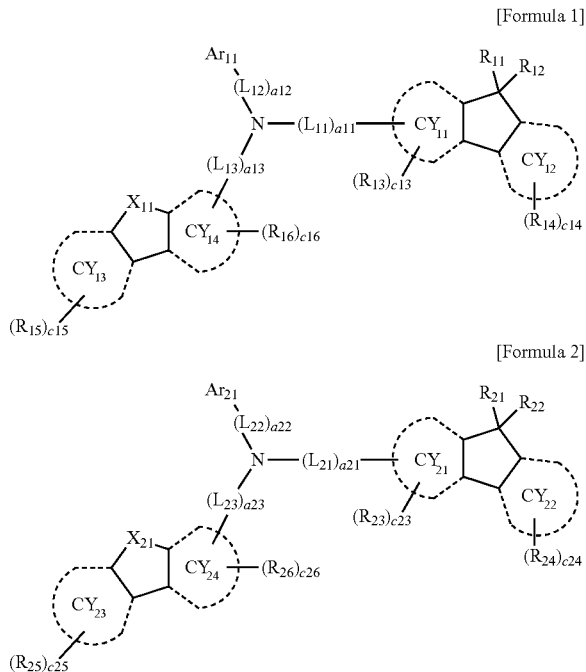

[Formula 1]

[Formula 2]

In Formulae 1 and 2,
  ring $CY_{11}$ to ring $CY_{14}$ and ring $CY_{21}$ to ring $CY_{24}$ may each independently be a $C_3$-$C_{30}$ carbocyclic group or a $C_1$-$C_{20}$ heterocyclic group,
  $L_{11}$ to $L_{13}$ and $L_{21}$ to $L_{23}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
  a11 to a13 and a21 to a23 may each independently be an integer from 0 to 5,
  $Ar_{11}$ and $Ar_{21}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
  $X_{11}$ may be O, S, N($R_{17}$), C($R_{17}$)($R_{18}$), or Si($R_{17}$)($R_{18}$),
  $X_{21}$ may be O, S, N($R_{27}$), C($R_{27}$)($R_{28}$), or Si($R_{27}$)($R_{28}$),
  $R_{11}$ and $R_{12}$ may each independently be a $C_2$-$C_{11}$ alkyl group unsubstituted or substituted with at least one $R_{10a}$, $R_{21}$ and $R_{22}$ may each independently be a $C_1$-$C_{10}$ alkyl group unsubstituted or substituted with at least one $R_{10a}$, $R_{13}$ to $R_{18}$ and $R_{23}$ to $R_{28}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —B($Q_1$)($Q_2$), —P($Q_1$)($Q_2$), or —C(=O)($Q_1$), $R_{17}$ and $R_{18}$ may optionally be linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{27}$ and $R_{28}$ may optionally be linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, c13, c16, c23, and c26 may each independently be an integer from 1 to 3, c14, c15, c24, and c25 may each independently be an integer from 1 to 4, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

In an embodiment, the hole injection layer may include two or more different first compounds represented by Formula 1, and at least one of the two or more different first compounds may have a glass transition temperature lower than the glass transition temperature of the second compound.

In an embodiment, the hole injection layer may further include a p-dopant.

In an embodiment, the hole transport region may further include an emission auxiliary layer, an electron blocking layer, or a combination thereof.

In an embodiment, the hole transport region may further include an electron blocking layer disposed between the hole transport layer and the emission layer.

In an embodiment, the interlayer may further include an electron transport region disposed between the emission layer and the second electrode, and the electron transport region may include a buffer layer, a hole blocking layer, an electron control layer, an electron transport layer, an electron injection layer, or a combination thereof.

In an embodiment, the electron transport region may include a hole blocking layer, an electron transport layer, and an electron injection layer that are sequentially disposed on the emission layer.

According to embodiments, a method of manufacturing a light-emitting device may include forming a hole injection layer on a first electrode, the hole injection layer including a first compound, forming a hole transport layer on the hole injection layer, the hole transport layer including a second compound having a glass transition temperature higher than a glass transition temperature of the first compound, forming an emission layer on the hole transport layer, forming a second electrode on the emission layer to form a light-emitting device, and performing heat treatment on the light-emitting device.

According to embodiments, an electronic apparatus may include the light-emitting device.

In an embodiment, the electronic apparatus may further include a thin-film transistor. The thin film transistor may include a source electrode and a drain electrode, and the first electrode of the light-emitting device may be in electrical contact with one of the source electrode and the drain electrode of the thin-film transistor.

In an embodiment, the electronic apparatus may further include a color filter, a color conversion layer, a touch screen layer, a polarization layer, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
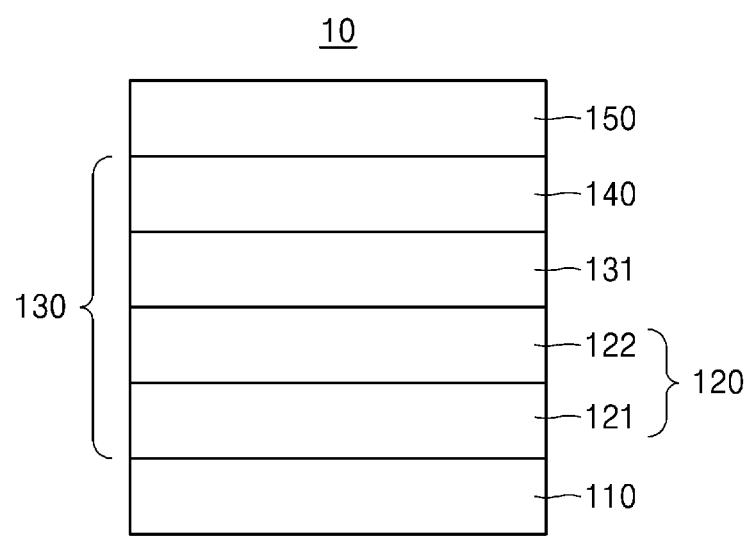
FIG. 1 is a schematic cross-sectional view of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

Embodiments of the disclosure will be described below in more detail with reference to the accompanying drawings. Those components that are the same or are in correspondence with each other are rendered the same reference numeral regardless of the figure number, and redundant explanations are omitted.

An expression used in the singular encompasses the expression of the plural unless it has a clearly different meaning in the context.

It should be understood that the terms "comprises," "comprising," "includes," "including," "have," "having," "contains," and/or "containing" are intended to specify the presence of stated features, integers, steps, operations, elements, components, or combinations thereof in the disclosure, but do not preclude the presence or addition of one or more other features, integers, steps, operations, elements, components, or combinations thereof.

In the specification, it will be understood that when an element (a region, a layer, a section, or the like) is referred to as being "on", "connected to" or "coupled to" another element, it can be directly on, connected or coupled to the other element, or one or more intervening elements may be disposed therebetween.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms "below," "lower," "above," "upper," and the like are used to describe the relationship of the configurations shown in the drawings. The terms are used as a relative concept and are described with reference to the direction indicated in the drawings.

Sizes of elements in the drawings may be exaggerated for convenience of explanation. Therefore, because sizes and thicknesses of components in the drawings are arbitrarily illustrated for convenience of explanation, the following embodiments are not limited thereto.

The term "interlayer" as used herein refers to a single layer, some layers, and/or all layers disposed between a first electrode and a second electrode of a light-emitting device.

The expression "(an interlayer) includes a compound represented by Formula 1" as used herein may include a case in which "(an interlayer) includes one compound of Formula 1 or two or more different compounds of Formula 1."

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

The structure of the light-emitting device 10 according to an embodiment and a method of manufacturing the light-emitting device 10 will be described in connection with FIG. 1.

[First Electrode 110]

In FIG. 1, a substrate may be additionally disposed under the first electrode 110 or above the second electrode 150. The substrate may be a glass substrate or a plastic substrate. The substrate may be a flexible substrate. For example, the substrate may include plastics with excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing or sputtering a material for forming the first electrode 110 on the substrate. When the first electrode 110 is an anode, a high work function material that can easily inject holes may be used as the material for forming the first electrode 110.

The first electrode 110 may be a reflective electrode, a semi-transmissive electrode, or a transmissive electrode. In an embodiment, when the first electrode 110 is a transmissive electrode, the material for forming the first electrode 110 may include indium tin oxide (ITO), indium zinc oxide (IZO), tin oxide ($SnO_2$), zinc oxide (ZnO), or a combination thereof. In embodiments, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or a combination thereof.

The first electrode 110 may have a single-layered structure consisting of a single layer or a multi-layered structure including multiple layers. For example, the first electrode 110 may have a three-layered structure of ITO/Ag/ITO.

[Interlayer 130]

The interlayer 130 is disposed on the first electrode 110. The interlayer 130 may include an emission layer 131.

The interlayer 130 may include a hole transport region 120 disposed between the first electrode 110 and the emission layer 131 and an electron transport region 140 disposed between the emission layer 131 and the second electrode 150. In FIG. 1, an embodiment where the light-emitting device 10 includes the electron transport region 140 is illustrated. However, the electron transport region 140 may be omitted, as necessary.

The interlayer 130 may further include metal-containing compounds such as organometallic compounds, inorganic materials such as quantum dots, and the like, in addition to various organic materials.

The interlayer 130 may include, i) two or more emitting units sequentially stacked between the first electrode 110 and the second electrode 150 and ii) a charge generation layer disposed between the two emitting units. When the interlayer 130 includes the emitting units and the charge generation layer as described above, the light-emitting device 10 may be a tandem light-emitting device.

[Hole Transport Region 120 in Interlayer 130]

The hole transport region 120 may include a hole injection layer 121 and a hole transport layer 122. The hole transport layer 122 may be disposed between the hole injection layer 121 and the emission layer 131.

The hole injection layer 121 may include a first compound, and the hole transport layer 122 may include a second compound, wherein a glass transition temperature of the first compound may be lower than a glass transition temperature of the second compound.

When a compound having a glass transition temperature lower than the glass transition temperature of the second compound included in the hole transport layer 122 is used as the first compound included in the hole injection layer 121, the light-emitting device 10 may have a long lifespan by lowering a driving voltage and improving luminance uniformity.

Furthermore, when the hole injection layer 121 includes the first compound having a glass transition temperature lower than the glass transition temperature of the second compound, the surface uniformity at the interface between the hole injection layer 121 and the hole transport layer 122 may be improved through a heat treatment process performed after the manufacture of the light-emitting device 10. Accordingly, the light-emitting device 10 may have a low driving voltage, high efficiency, and a long lifespan.

In a light-emitting device of the related art, a material having a high glass transition temperature is used as an organic material for a light-emitting device in order to prevent deterioration of the device performance. However, by introducing a material having a glass transition temperature lower than the glass transition temperature of a material included in the hole transport layer 122 to a hole injection layer 121, the light-emitting device 10 according to an embodiment of the disclosure may improve the surface uniformity at the interface between the hole injection layer 121 and the hole transport layer 122. Accordingly, the light-emitting device 10 is characterized in having significantly improved luminance uniformity and lifespan compared to a light-emitting device of the related art.

In a light-emitting device of the related art, when a material having a low glass transition temperature is included in the hole transport layer, crystallization of the material may occur upon heating, and such crystallization may cause current leakage in the light-emitting device. Therefore, in the light-emitting device 10 according to an embodiment of the disclosure, when the hole injection layer 121 includes a compound having a low glass transition temperature and the hole transport layer 122 includes a compound having a glass transition temperature higher than the glass transition temperature of the material included in the hole injection layer 121, the light-emitting device 10 may be stable from heat generated by a heat treatment process during the manufacture of the light-emitting device 10 or by operation of the light-emitting device 10.

In an embodiment, the hole injection layer 121 may further include a third compound having a glass transition temperature higher than the glass transition temperature of the first compound.

Here, the third compound included in the hole injection layer 121 may be identical to or different from each other the second compound included in the hole transport layer 122. For example, the third compound included in the hole injection layer 121 may be identical to the second compound included in the hole transport layer 122.

In an embodiment, the hole injection layer 121 may include the first compound and the third compound, and a ratio of the first compound to the third compound included in the hole injection layer 121 may be in a range of about 9:1 to about 1:9. For example, the ratio of the first compound to the third compound included in the hole injection layer 121 may be in a range of about 8:2 to about 2:8, For example, the ratio of the first compound to the third compound included in the hole injection layer 121 may be in a range of about 7:3 to about 3:7. However, embodiments of the disclosure are not limited thereto.

In an embodiment, the first compound may be an amine compound represented by Formula 1, and the second compound may be an amine compound represented by Formula 2:

[Formula 1]

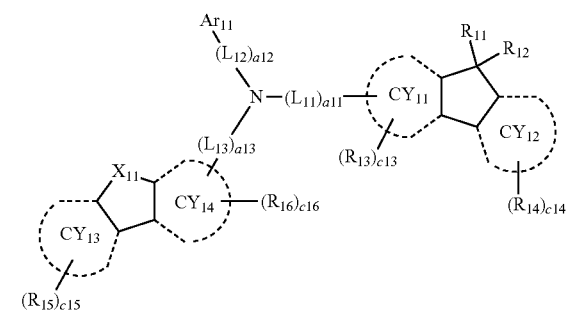

-continued

[Formula 2]

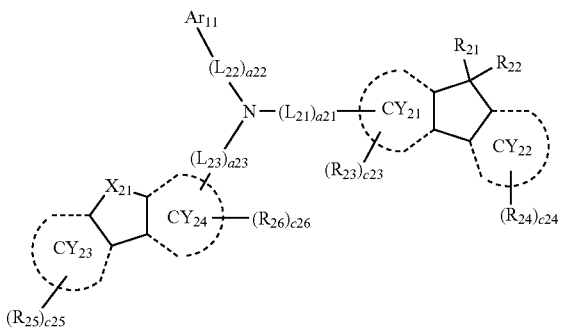

wherein in Formulae 1 and 2, ring $CY_{11}$ to ring $CY_{14}$ and ring $CY_{21}$ to ring $CY_{24}$ may each independently be a $C_3$-$C_{30}$ carbocyclic group or a $C_1$-$C_{20}$ heterocyclic group, $L_{11}$ to $L_{13}$ and $L_{21}$ to $L_{23}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a13 and a21 to a23 may each independently be an integer from 0 to 5, $Ar_{11}$ and $Ar_{21}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{11}$ may be O, S, $N(R_{17})$, $C(R_{17})(R_{18})$, or $Si(R_{17})(R_{18})$, $X_{21}$ may be O, S, $N(R_{27})$, $C(R_{27})(R_{28})$, or $Si(R_{27})(R_{28})$, $R_{11}$ and $R_{12}$ may each independently be a $C_2$-$C_{11}$ alkyl group unsubstituted or substituted with at least one $R_{10a}$, $R_{21}$ and $R_{22}$ may each independently be a $C_1$-$C_{10}$ alkyl group unsubstituted or substituted with at least one $R_{10a}$, $R_{13}$ to $R_{18}$ and $R_{23}$ to $R_{28}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$B(Q_1)(Q_2)$, —$P(Q_1)(Q_2)$, or —$C(=O)(Q_1)$, $R_{17}$ and $R_{18}$ may optionally be linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{27}$ and $R_{28}$ may optionally be linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, c13, c16, c23, and c26 may each independently be an integer from 1 to 3, c14, c15, c24, and c25 may each independently be an integer from 1 to 4, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —Si$(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

In an embodiment, in Formulae 1 and 2, ring $CY_{11}$ to ring $CY_{14}$ and ring $CY_{21}$ to ring $CY_{24}$ may each independently be a benzene group, a naphthalene group, a phenanthrene group, or an anthracene group. In embodiments, ring $CY_{11}$ to ring $CY_{14}$ and ring $CY_{21}$ to ring $CY_{24}$ may each be a benzene group, but embodiments of the disclosure are not limited thereto.

In embodiments, in Formulae 1 and 2, a group represented by

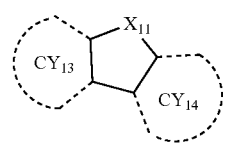

and a group represented by

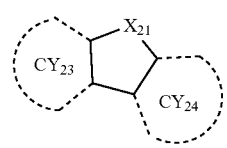

may each independently be represented by one of Formulae CY203, CY206, CY207, CY210, CY211, CY214, or CY217:

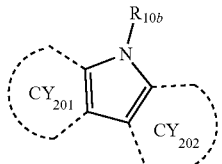
CY203

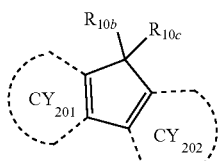
CY206

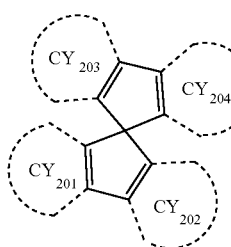
CY207

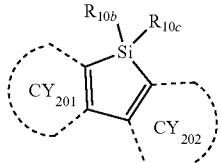
CY210

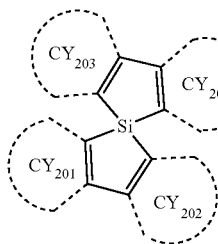
CY211

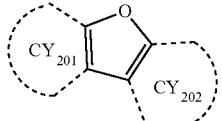
CY214

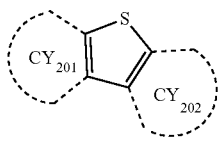
CY217

In Formulae CY203, CY206, CY207, CY210, CY211, CY214, and CY217, $R_{10b}$ and $R_{10c}$ may each be the same as described in connection with $R_{10a}$, and ring $CY_{201}$ to ring $CY_{204}$ may each independently be a $C_3$-$C_{30}$ carbocyclic group or a $C_1$-$C_{20}$ heterocyclic group.

In an embodiment, $L_{11}$ to $L_{13}$ and $L_{21}$ to $L_{23}$ in Formulae 1 and 2 may each independently be a benzene group, a pentalene group, an indene group, a naphthalene group, an azulene group, a heptalene group, an indacene group, an acenaphthalene group, a fluorene group, a spiro-bifluorene group, a spiro-benzofluorene-fluorene group, a benzofluorene group, a dibenzofluorene group, a phenalene group, a phenanthrene group, an anthracene group, a fluoranthene group, a pyrene group, a chrysene group, a naphthacene group, a picene group, a perylene group, a pyrrole group, a thiophene group, a furan group, a silole group, an imidazole group, a pyrazole group, a thiazole group, an isothiazole group, an oxazole group, an isoxazole group, a pyridine group, a pyrazine group, a pyrimidine group, a pyridazine group, a triazine group, a benzofuran group, a benzothiophene group, a dibenzofuran group, a dibenzothiophene group, a carbazole group, a benzosilole group, a dibenzosilole group, a quinoline group, an isoquinoline group, a benzimidazole group, an imidazopyridine group, or an imidazopyrimidine group, each unsubstituted or substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, a benzofuranyl group, a benzothiophenyl group, a dibenzofuranyl group, a dibenzothiophenyl group, a carbazolyl group, a benzosilolyl group, a dibenzosilolyl group, a quinolinyl group, an isoquinolinyl group, a benzimidazolyl group, an imidazopyridinyl group, an imidazopyrimidinyl group, —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, —P(=O)$(Q_{31})(Q_{32})$, or a combination thereof, and $Q_{31}$ to $Q_{33}$ may each independently be a $C_1$-$C_{10}$ alkyl group, a $C_1$-$C_{10}$ alkoxy group, a phenyl group, a phenyl group substituted with a cyano group, a biphenyl group, a terphenyl group, or a naphthyl group.

In Formulae 1 and 2, when a11 is 0, $(L_{11})_{a11}$ may be a single bond, when a12 is 0, $(L_{12})_{a12}$ may be a single bond, when a13 is 0, $(L_{13})_{a13}$ may be a single bond, when a21 is 0, $(L_{21})_{a21}$ may be a single bond, when a22 is 0, $(L_{22})_{a22}$ may be a single bond, and when a23 is 0, $(L_{23})_{a23}$ may be a single bond.

In an embodiment, a11 to a13 and a21 to a23 in Formulae 1 and 2 may each independently be 0 or 1.

In an embodiment, $Ar_{11}$ and $Ar_{21}$ in Formulae 1 and 2 may each independently be a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrycenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bi, dibenzothiophenylfluorenyl group, an azacarbazolyl group, a diazacarbazolyl group, an azadibenzofuranyl group, an azadibenzothiophenyl group, an azadibenzosilolyl group, an imidazopyridinyl group, or an imidazopyrimidinyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with at least one phenyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrycenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bi, dibenzothiophenylfluorenyl group, an azacarbazolyl group, a diazacarbazolyl group, an azadibenzofuranyl group, an azadibenzothiophenyl group, an azadibenzosilolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or a combination thereof.

In embodiments, $Ar_{11}$ and $Ar_{21}$ in Formulae 1 and 2 may each independently be one of groups represented by Formulae 5-1 to 5-21:

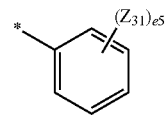
5-1

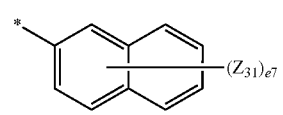
5-2

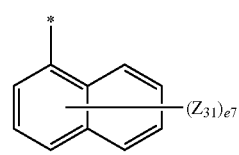
5-3

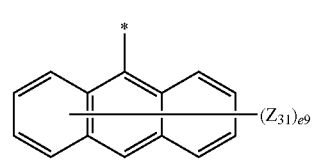
5-4

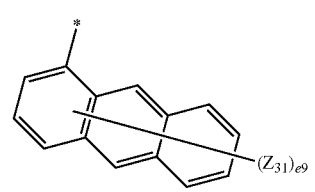
5-5

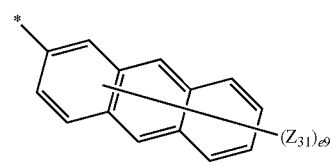
5-6

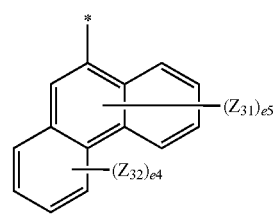
5-7

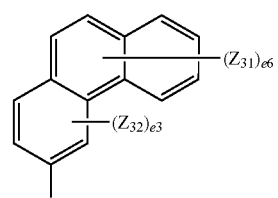
5-8

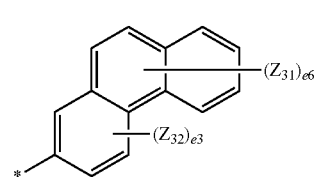
5-9

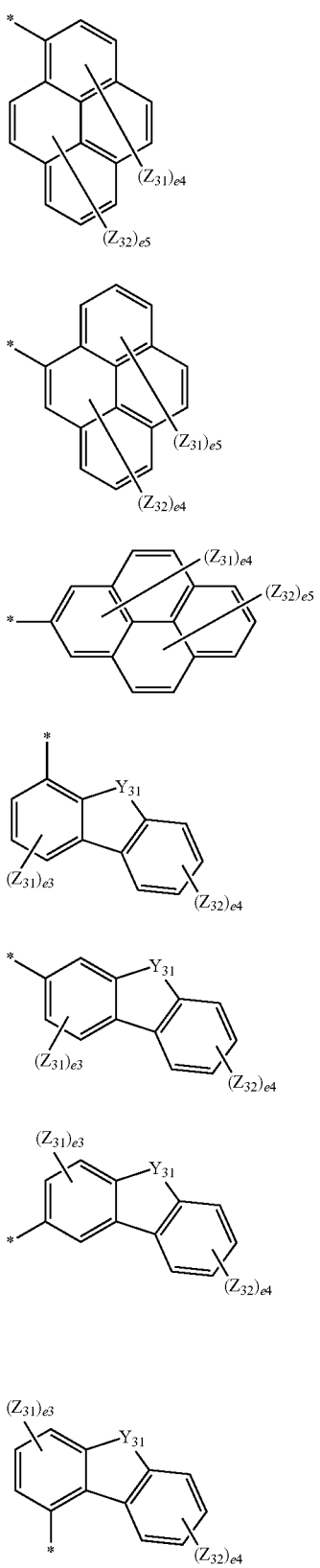
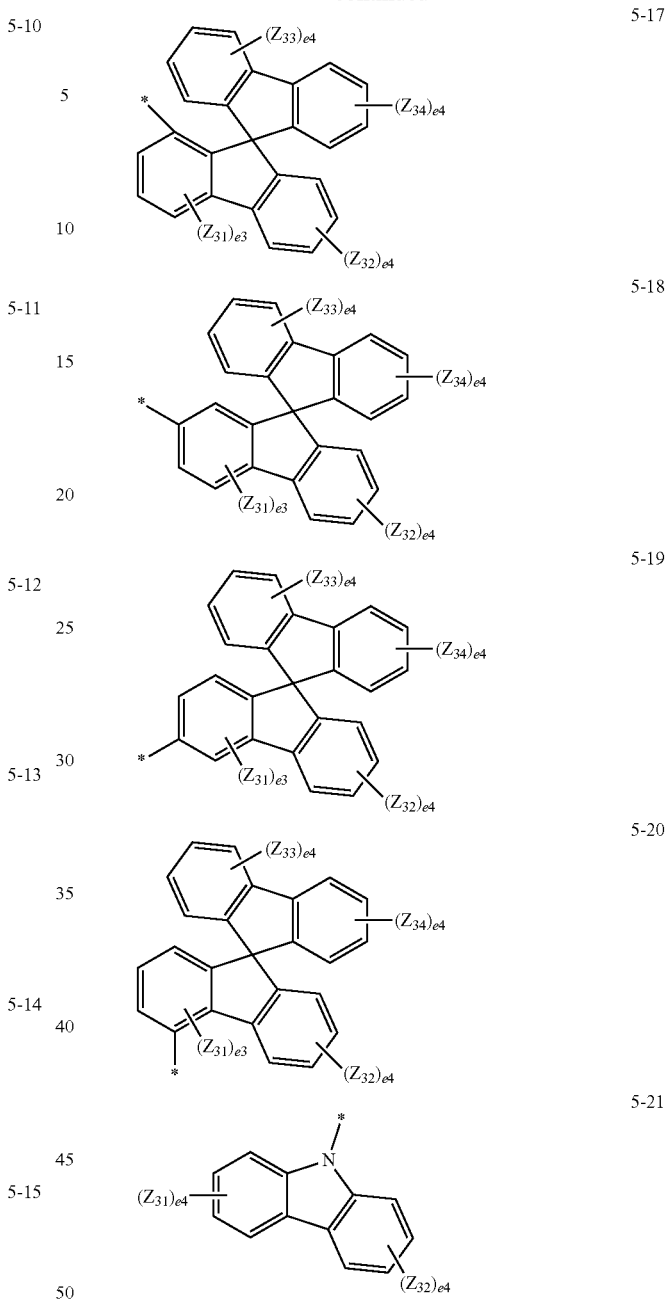

wherein, in Formulae 5-1 to 5-21, $Y_{31}$ may be O, S, $N(Z_{35})$, $C(Z_{33})(Z_{34})$, or $Si(Z_{36})(Z_{37})$, $Z_{31}$ to $Z_{37}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with at least one phenyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrimidinyl group, a pyrazinyl group, a triazinyl group, a quinolinyl group, an isoquinolinyl group, a benzoquinolinyl group, a naphthyridinyl group, a quinoxalinyl group, a quinazolinyl group, a carbazolyl group, a phenanthridinyl group, an acridinyl group, a phenanthrolinyl group, a phenazinyl group, a dibenzofuranyl group, a dibenzothiophenyl group, a dibenzosilolyl group, —Si($Q_{31}$)($Q_{32}$)($Q_{33}$), —N($Q_{31}$)($Q_{32}$), or —B($Q_{31}$)($Q_{32}$), e2 may be 1 or 2,
e3 may be an integer from 1 to 3,
e4 may be an integer from 1 to 4,
e5 may be an integer from 1 to 5,
e6 may be an integer from 1 to 6,
e7 may be an integer from 1 to 7,
e9 may be an integer from 1 to 9,
$Q_1$ to $Q_3$ and $Q_{31}$ to $Q_{33}$ may each independently be a $C_1$-$C_{10}$ alkyl group, a $C_1$-$C_{10}$ alkoxy group, a phenyl group, a phenyl group substituted with a cyano group, a biphenyl group, a terphenyl group, or a naphthyl group, and
* indicates a binding site to a neighboring atom.

In embodiments, the group represented by *-($L_{12}$)$_{a12}$-$Ar_{11}$ and the group represented by *-($L_{22}$)$_{a22}$-$Ar_{21}$ in Formulae 1 and 2 may each independently be one of groups represented by Formulae 6-1 to 6-6:

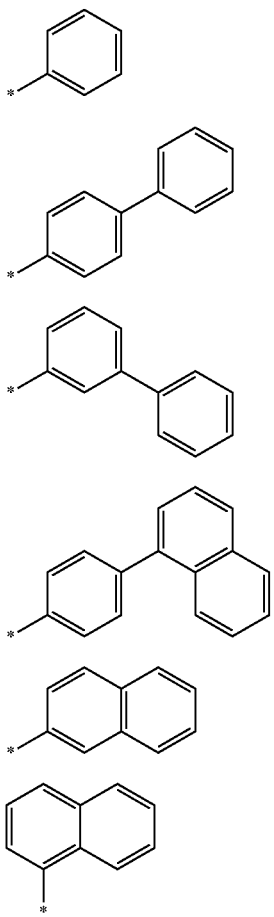

6-1

6-2

6-3

6-4

6-5

6-6 wherein * in Formulae 6-1 to 6-6 indicates a binding site to a neighboring atom.

In an embodiment, $R_{21}$ and $R_{22}$ in Formula 2 may be alkyl groups having fewer carbon atoms than $R_{11}$ and $R_{12}$ in Formula 1, respectively. For example, when $R_{11}$ and $R_{12}$ in Formula 1 are each independently an unsubstituted alkyl group represented by *—$C_mH_{2m+1}$ (where m is an integer of 2 or more) and $R_{21}$ and $R_{22}$ in Formula 2 are each independently an unsubstituted alkyl group represented by *—$C_nH_{2n+1}$ (where n is an integer of 1 or more), the condition of n<m may be satisfied.

In an embodiment, $R_{11}$ and $R_{12}$ in Formula 1 may each independently be a $C_2$-$C_6$ alkyl group unsubstituted or substituted with at least one $R_{10a}$, and $R_{21}$ and $R_{22}$ in Formula 2 may each independently be a $C_1$-$C_5$ alkyl group unsubstituted or substituted with at least one $R_{10a}$.

In embodiments, $R_{11}$ and $R_{12}$ in Formula 1 may each independently be an unsubstituted $C_2$-$C_{11}$ alkyl group, and $R_{21}$ and $R_{22}$ in Formula 2 may each independently be an unsubstituted $C_1$-$C_{10}$ alkyl group.

In embodiments, $R_{11}$ and $R_{12}$ in Formula 1 may each independently be an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, a 1-methylbutyl group, an n-hexyl group, a 1,3-dimethylbutyl group, a 3,3-dimethylbutyl group, a 2-ethylbutyl group, a 2-ethyl-2-methylpropyl group, an n-heptyl group, an n-octyl group, an n-nonyl group, an n-decyl group, or an n-undecyl group, and $R_{21}$ and $R_{22}$ in Formula 2 may each independently be a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, a 1-methylbutyl group, an n-hexyl group, a 1,3-dimethylbutyl group, a 3,3-dimethylbutyl group, a 2-ethylbutyl group, a 2-ethyl-2-methylpropyl group, an n-heptyl group, an n-octyl group, an n-nonyl group, or an n-decyl group.

In an embodiment, $R_{11}$ and $R_{12}$ in Formula 1 may be identical to each other, and $R_{21}$ and $R_{22}$ in Formula 2 may be identical to each other.

In an embodiment, $R_{13}$ to $R_{18}$ and $R_{23}$ to $R_{28}$ in Formulae 1 and 2 may each independently be: hydrogen, deuterium, —F, —Cl, —Br, —I, a hydroxyl group, a cyano group, or a nitro group;

a $C_1$-$C_{20}$ alkyl group or a $C_1$-$C_{20}$ alkoxy group, each unsubstituted or substituted with deuterium, —F, —Cl, —Br, —I, a cyano group, a phenyl group, a biphenyl group, or a combination thereof;

a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, or an azadibenzosilolyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a pyrenyl group, a phenalenyl group, a phenanthrenyl group, an anthracenyl group, a fluoranthenyl group, a triphenylenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, a diazacarbazolyl group, an azadibenzofuranyl group, an azadibenzothiophenyl group, an azadibenzosilolyl group, or a combination thereof; or —Si($Q_1$)($Q_2$)($Q_3$), —N($Q_1$)($Q_2$) or —B($Q_1$)($Q_2$), and $Q_1$ to $Q_3$ may each independently be a $C_1$-$C_{10}$ alkyl group, a $C_1$-$C_{10}$ alkoxy group, a phenyl group, a biphenyl group, a terphenyl group, or a naphthyl group.

In an embodiment, the first compound may be represented by one of Formulae 1-1 to 1-16, and the second compound may be represented by one of Formulae 2-1 to 2-16:

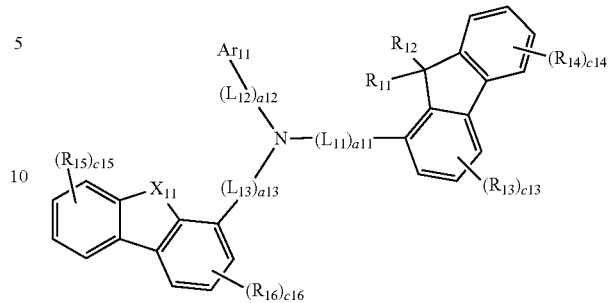

1-1

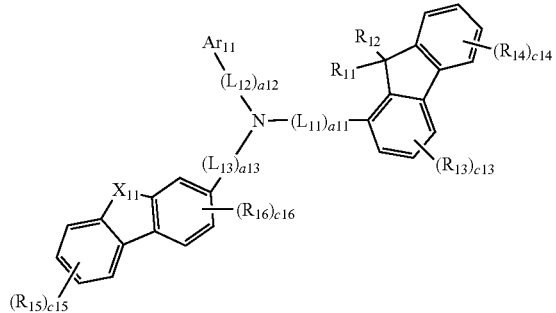

1-2

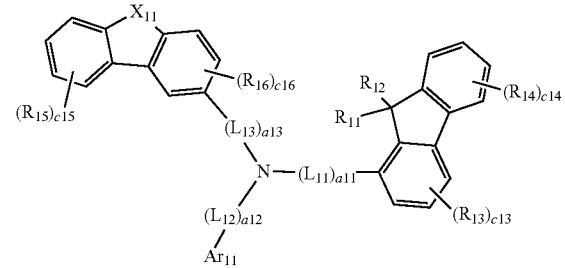

1-3

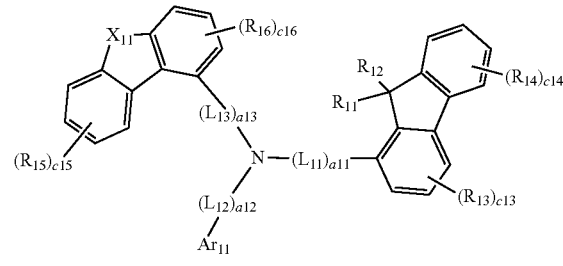

1-4

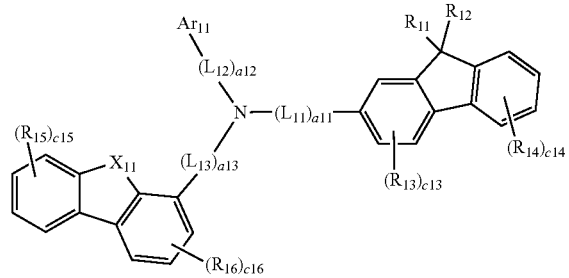

1-5

1-6
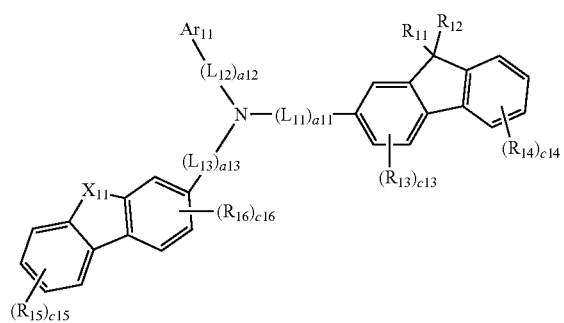
1-7
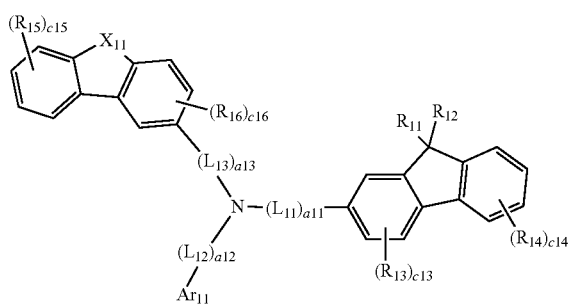
1-8
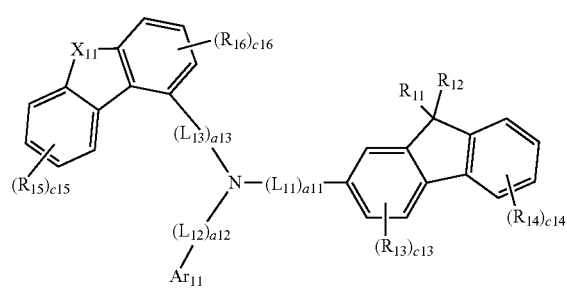
1-9
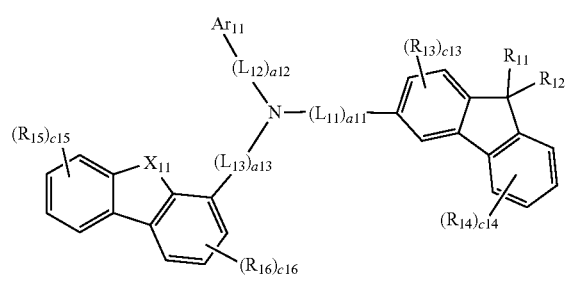
1-10
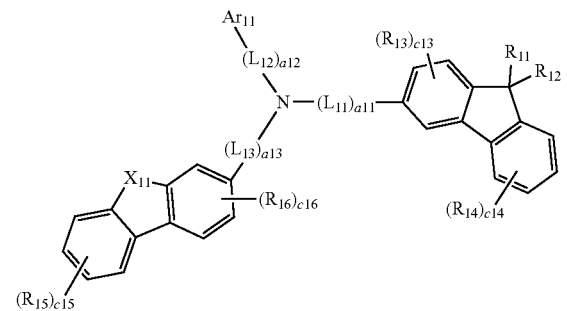
1-11
1-12
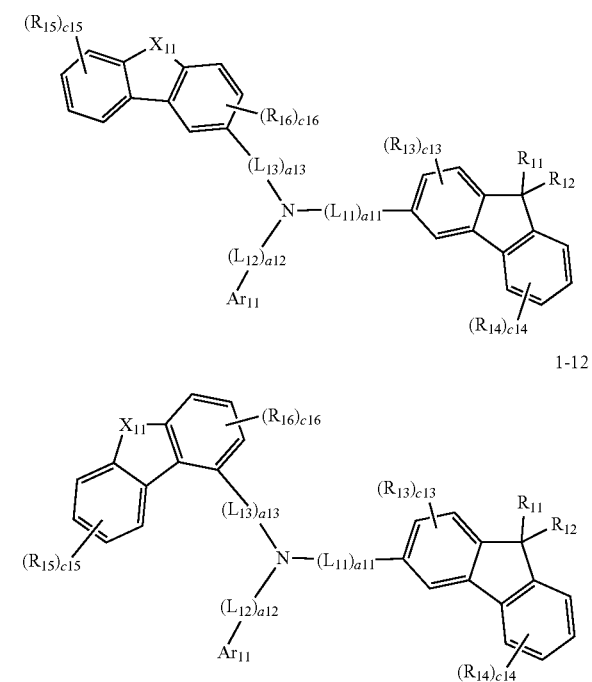
1-13
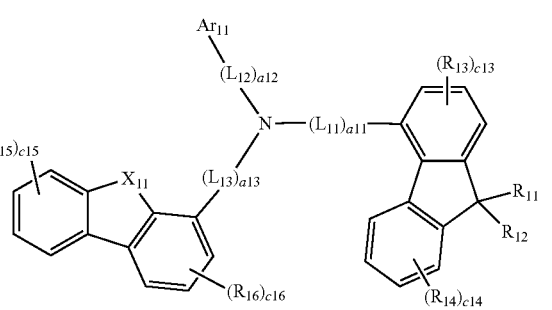
1-14
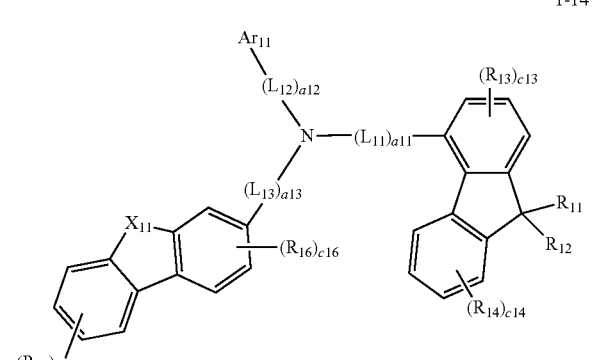

1-15
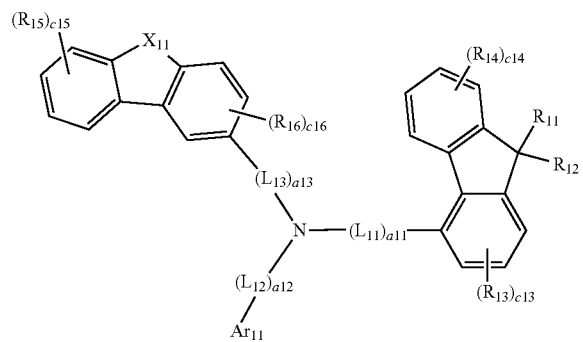
1-16
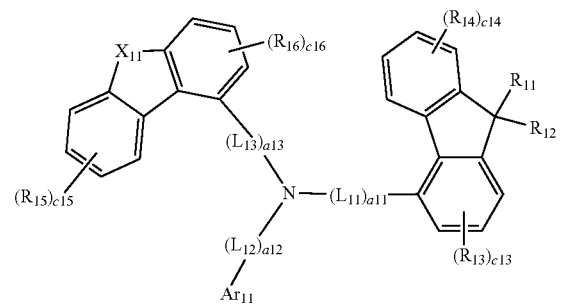
2-1
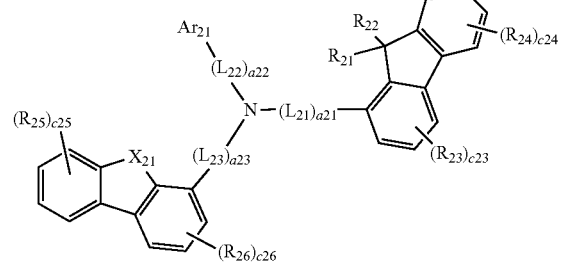
2-2
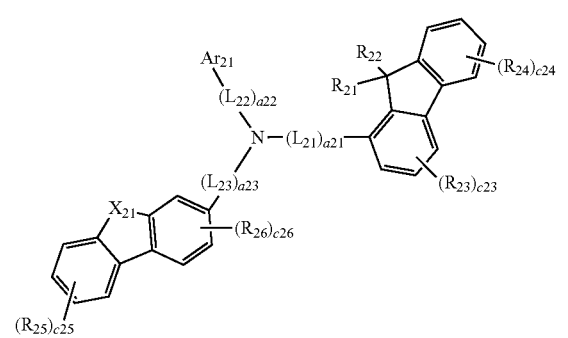
2-3
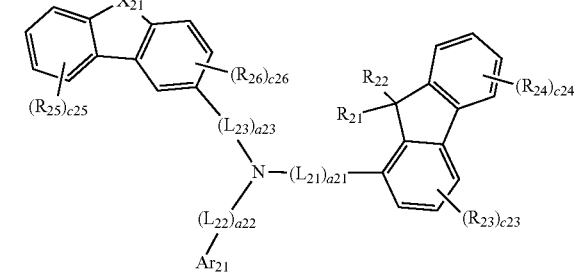
2-4
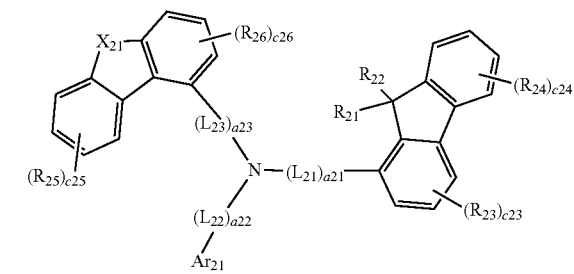
2-5
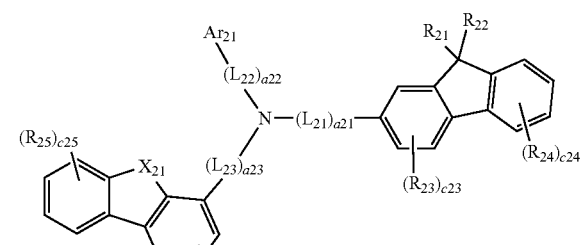
2-6
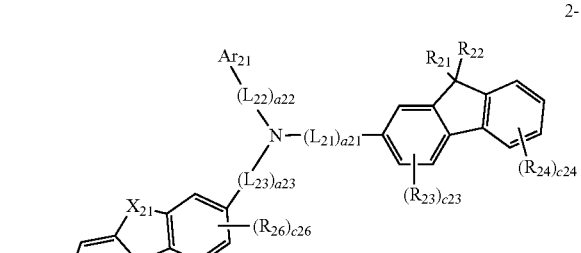
2-7
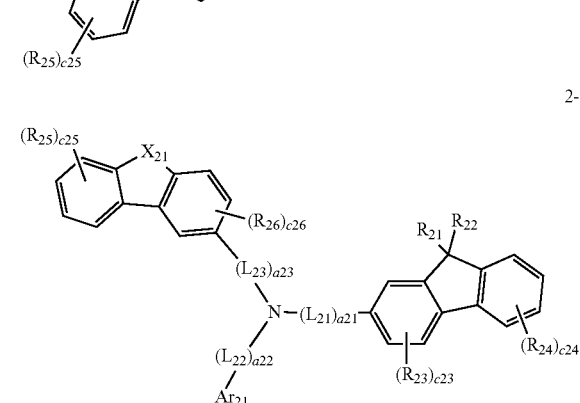

2-8
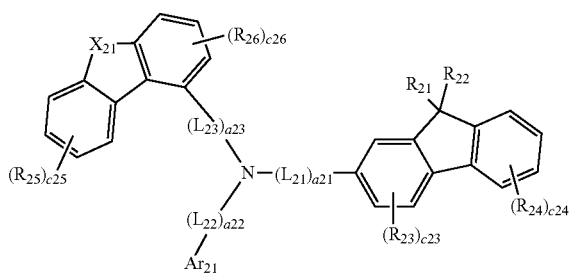

2-9
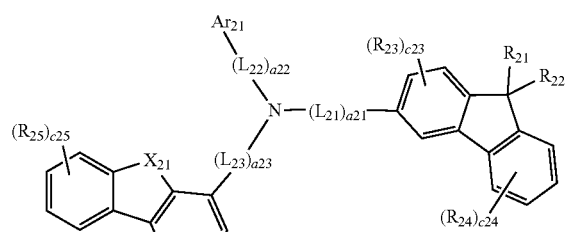

2-10
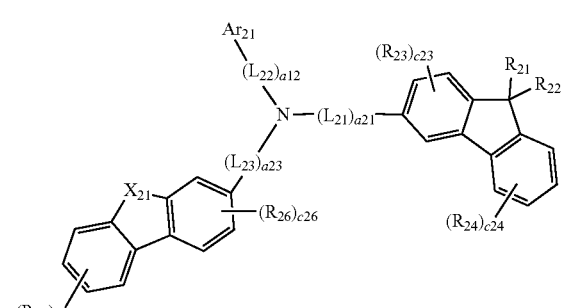

2-11
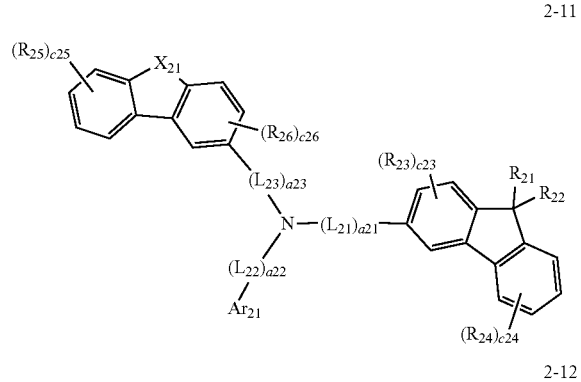

2-12
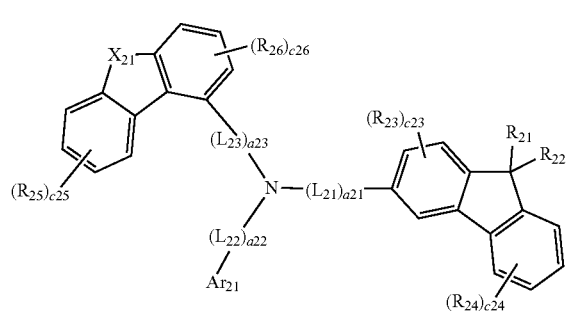

2-13
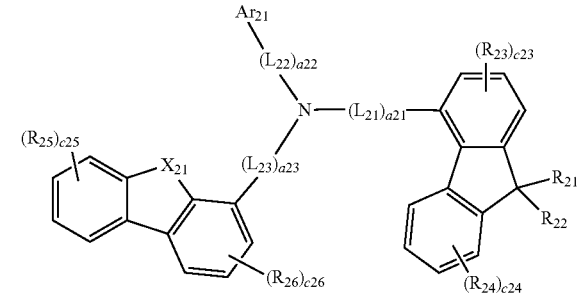

2-14
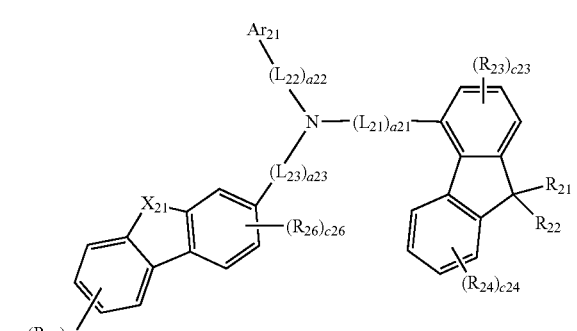

2-15
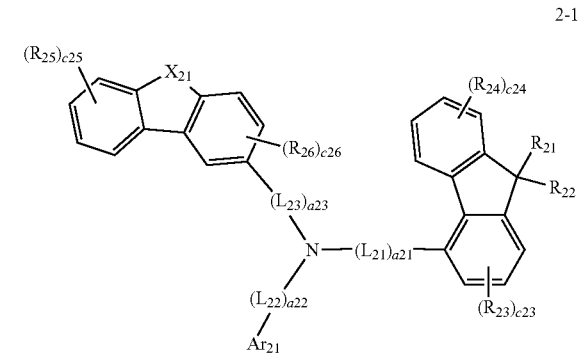

2-16
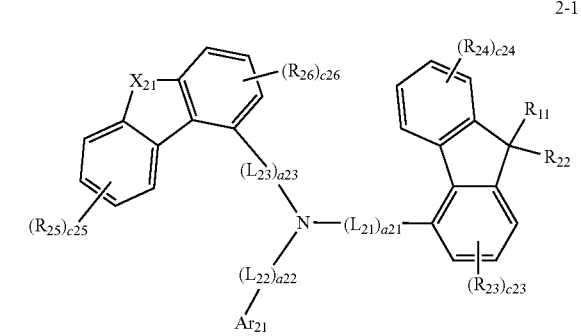

wherein, in Formulae 1-1 to 1-16 and 2-1 to 2-16, $L_{11}$ to $L_{13}$, $L_{21}$ to $L_{23}$, a11 to a13, a21 to a23, $Ar_{11}$, $Ar_{21}$, $X_{11}$, $X_{21}$, $R_{11}$ to $R_{16}$, $R_{21}$ to $R_{26}$, c13 to c16, and c23 to c26 may each be the same as described in the specification.

In an embodiment, the first compound may be represented by one of Formulae C-1 to C-60, wherein $R_1$ and $R_2$ may each independently be a $C_2$-$C_{11}$ alkyl group, and the second compound may be represented by one of Formulae C-1 to C-60, wherein $R_1$ and $R_2$ may each independently be a $C_1$-$C_{10}$ alkyl group:

C-1
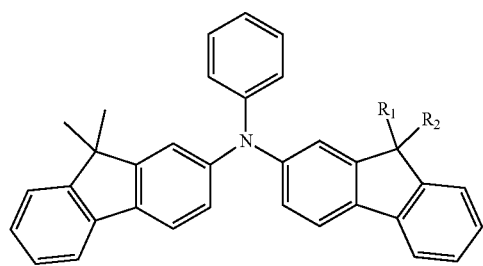
C-2
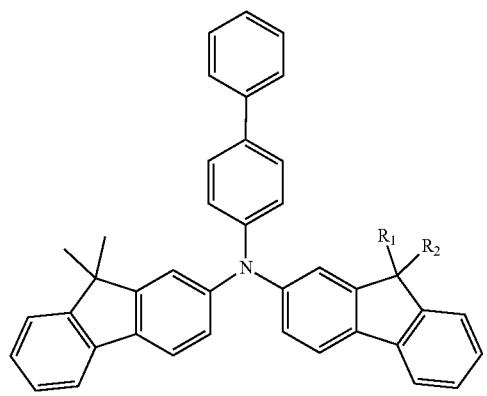
C-3
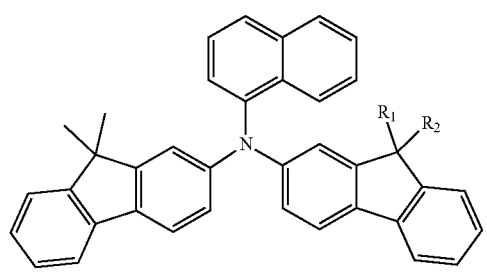
C-4
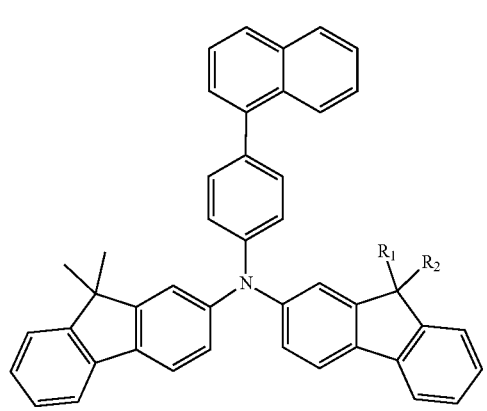
-continued
C-5
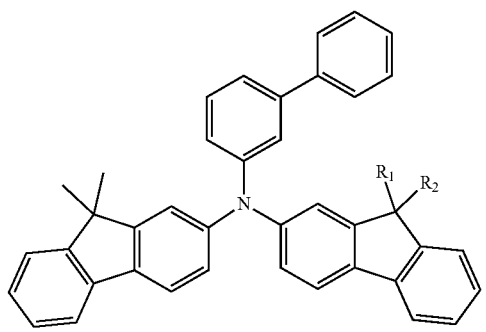
C-6
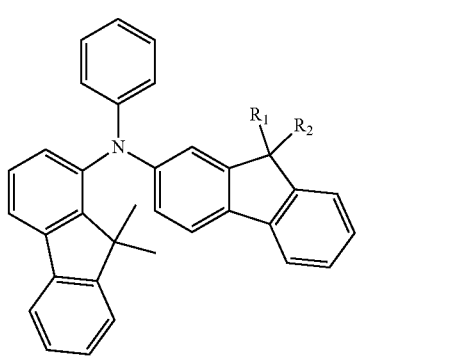
C-7
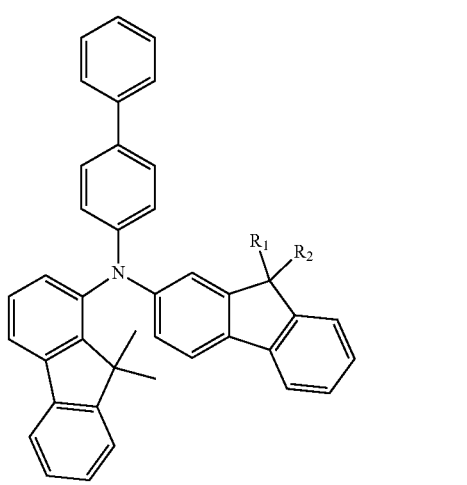
C-8
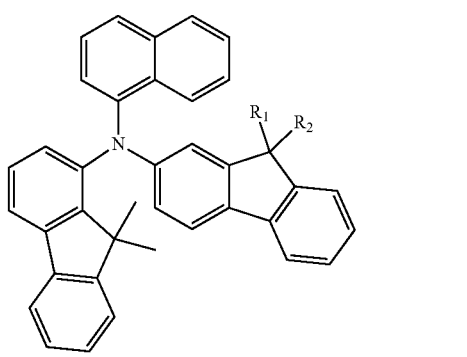

-continued
C-9
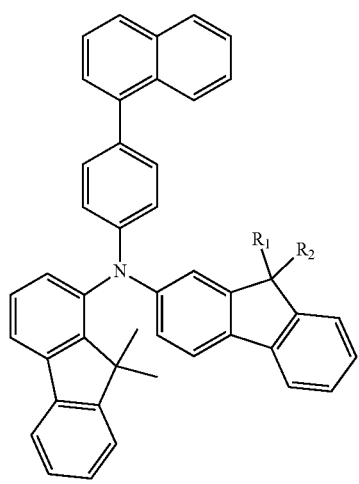
C-10
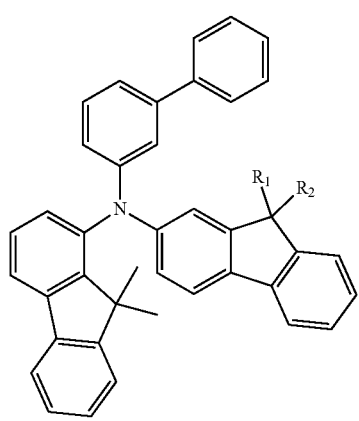
C-11
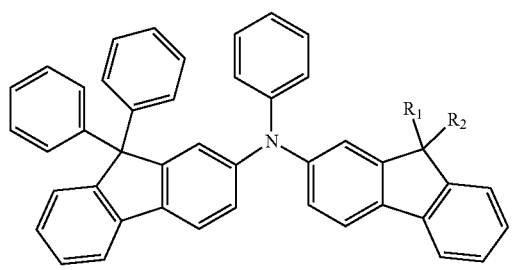
C-12
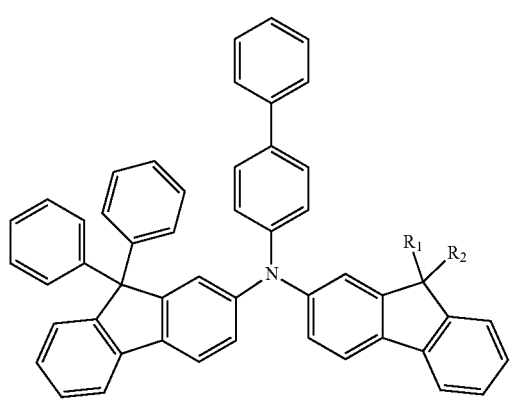
-continued
C-13
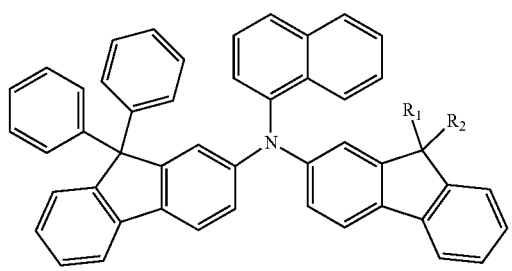
C-14
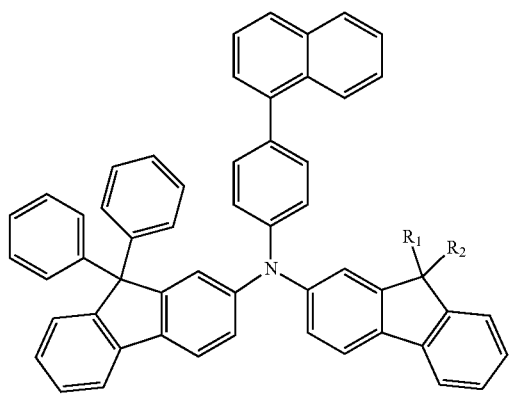
C-15
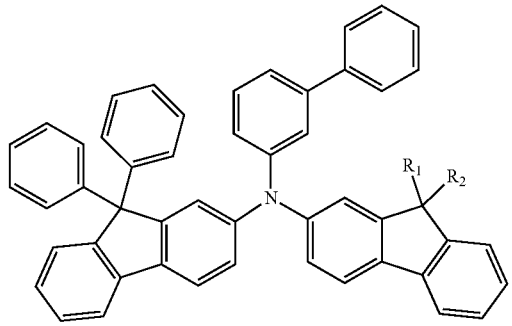
C-16
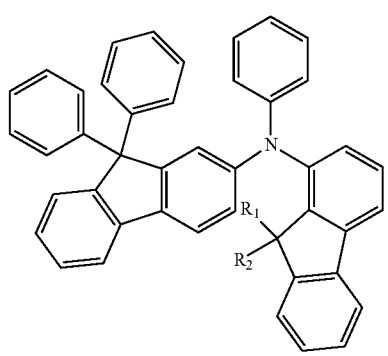

-continued
C-17
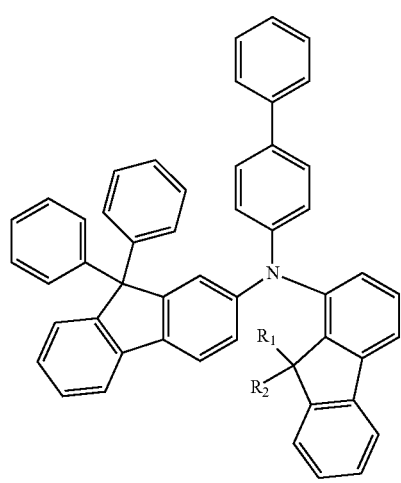
C-18
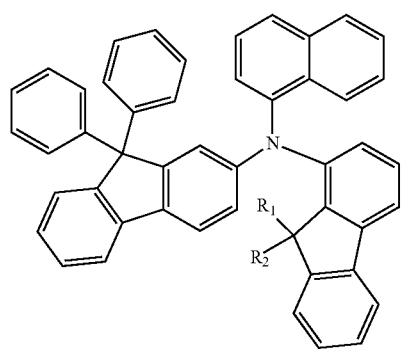
C-19
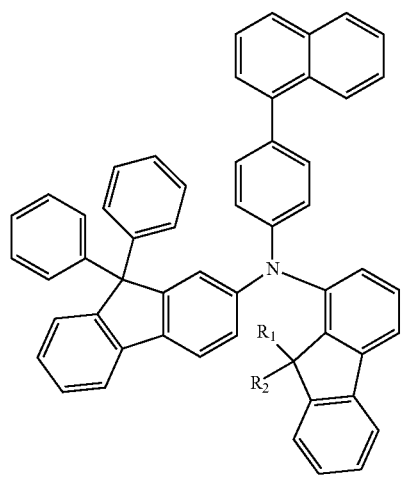
-continued
C-20
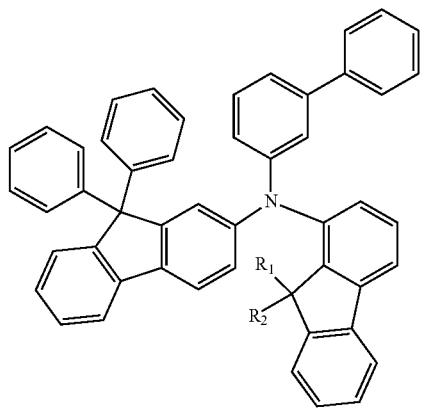
C-21
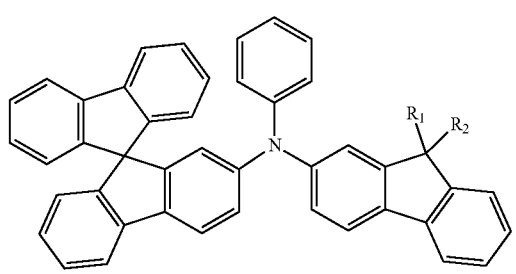
C-22
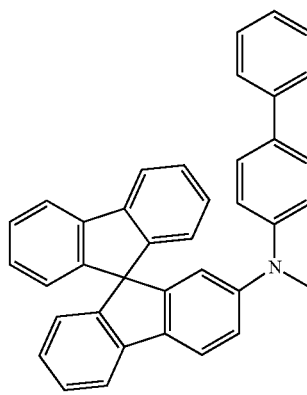
C-23
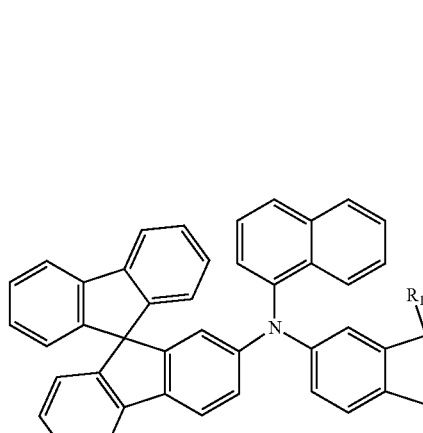

C-24
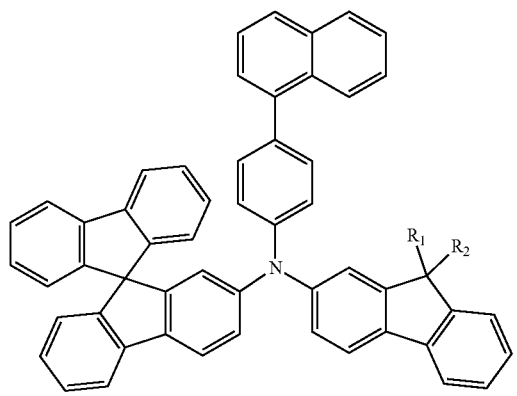
C-25
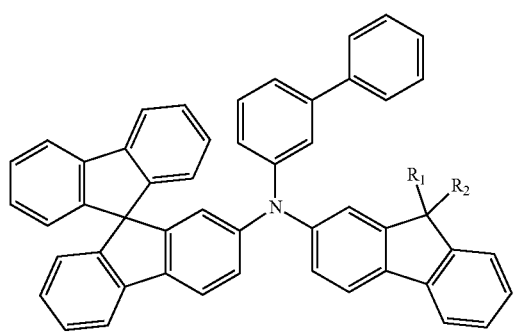
C-26
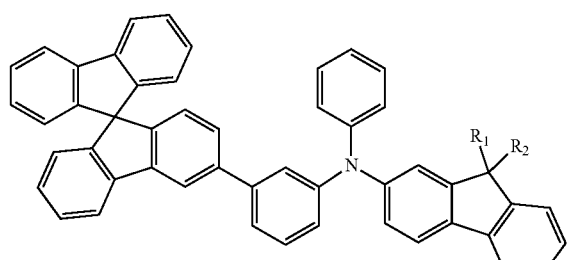
C-27
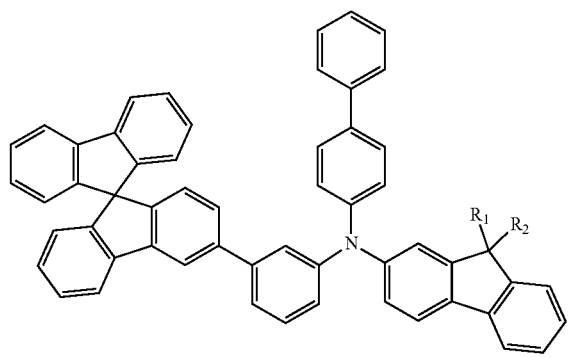
C-28
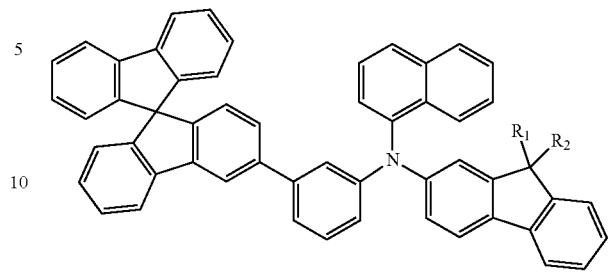
C-29
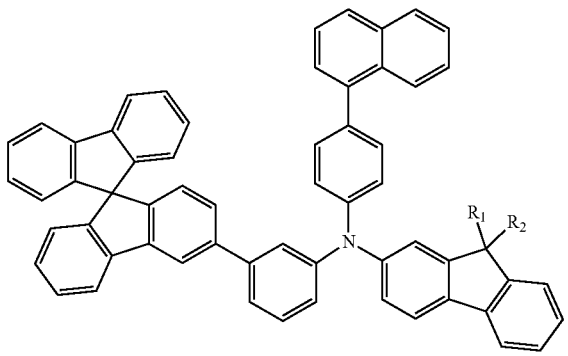
C-30
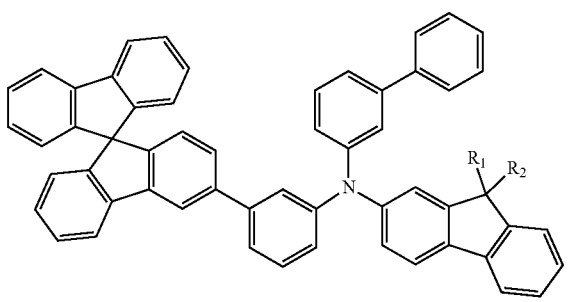
C-31
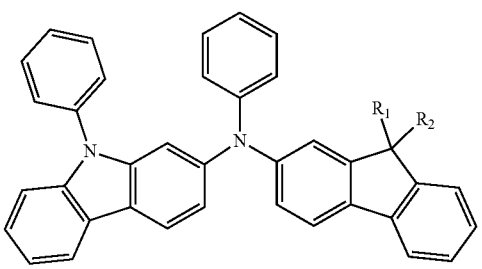

C-32
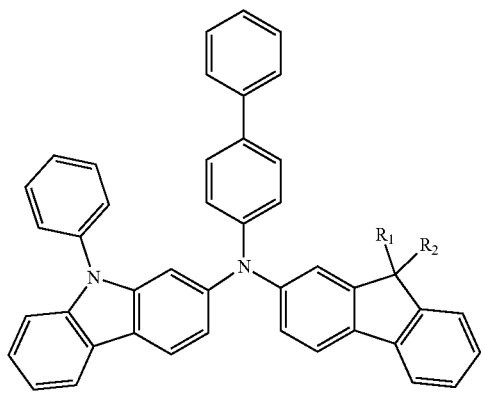
C-33
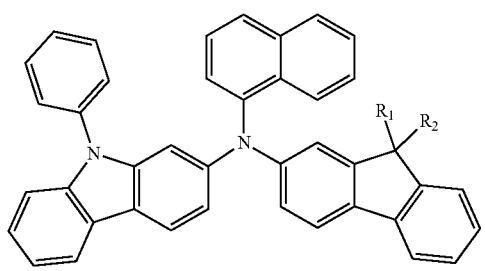
C-34
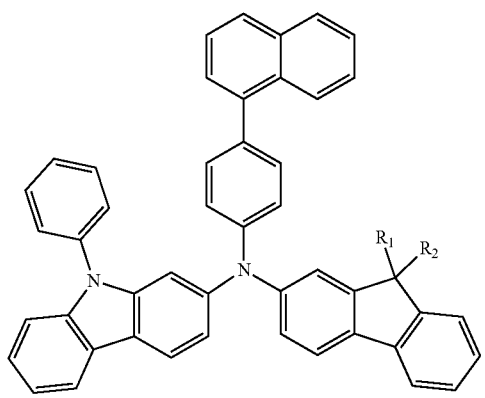
C-35
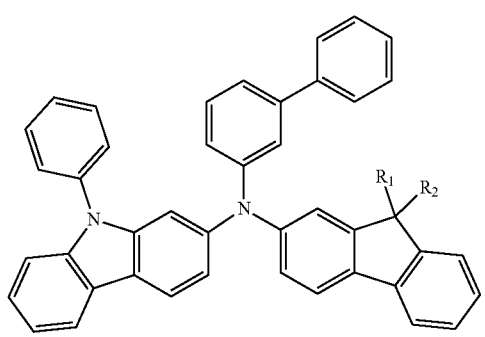
C-36
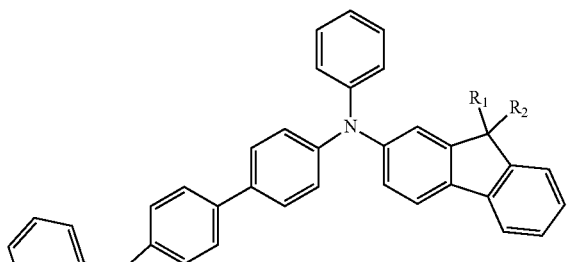
C-37
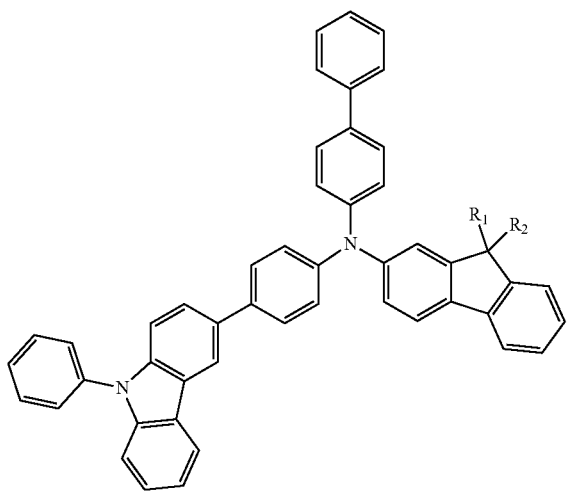
C-38
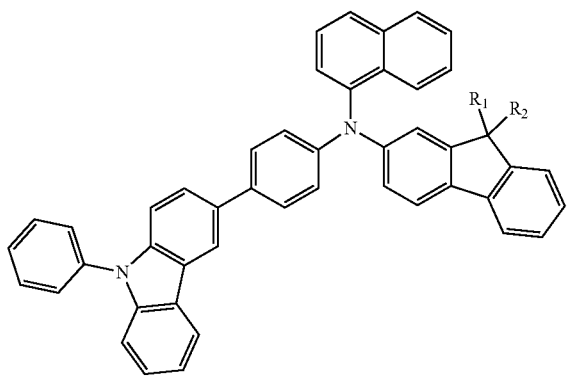

C-39
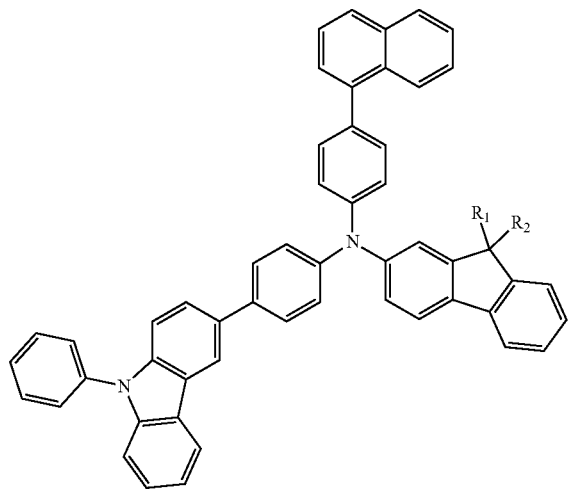
C-40
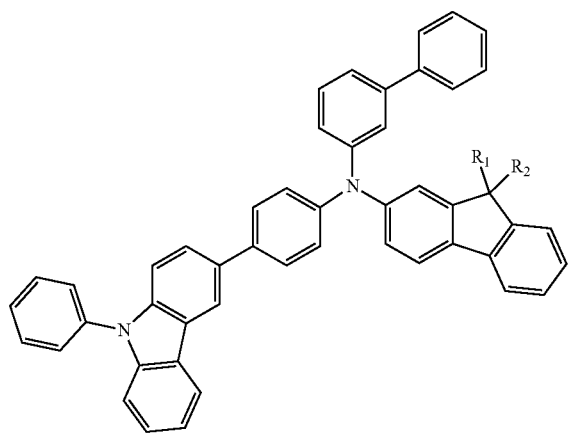
C-41
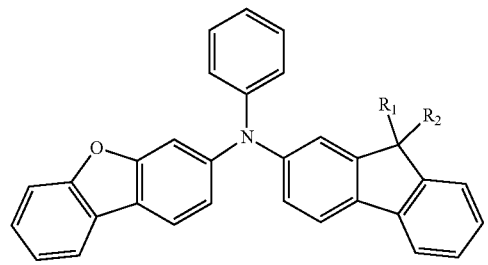
C-42
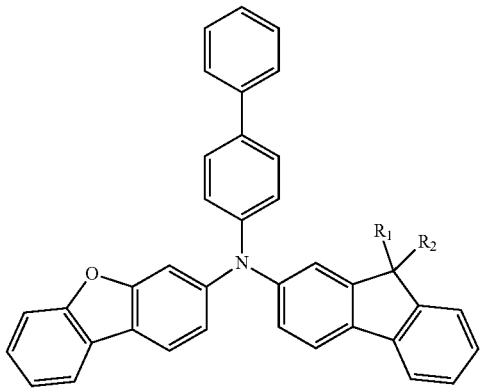
C-43
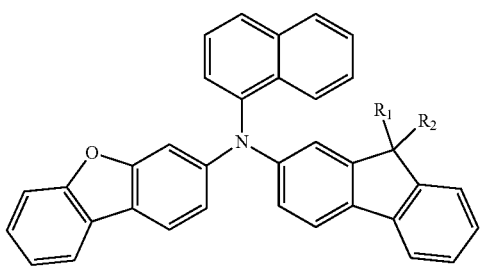
C-44
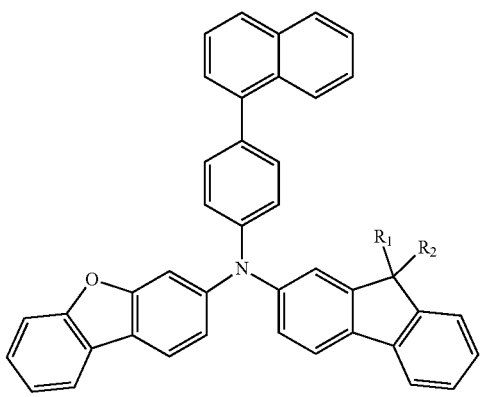
C-45
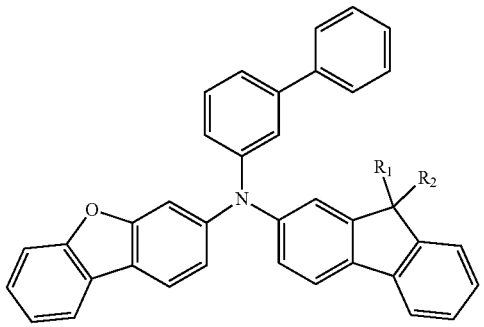

C-46
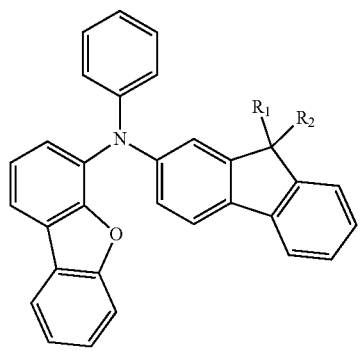
C-47
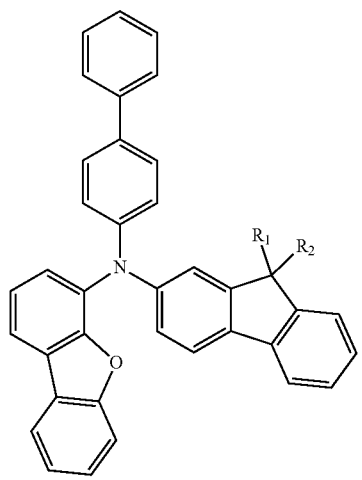
C-48
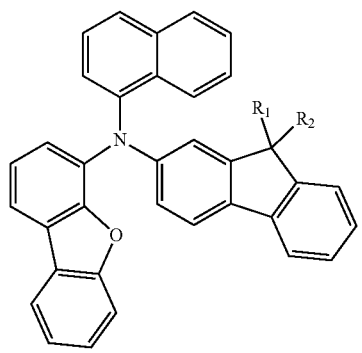
C-49
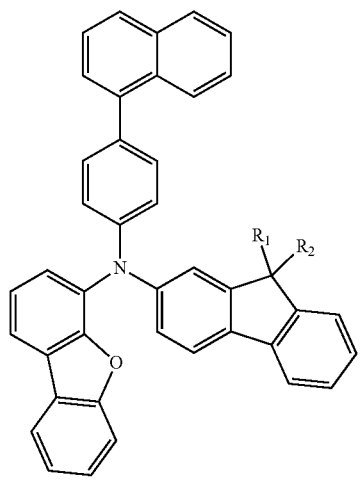
C-50
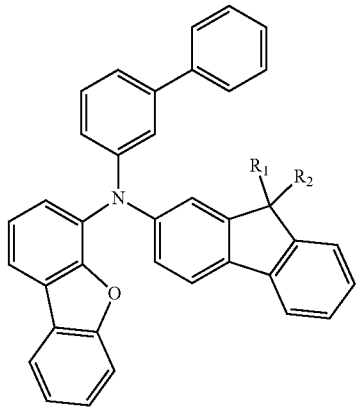
C-51
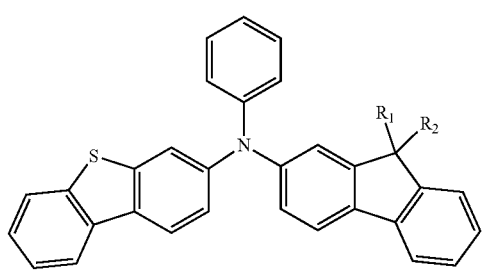
C-52
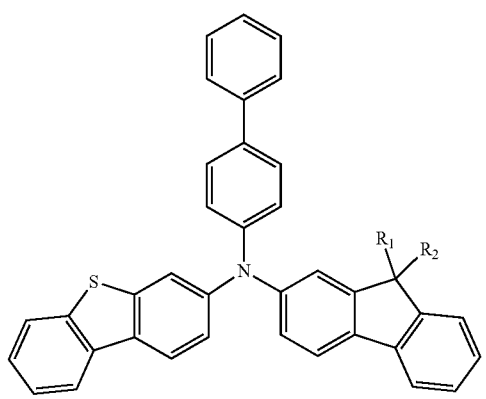
C-53
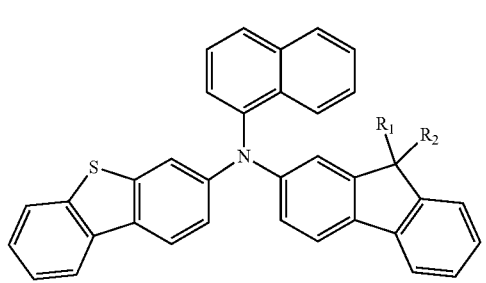

C-54
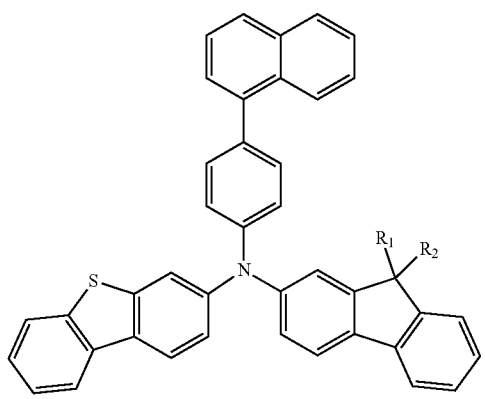

C-55
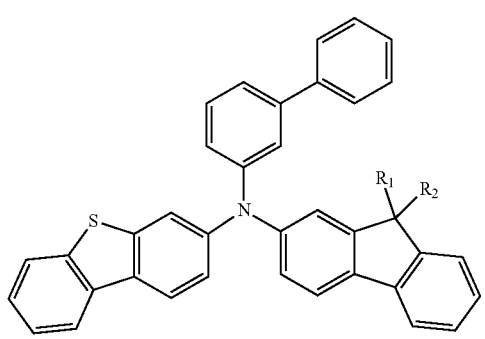

C-56
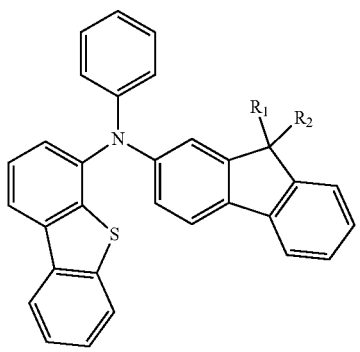

C-57
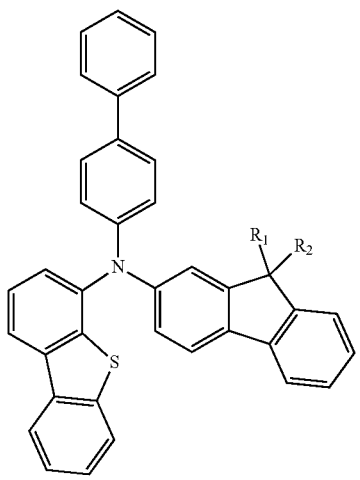

C-58
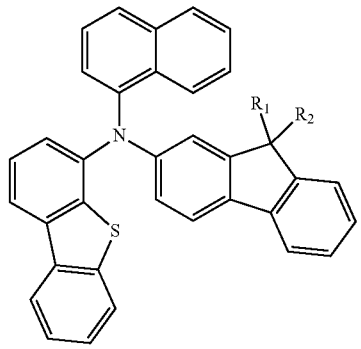

C-59
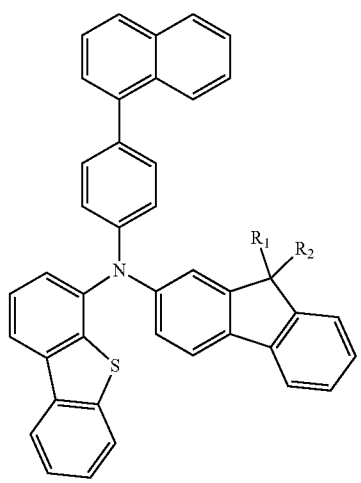

C-60
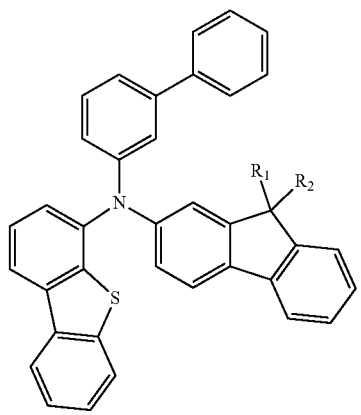

In an embodiment, the hole injection layer 121 may include two or more different first compounds represented by Formula 1, and at least one of the two or more different first compounds may have a glass transition temperature lower than the glass transition temperature of the second compound.

In an embodiment, the hole transport region 120 may further include an emission auxiliary layer, an electron blocking layer, or a combination thereof.

For example, the hole transport region 120 may have a multi-layered structure, such as a hole injection layer 121/ hole transport layer 122 structure, a hole injection layer 121/hole transport layer 122/emission auxiliary layer structure, or a hole injection layer 121/hole transport layer 122/electron blocking layer structure, wherein, in each structure, layers are sequentially stacked on the first electrode 110.

In embodiments, the hole transport region 120 may further include an electron blocking layer disposed between the hole transport layer 122 and the emission layer 131.

The hole transport region 120 may include, in addition to the first compound and the second compound, a compound represented by Formula 201, a compound represented by Formula 202, or a combination thereof:

[Formula 201]

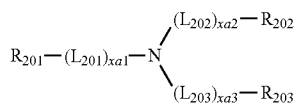

[Formula 202]

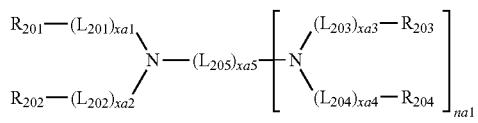

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group or the like) (for example, see Compound HT16 below), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of groups represented by Formulae CY201 to CY217:

CY201
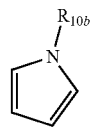

CY202
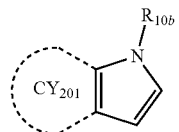

CY203
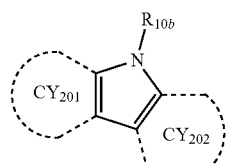

CY204
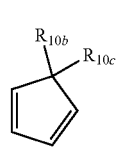

CY205
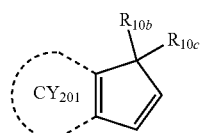

CY206
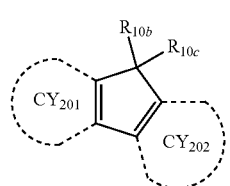

CY207
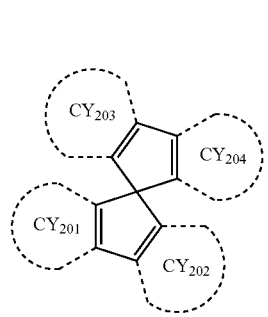

CY208
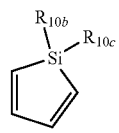

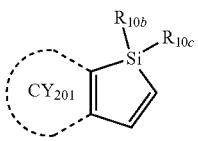

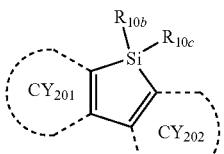

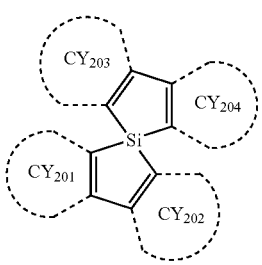

CY212

CY213

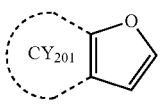

CY214

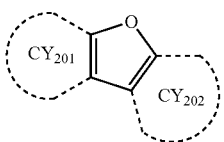

CY215

CY209

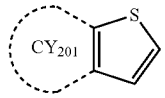

CY210

CY216

CY211

CY217 wherein, in Formulae CY201 to CY217, $R_{10b}$ and $R_{10c}$ may each be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In embodiments, Formulae 201 and 202 may each include at least one of the groups represented by Formulae CY201 to CY203.

In embodiments, Formula 201 may include at least one of the groups represented by Formulae CY201 to CY203 and at least one of the groups represented by Formulae CY204 to CY217.

In embodiments, in Formula 201, xa1 may be 1, $R_{201}$ may be one of the groups represented by Formulae CY201 to CY203, xa2 may be 0, and $R_{202}$ may be one of the groups represented by Formulae CY204 to CY207.

In embodiments, each of Formulae 201 and 202 may not include one of the groups represented by Formulae CY201 to CY203.

In embodiments, each of Formulae 201 and 202 may not include one of the groups represented by Formulae CY201 to CY203, and may include at least one of the groups represented by Formulae CY204 to CY217.

In embodiments, each of Formulae 201 and 202 may not include one of the groups represented by Formulae CY201 to CY217.

For example, the hole transport region 120 may include one of Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or a combination thereof:

HT1
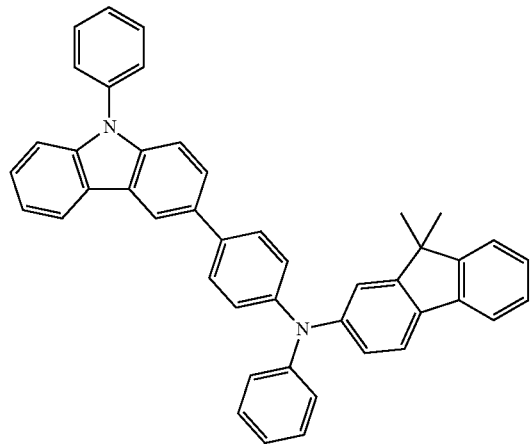
HT2
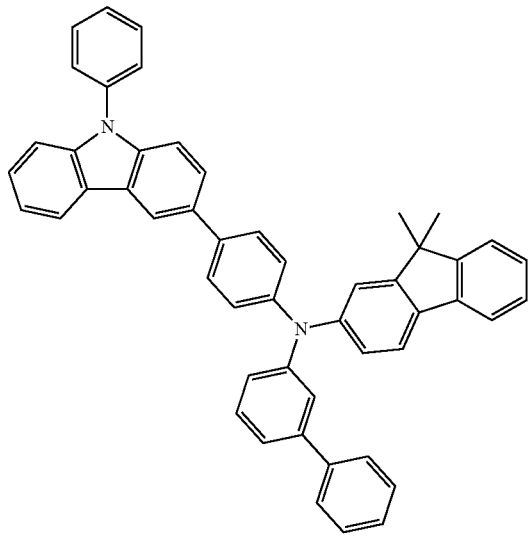
HT3
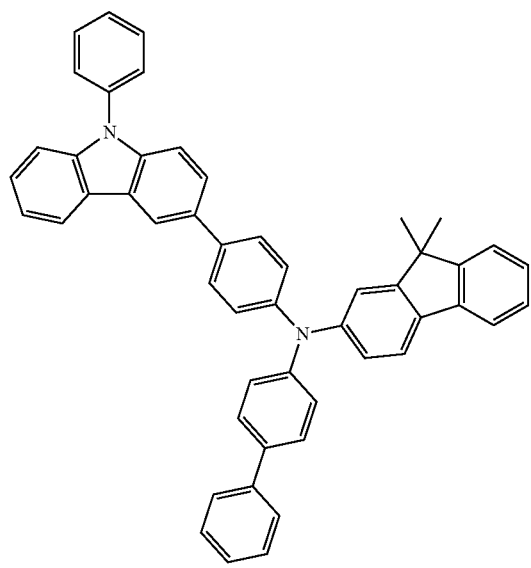
HT4
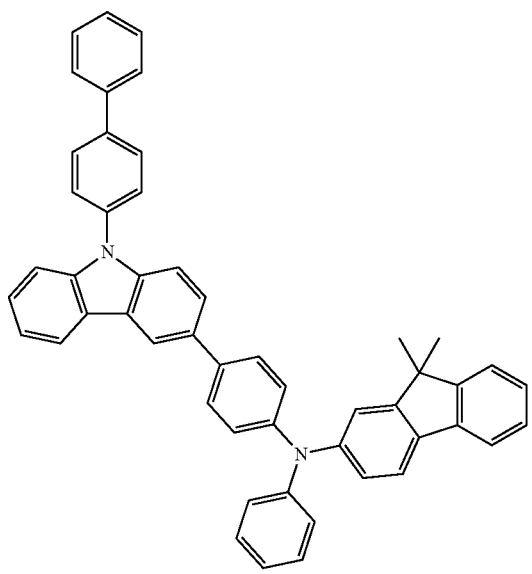

HT5
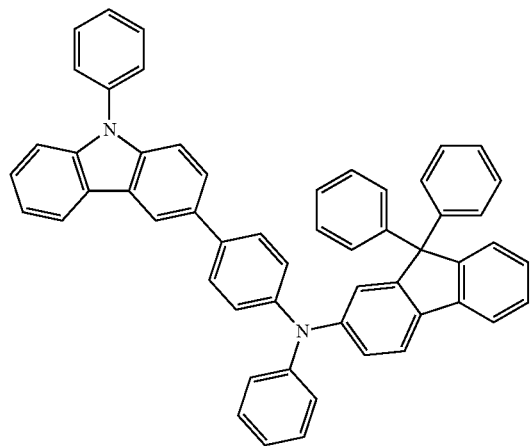
HT6
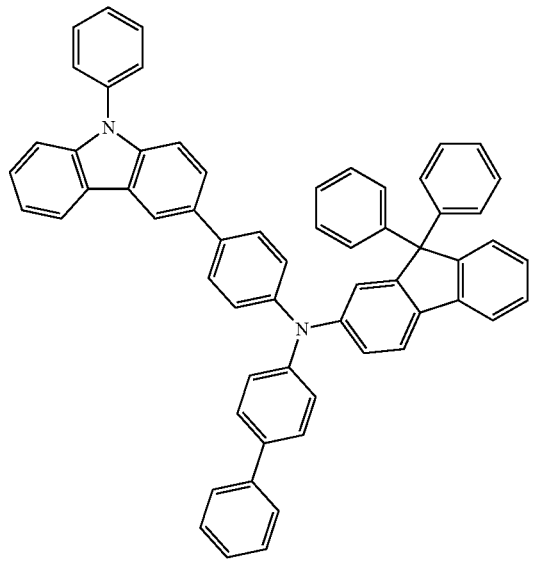
HT7
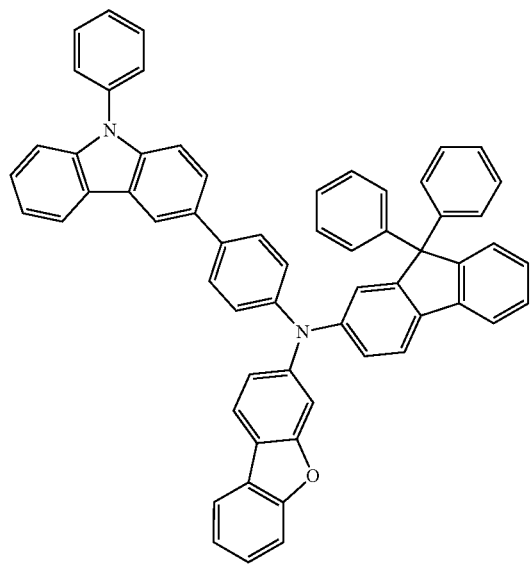
HT8
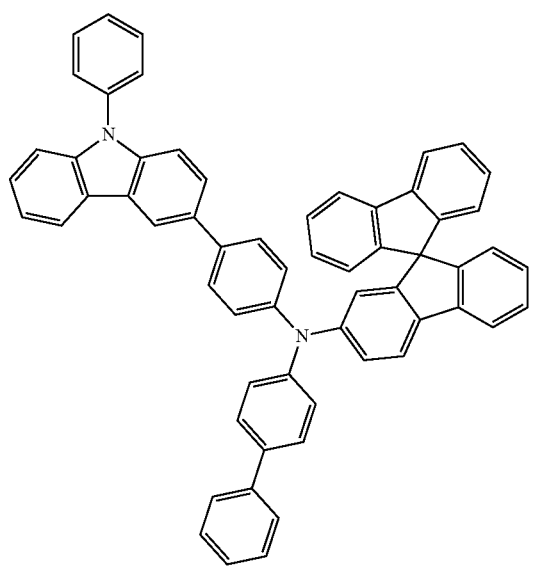

HT9
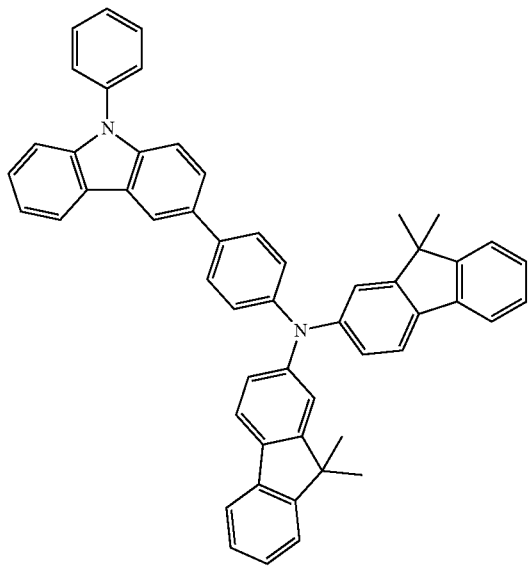
HT10
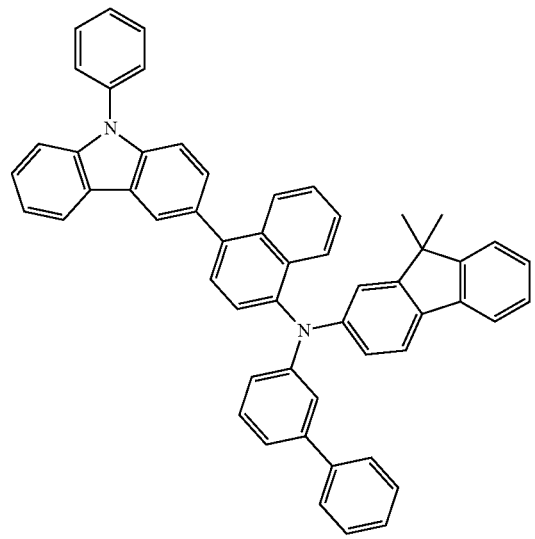
HT11
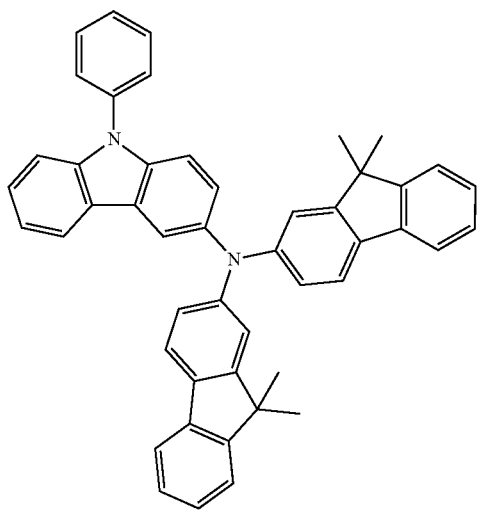
HT12
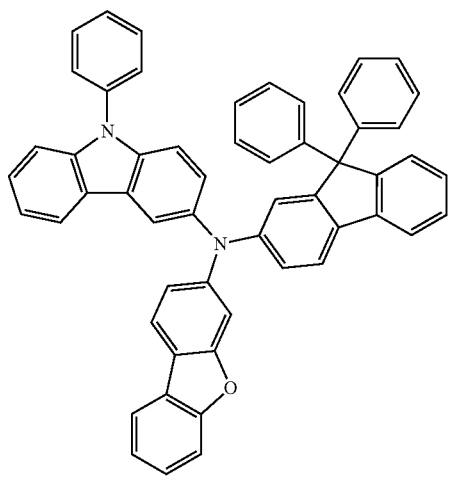

-continued
HT13
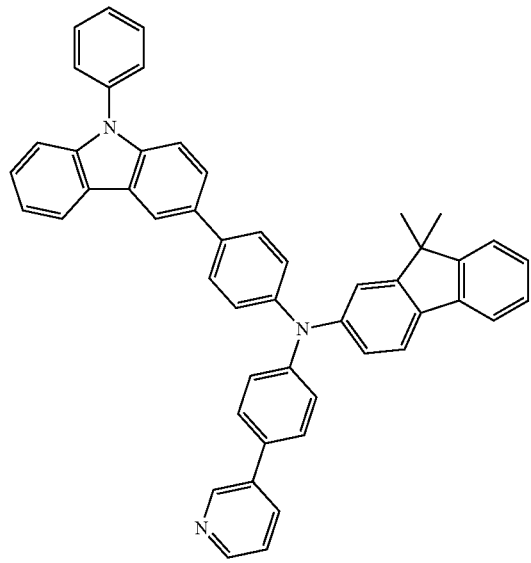
HT14
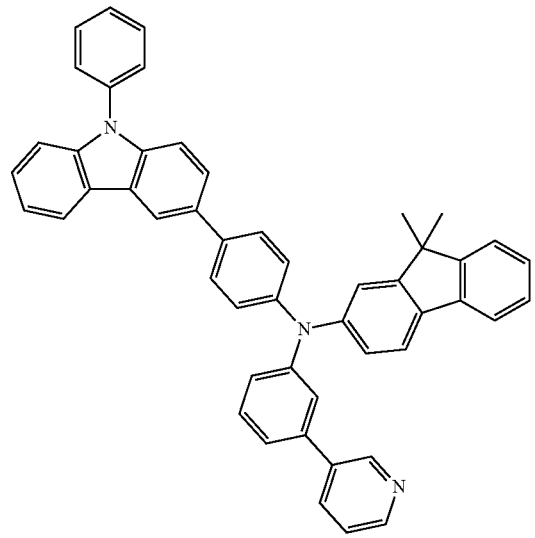
HT15
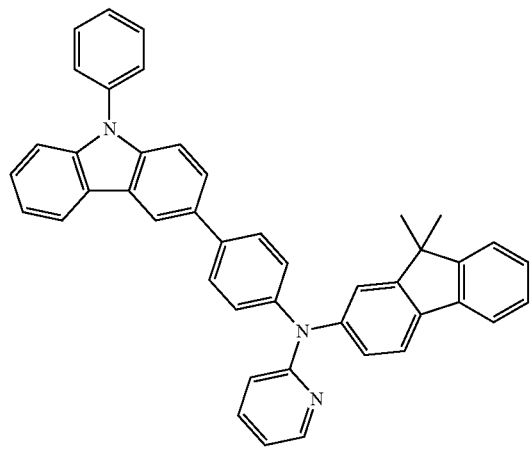
HT16
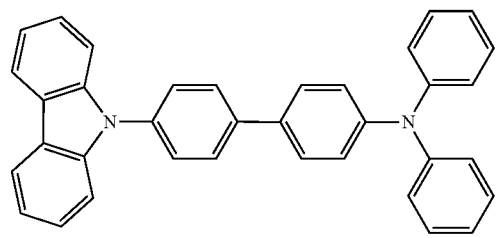
HT17
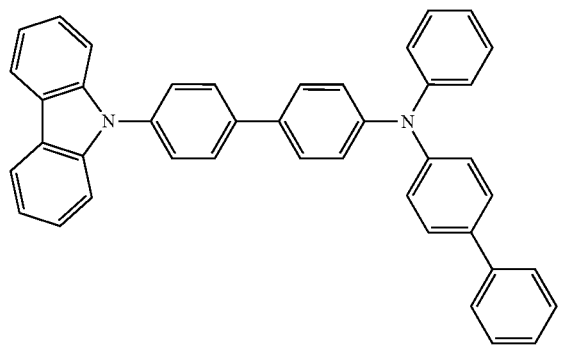
HT18
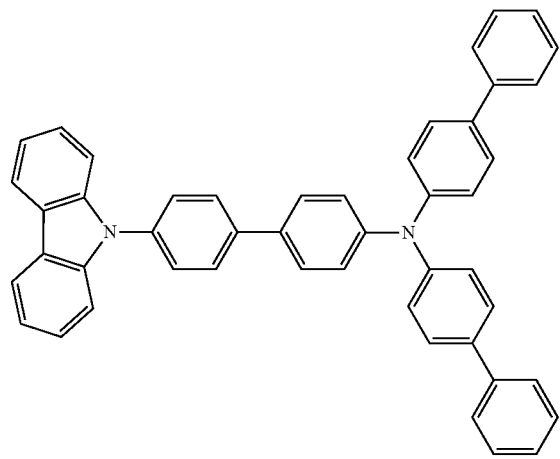

-continued
HT19
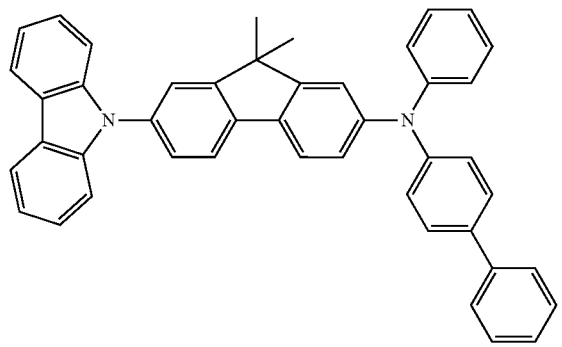
HT20
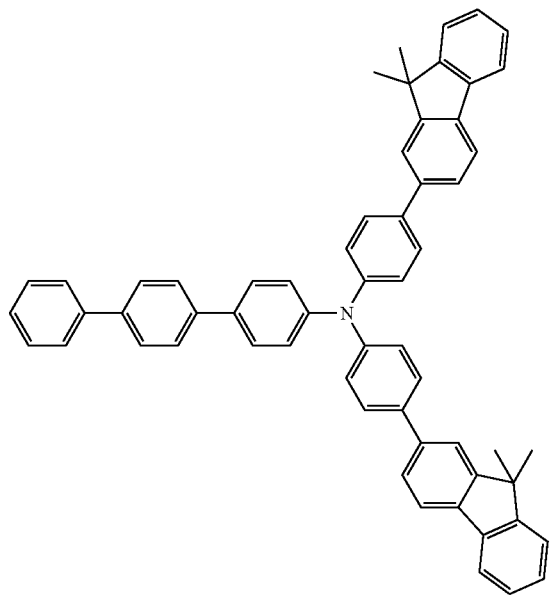
HT21
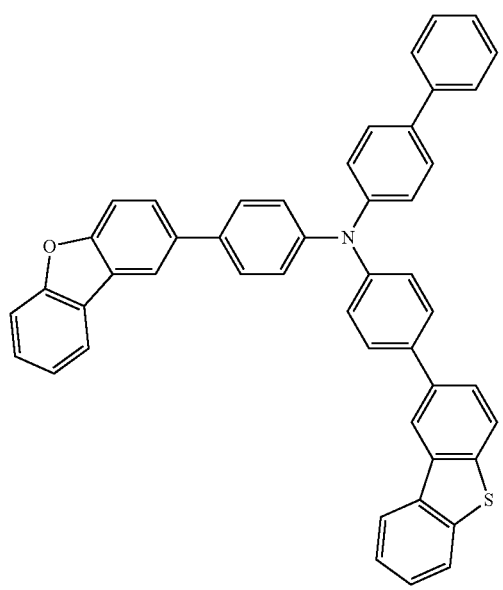
HT22
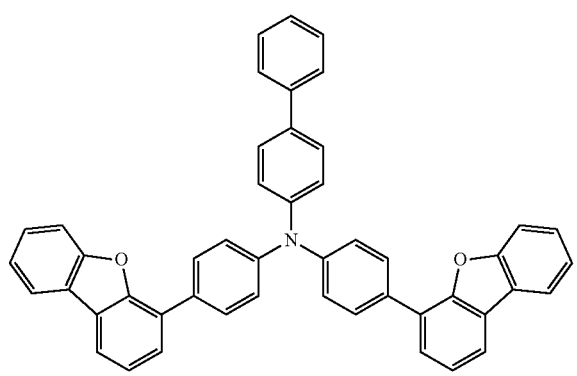

-continued
HT23
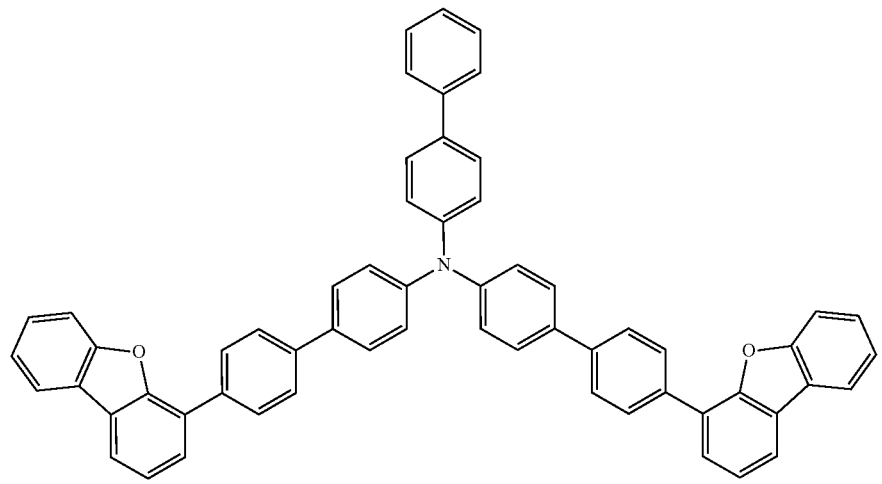
HT24
HT25
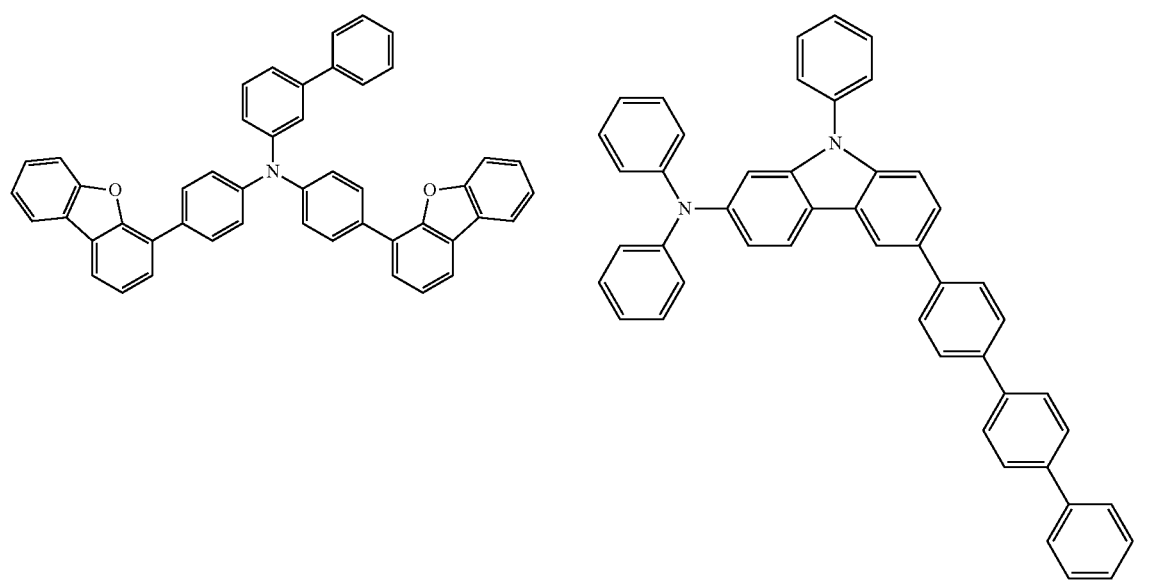
HT26
HT27
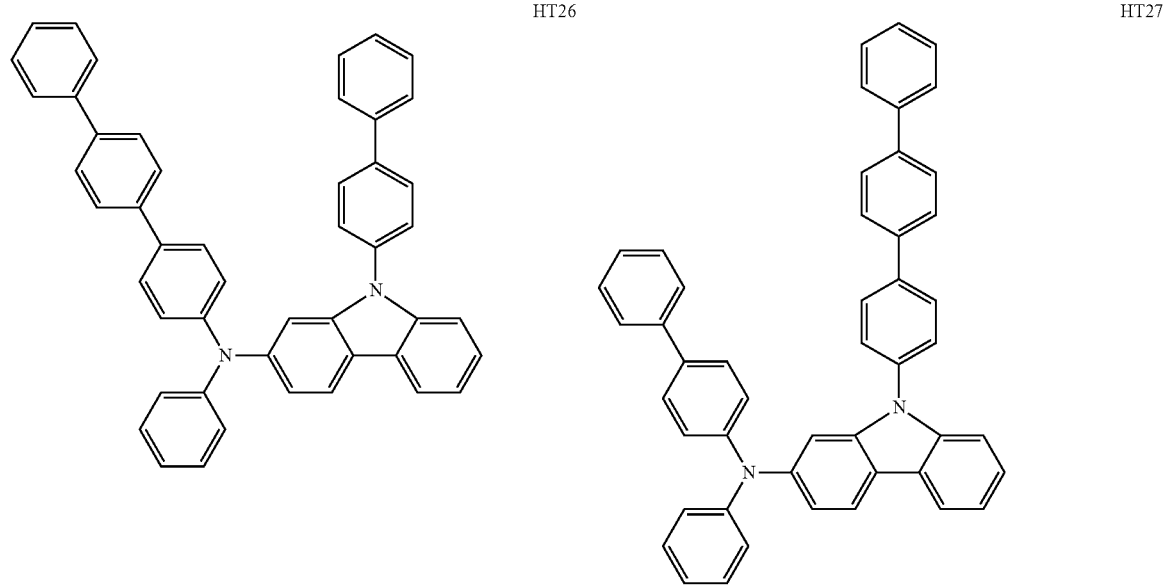

-continued
HT28
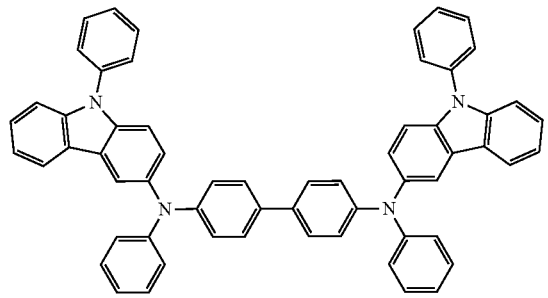
HT29
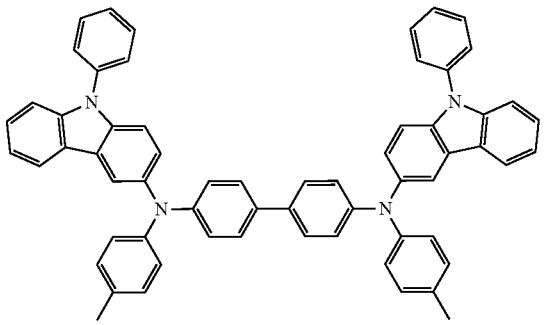
HT30
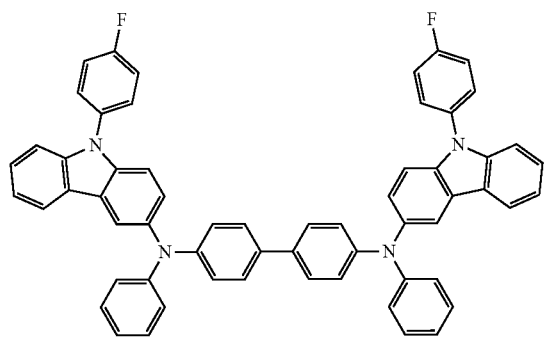
HT31
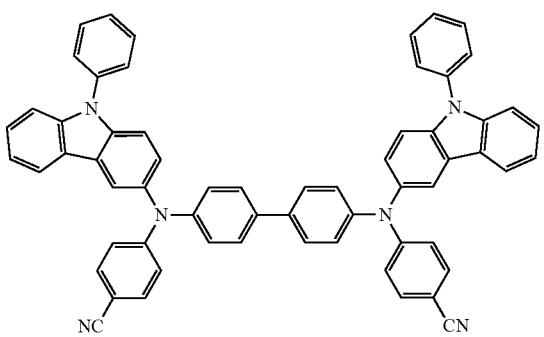
HT32
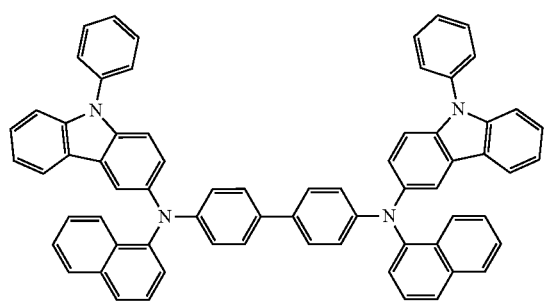
HT33
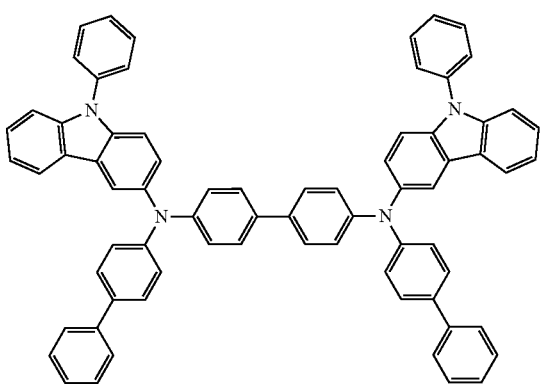
HT34
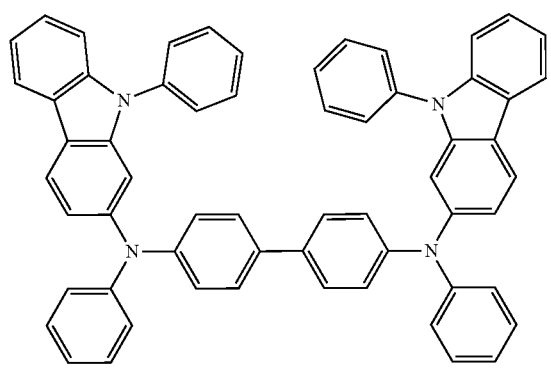
HT35
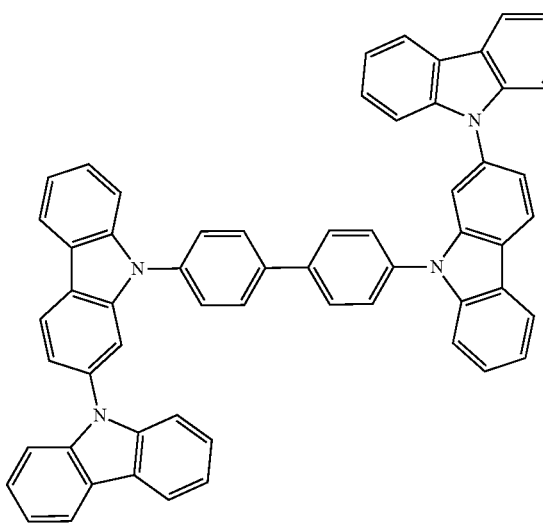

-continued
HT36
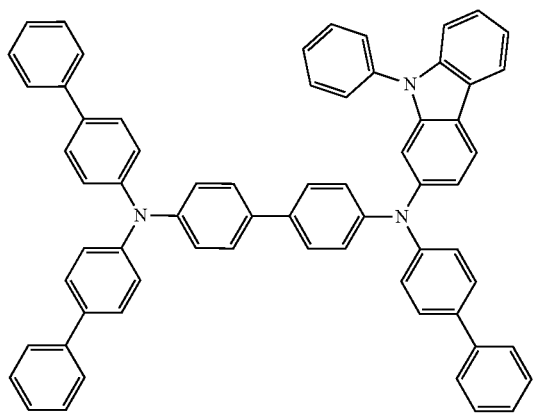
HT37
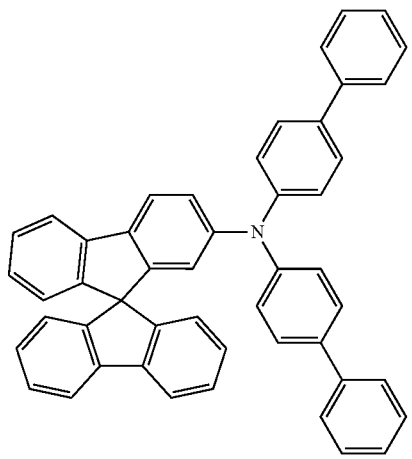
HT38
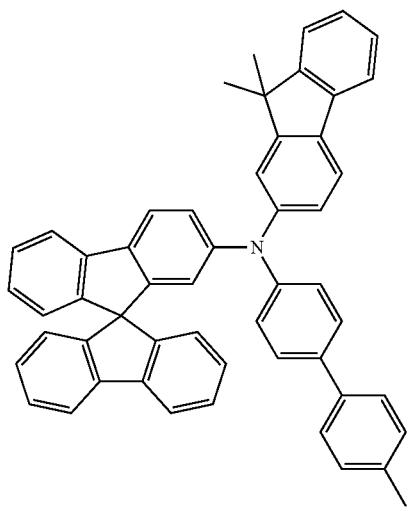
HT39
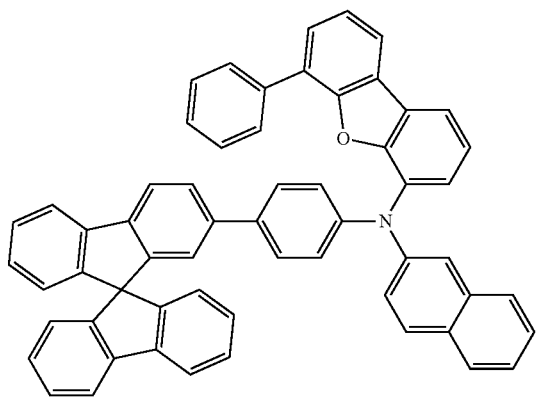
HT40
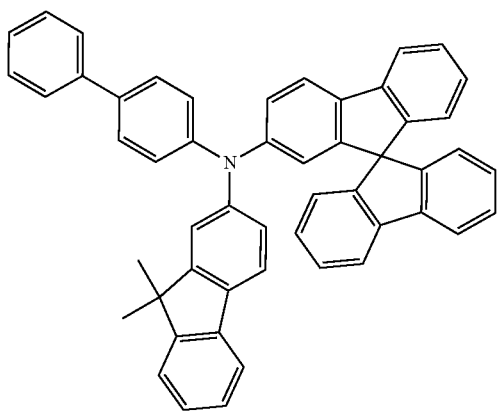
HT41
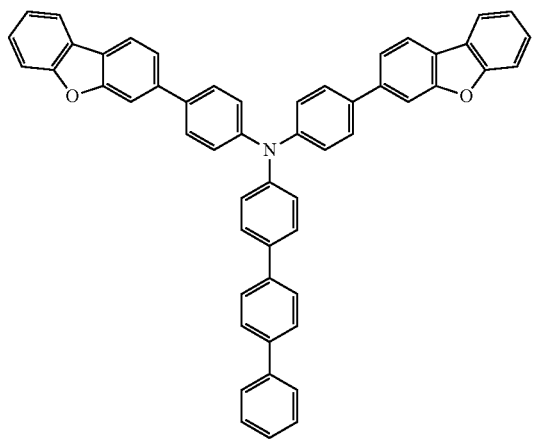

HT42
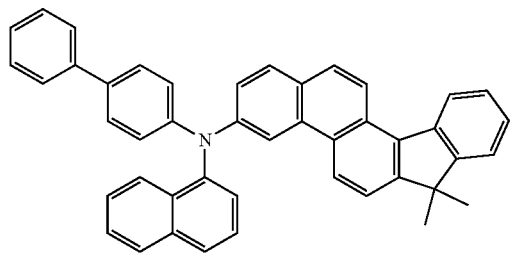
HT43
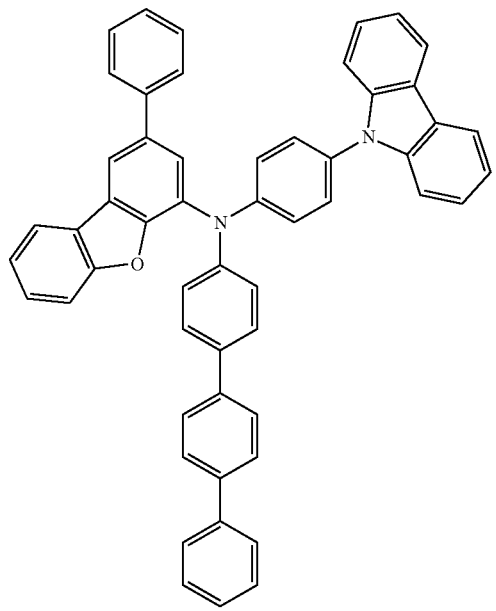
HT44
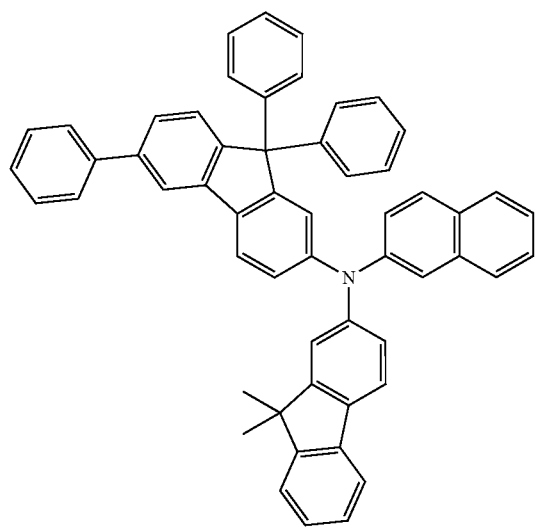
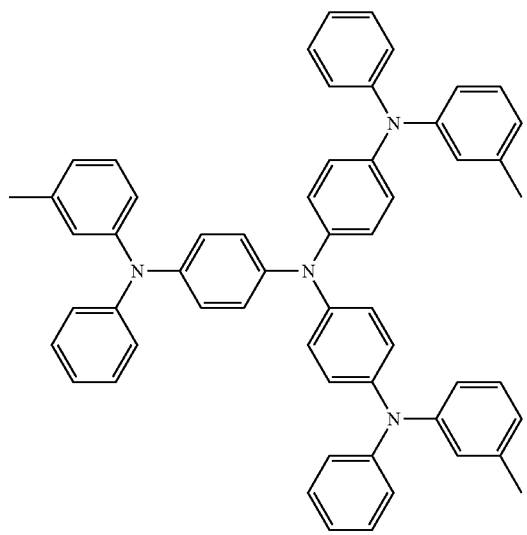
m-MTDATA

-continued
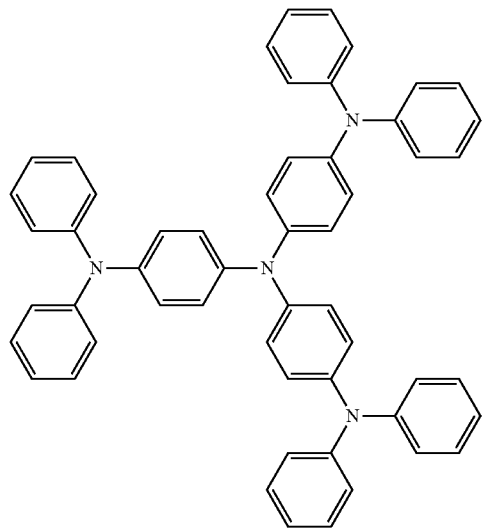
TDATA
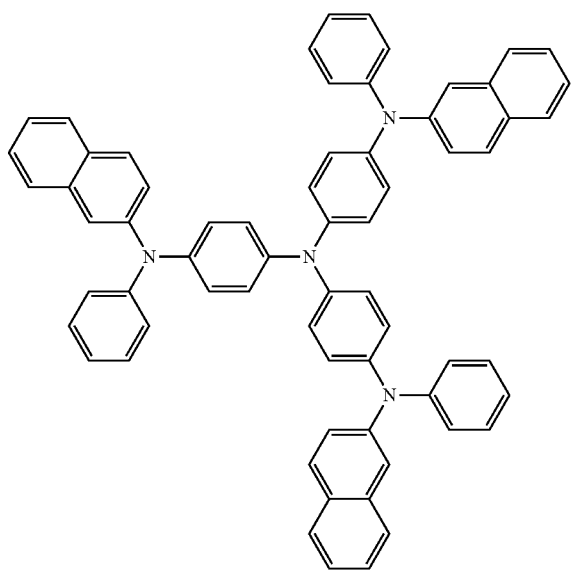
2-TNATA
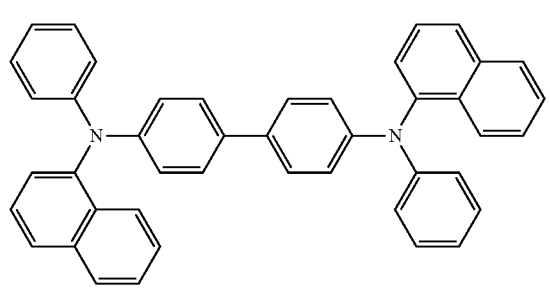
NPB
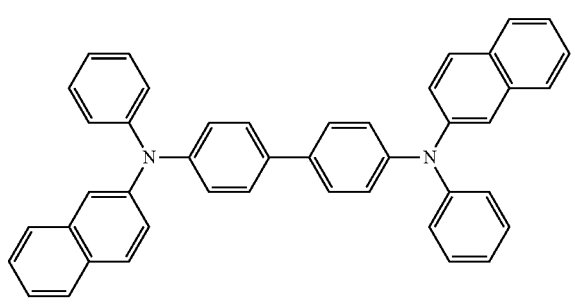
β-NPB
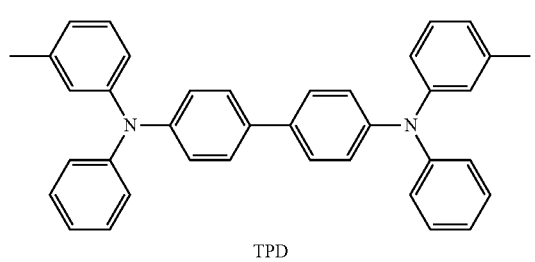
TPD
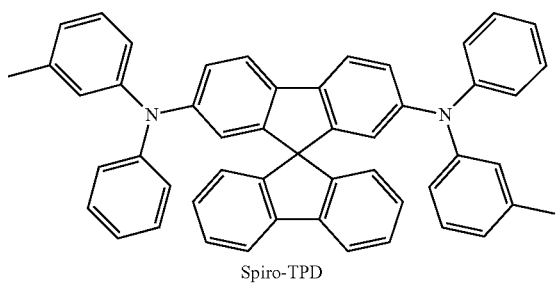
Spiro-TPD
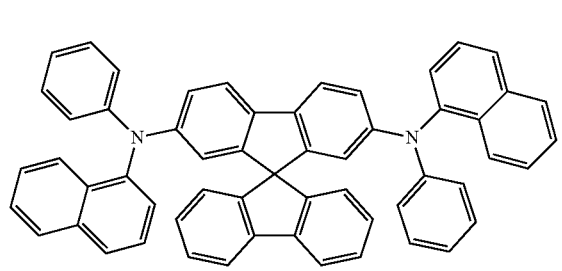
Spiro-NPB
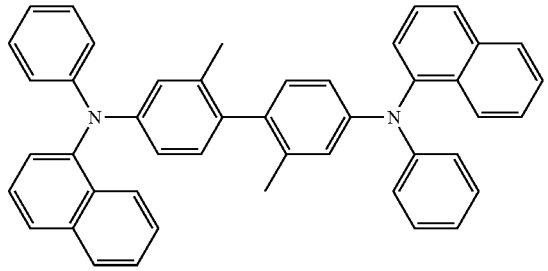
methylated-NPB

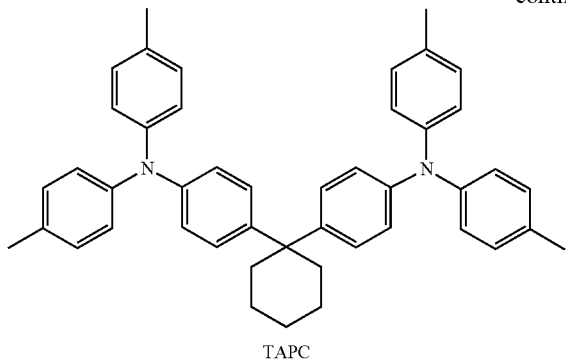

TAPC

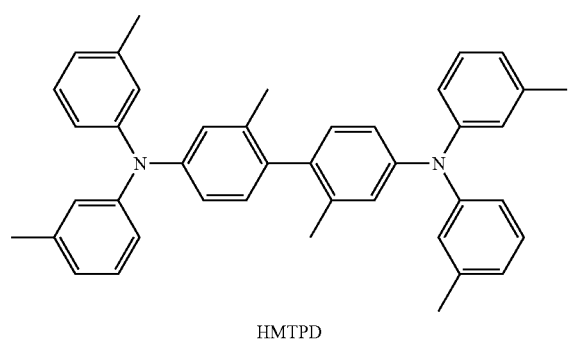

HMTPD

A thickness of the hole transport region 120 may be in a range of about 100 Å to about 10,000 Å. For example, thickness of the hole transport region 120 may be in a range of about 100 Å to about 1,000 Å.

A thickness of the hole injection layer 121 may be in a range of about 100 Å to about 9,000 Å, and a thickness of the hole transport layer 122 may be in a range of about 50 Å to about 2,000 Å. For example, the thickness of the hole injection layer 121 may be in a range of about 100 Å to about 1,000 Å. For example, thickness of the hole transport layer 122 may be in a range of about 100 Å to about 1,500 Å.

When the thicknesses of the hole transport region 120, the hole injection layer 121, and the hole transport layer 122 are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block the flow of electrons from the electron transport region. The emission auxiliary layer and the electron blocking layer may include the materials as described above.

[P-Dopant]

The hole transport region 120 may further include, in addition to these materials, a charge-generating material for the improvement of conductive properties. The charge-generating material may be uniformly or non-uniformly dispersed in the hole transport region 120 (for example, in the form of a single layer of a charge-generating material).

The charge-generating material may be, for example, a p-dopant.

In an embodiment, the hole injection layer 121 may further include a p-dopant.

For example, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or a combination thereof.

Examples of the quinone derivative are TCNQ and F4-TCNQ.

Examples of the cyano group-containing compound are HAT-CN and a compound represented by Formula 221:

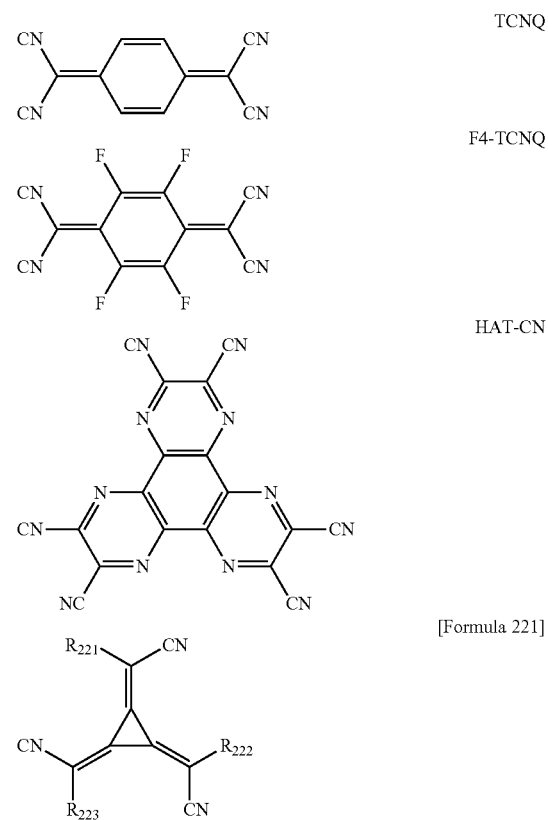

TCNQ

F4-TCNQ

HAT-CN

[Formula 221]

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or a combination thereof; or a combination thereof.

Regarding the compound containing element EL1 and element EL2, element EL1 may be metal, metalloid, or a combination thereof, and element EL2 may be a non-metal, metalloid, or a combination thereof.

Examples of the metal are: an alkali metal (for example, lithium (Li), sodium (Na), potassium (K), rubidium (Rb), cesium (Cs), or the like); an alkaline earth metal (for example, beryllium (Be), magnesium (Mg), calcium (Ca), strontium (Sr), barium (Ba), or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (for example, zinc (Zn), indium (In), tin (Sn), or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like).

Examples of the metalloid are silicon (Si), antimony (Sb), and tellurium (Te).

Examples of the non-metal are oxygen (O) and halogen (for example, F, Cl, Br, I, etc.).

In an embodiment, examples of the compound containing element EL1 and element EL2 are metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, and a combination thereof.

Examples of the metal oxide are tungsten oxide (for example, WO, $W_2O_3$, $WO_2$, $WO_3$, or $W_2O_5$), vanadium oxide (for example, VO, $V_2O_3$, $VO_2$, or $V_2O_5$), molybdenum oxide (MoO, $Mo_2O_3$, $MoO_2$, $MoO_3$, or $Mo_2O_5$), and rhenium oxide (for example, $ReO_3$).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, or $TiI_4$), zirconium halide (for example, $ZrF_4$, $ZrCl_4$, $ZrBr_4$, or $ZrI_4$), hafnium halide (for example, $HfF_4$, $HfCl_4$, $HfBr_4$, or $HfI_4$), vanadium halide (for example, $VF_3$, $VCl_3$, $VBr_3$, or $VI_3$), niobium halide (for example, $NbF_3$, $NbCl_3$, $NbBr_3$, or $NbI_3$), tantalum halide (for example, $TaF_3$, $TaCl_3$, $TaBr_3$, or $TaI_3$), chromium halide (for example, $CrF_3$, $CrCl_3$, $CrBr_3$, or $CrI_3$), molybdenum halide (for example, $MoF_3$, $MoCl_3$, $MoBr_3$, or $MoI_3$), tungsten halide (for example, $WF_3$, $WCl_3$, $WBr_3$, or $WI_3$), manganese halide (for example, $MnF_2$, $MnCl_2$, $MnBr_2$, or $MnI_2$), technetium halide (for example, $TcF_2$, $TcCl_2$, $TcBr_2$, or $TcI_2$), rhenium halide (for example, $ReF_2$, $ReCl_2$, $ReBr_2$, or $ReI_2$), iron halide (for example, $FeF_2$, $FeCl_2$, $FeBr_2$, or $FeI_2$), ruthenium halide (for example, $RuF_2$, $RuCl_2$, $RuBr_2$, or $RuI_2$), osmium halide (for example, $OsF_2$, $OsCl_2$, $OsBr_2$, or $OsI_2$), cobalt halide (for example, $CoF_2$, $CoCl_2$, $CoBr_2$, or $CoI_2$), rhodium halide (for example, $RhF_2$, $RhCl_2$, $RhBr_2$, or $RhI_2$), iridium halide (for example, $IrF_2$, $IrCl_2$, $IrBr_2$, or $IrI_2$), nickel halide (for example, $NiF_2$, $NiCl_2$, $NiBr_2$, or $NiI_2$), palladium halide (for example, $PdF_2$, $PdCl_2$, $PdBr_2$, or $PdI_2$), platinum halide (for example, $PtF_2$, $PtCl_2$, $PtBr_2$, or $PtI_2$), copper halide (for example, CuF, CuCl, CuBr, or CuI), silver halide (for example, AgF, AgCl, AgBr, or AgI), and gold halide (for example, AuF, AuCl, AuBr, or AuI).

Examples of the post-transition metal halide are zinc halide (for example, $ZnF_2$, $ZnCl_2$, $ZnBr_2$, or $ZnI_2$), indium halide (for example, $InI_3$), and tin halide (for example, $SnI_2$).

Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide are antimony halide (for example, $SbCl_5$).

Examples of the metal telluride are an alkali metal telluride (for example, $Li_2Te$, $Na_2Te$, $K_2Te$, $Rb_2Te$, or $Cs_2Te$), alkaline earth metal telluride (for example, BeTe, MgTe, CaTe, SrTe, or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), post-transition metal telluride (for example, or ZnTe), and lanthanide metal telluride (for example, LaTe, CeTe, PrTe, NdTe, PmTe, EuTe, GdTe, TbTe, DyTe, HoTe, ErTe, TmTe, YbTe, or LuTe).

[Emission Layer 131 in Interlayer 130]

When the light-emitting device 10 is a full-color light-emitting device, the emission layer 131 may be patterned into a red emission layer, a green emission layer, and/or a blue emission layer, according to a sub-pixel. In an embodiment, the emission layer 131 may have a stacked structure of two or more layers of a red emission layer, a green emission layer, and a blue emission layer, in which the two or more layers contact each other or are separated from each other. In embodiments, the emission layer may include two or more materials of a red light-emitting material, a green light-emitting material, and a blue light-emitting material, in which the two or more materials are mixed with each other in a single layer to emit white light.

In an embodiment, the emission layer 131 may include a host and a dopant. The dopant may include a phosphorescent dopant, a fluorescent dopant, or a combination thereof.

An amount of the dopant in the emission layer 131 may be in a range of about 0.01 parts by weight to about 15 parts by weight based on 100 parts by weight of the host.

In embodiments, the emission layer 131 may include a quantum dot.

In an embodiment, the emission layer 131 may include a delayed fluorescence material. The delayed fluorescence material may act as a host or a dopant in the emission layer 131.

A thickness of the emission layer 131 may be in a range of about 100 Å to about 1,000 Å. For example, the thickness of the emission layer 131 may be in a range of about 200 Å to about 600 Å. When the thickness of the emission layer 131 is within these ranges, excellent light-emission characteristics may be obtained without a substantial increase in driving voltage.

[Host]

In an embodiment, the host may include a compound represented by Formula 301:

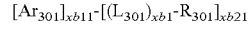 [Formula 301]

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each be the same as described in connection with $Q_1$.

For example, when xb11 in Formula 301 is 2 or more, two or more $Ar_{301}$(s) may be linked to each other via a single bond.

In embodiments, the host may include a compound represented by Formula 301-1, a compound represented by Formula 301-2, or a combination thereof:

[Formula 301-1]

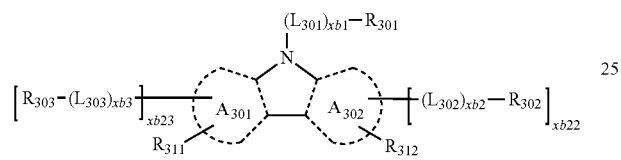

[Formula 301-2]

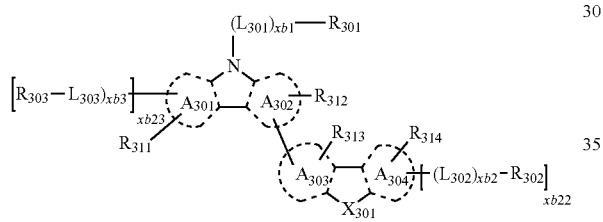

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described in the specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In embodiments, the host may include an alkaline earth metal complex and/or Zn complex. For example, the host may be a Be complex (for example, Compound H55), a Mg complex, a Zn complex, or a combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-Abenzene (TCP), or a combination thereof, but embodiments of the disclosure are not limited thereto:

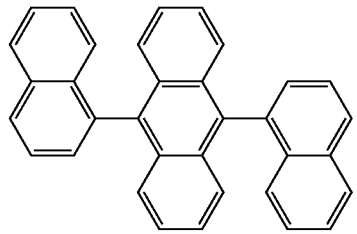

H1

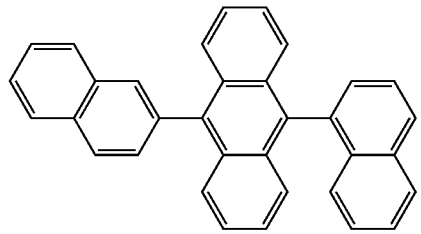

H2

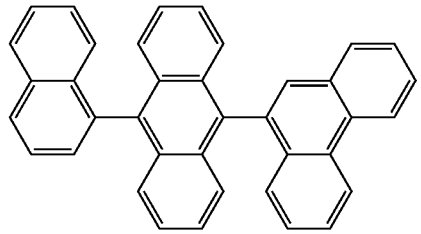

H3

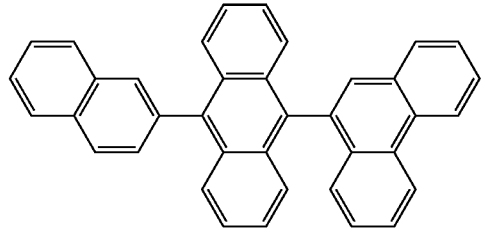

H4

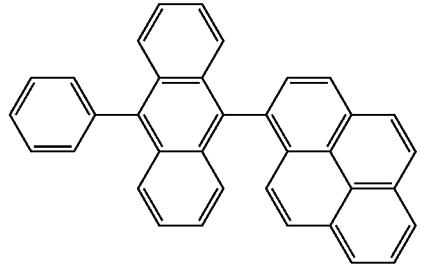

H5

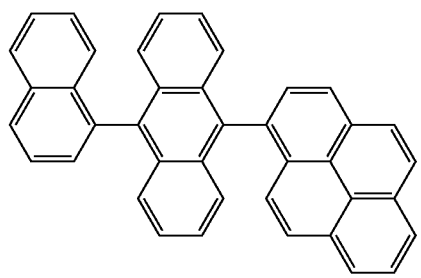

H6

-continued
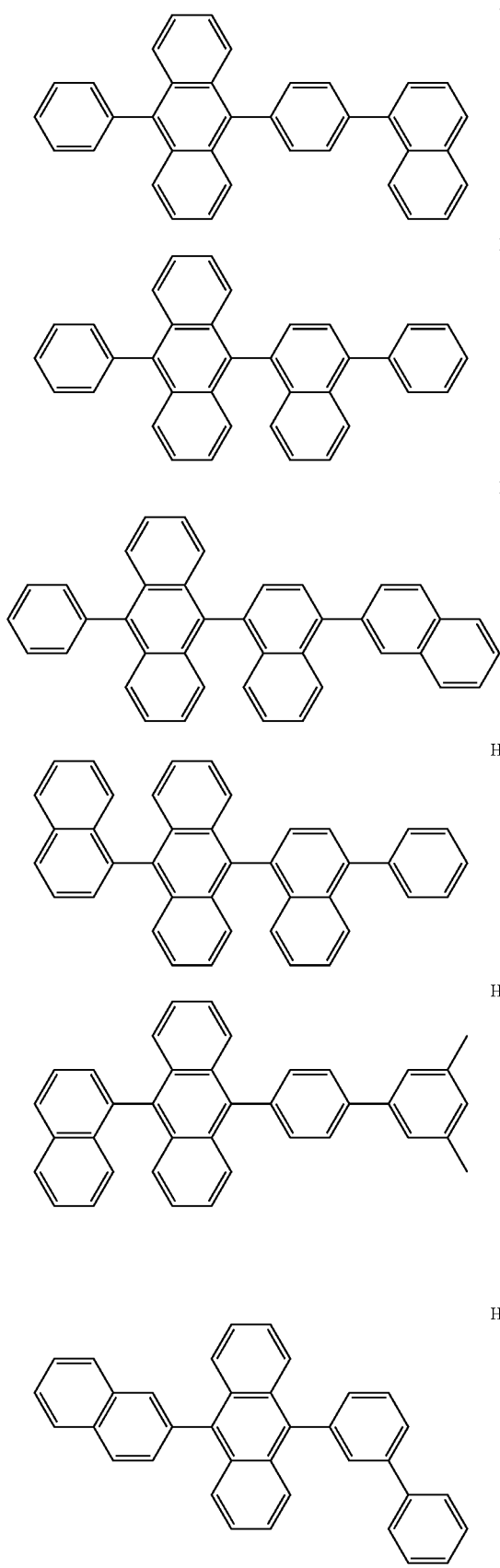
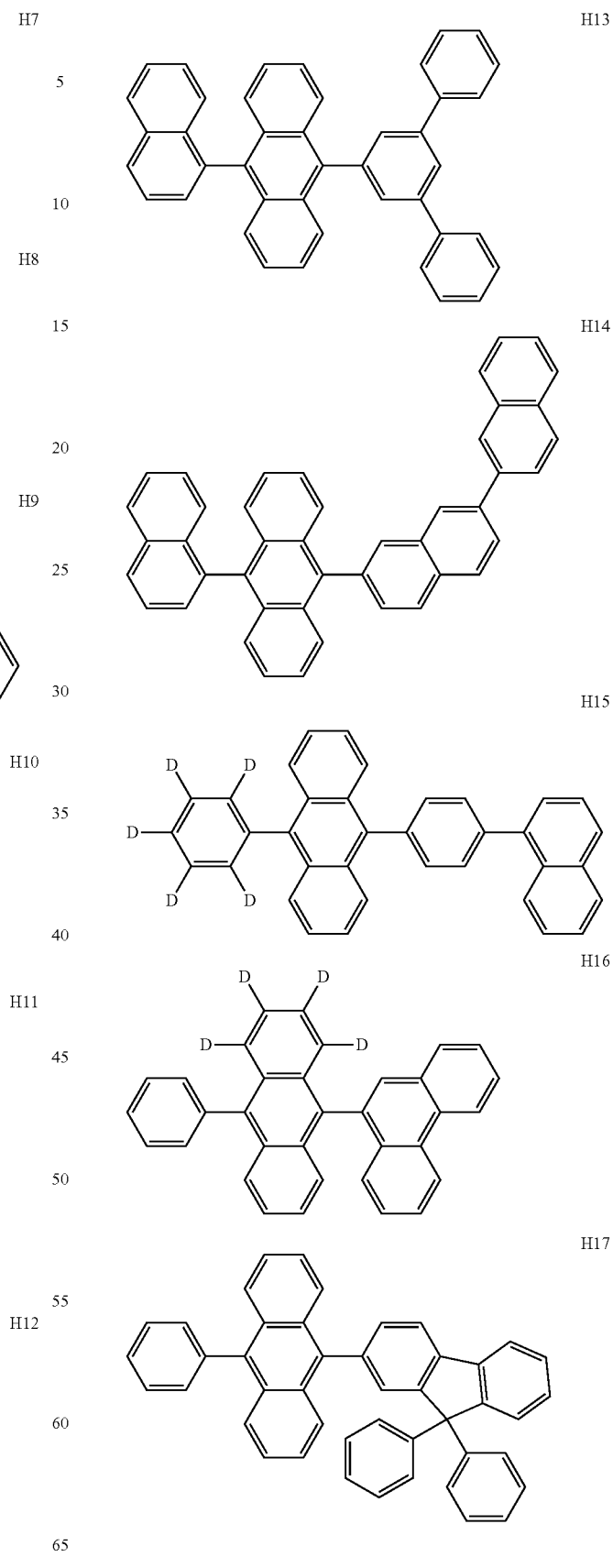

H18
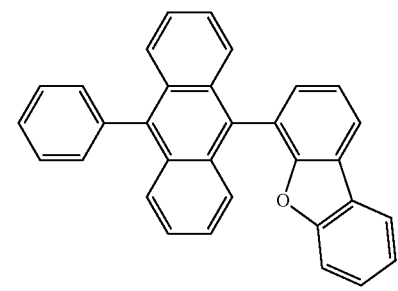
H19
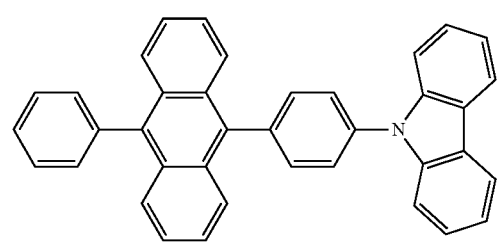
H20
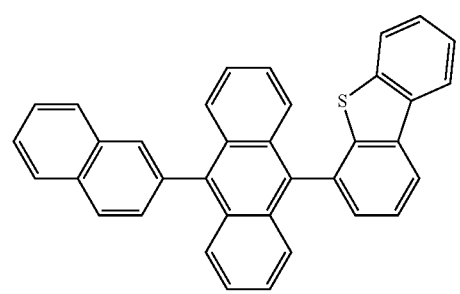
H21
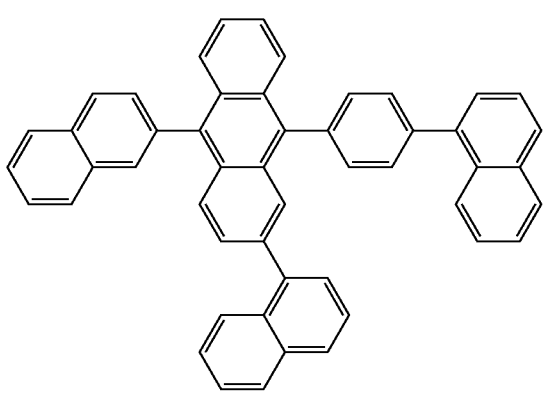
H22
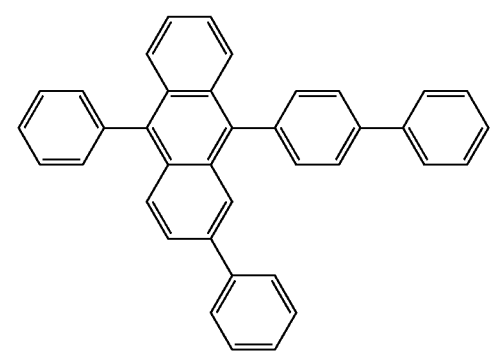
H23
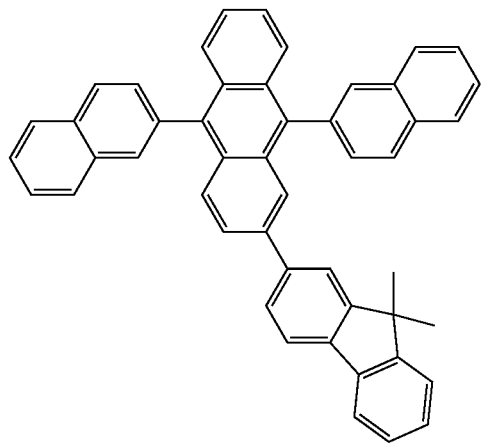
H24
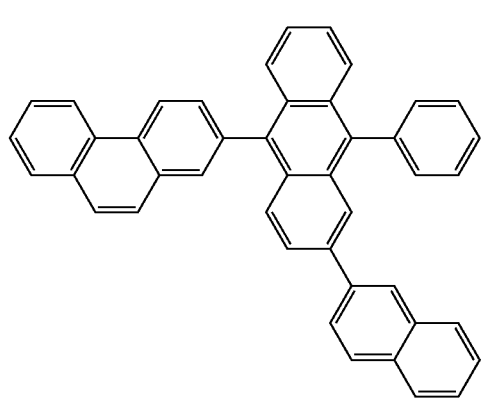
H25
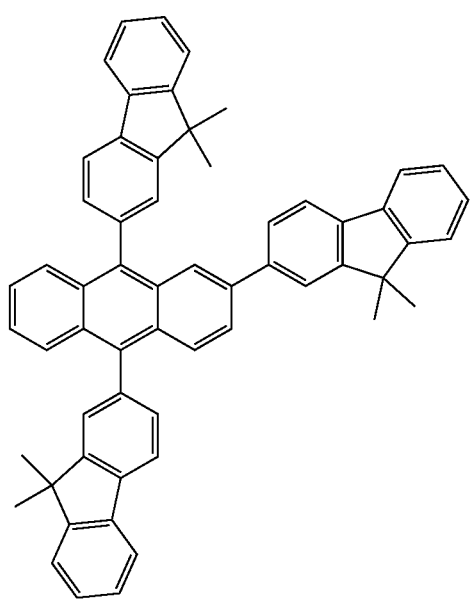

| | |
|---|---|
| H26 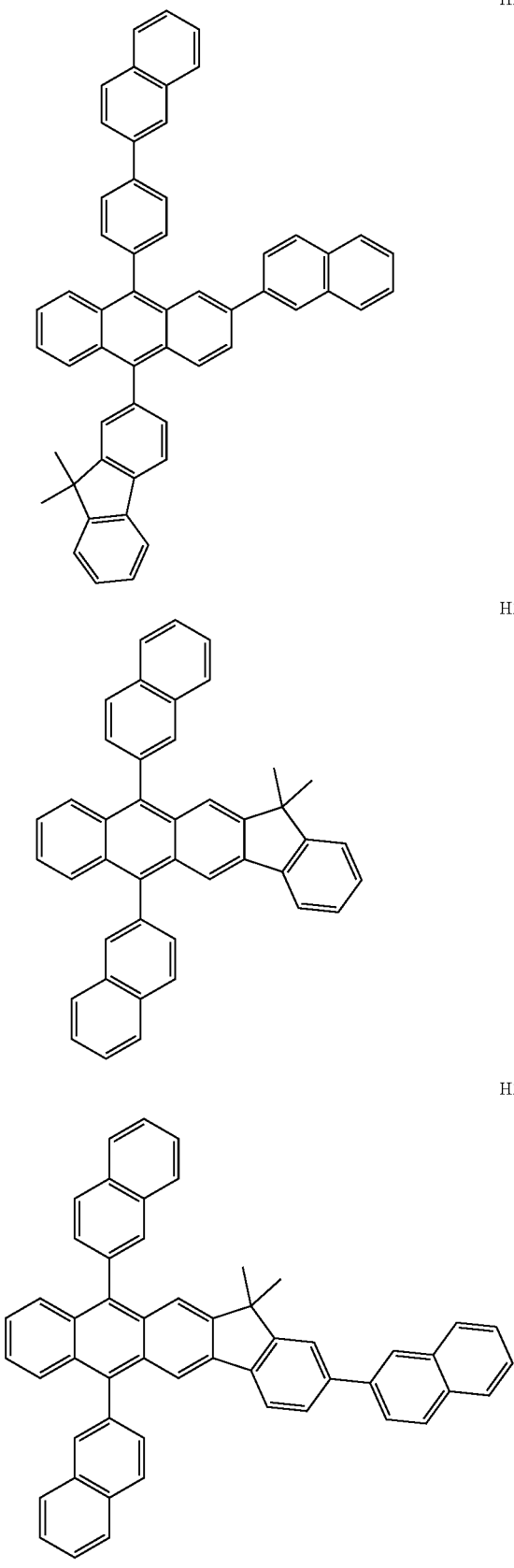 | H29 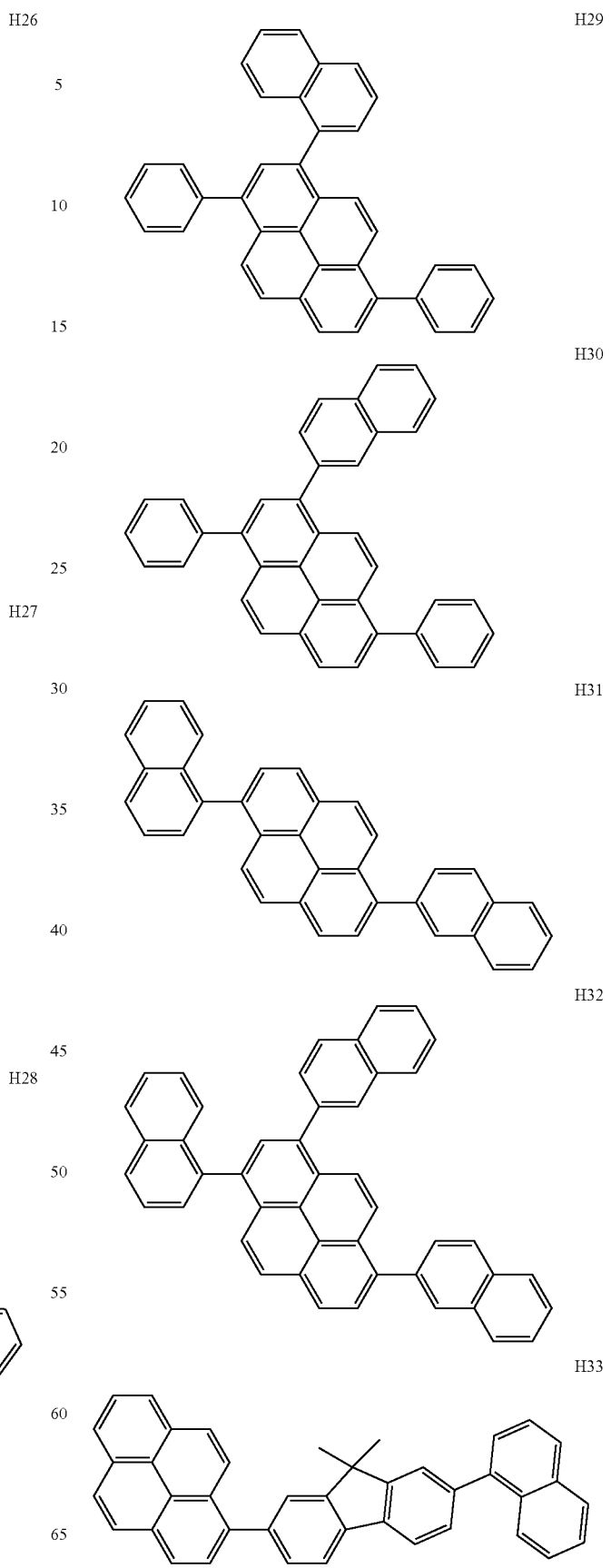 |
| H27 | H30 |
| H28 | H31 |
| | H32 |
| | H33 |

-continued
H34
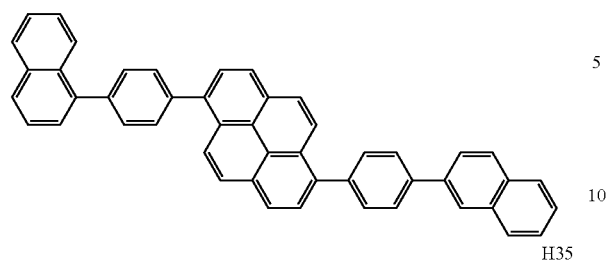
H35
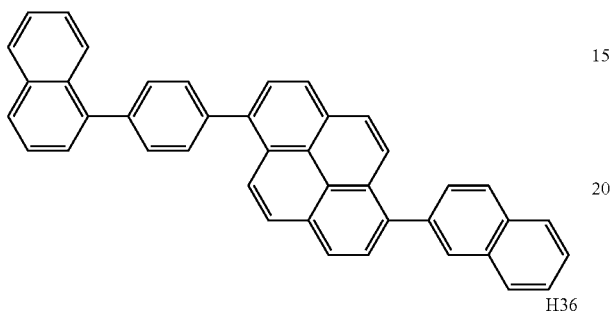
H36
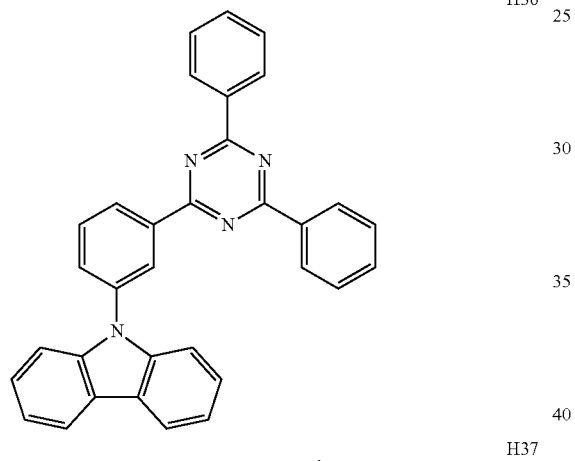
H37
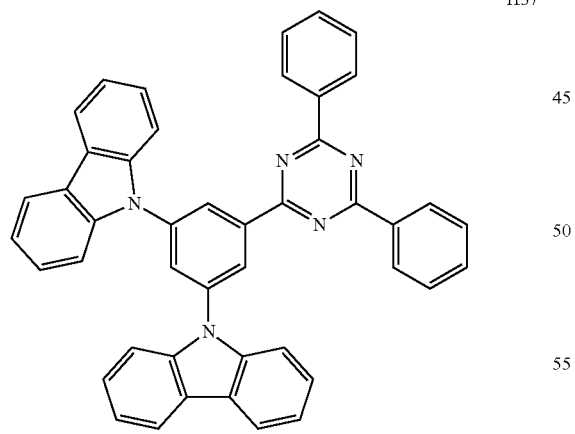
H38
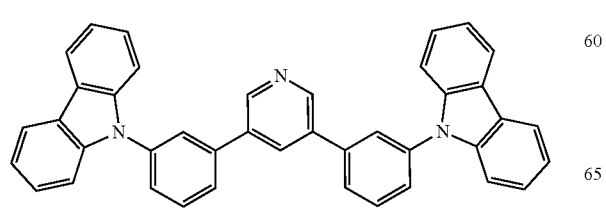
-continued
H39
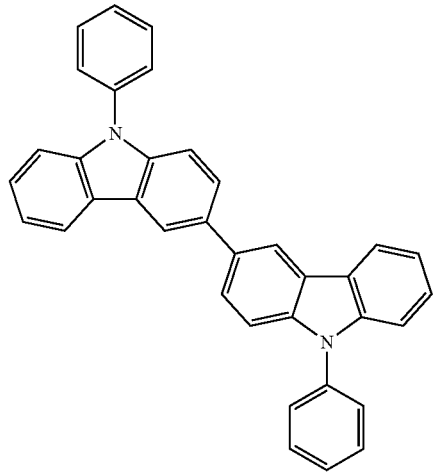
H40
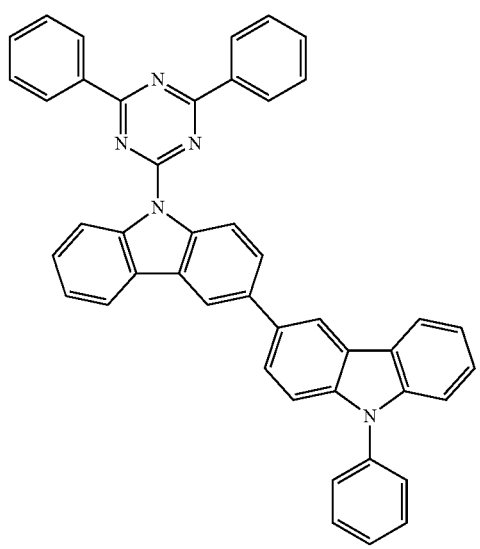
H41
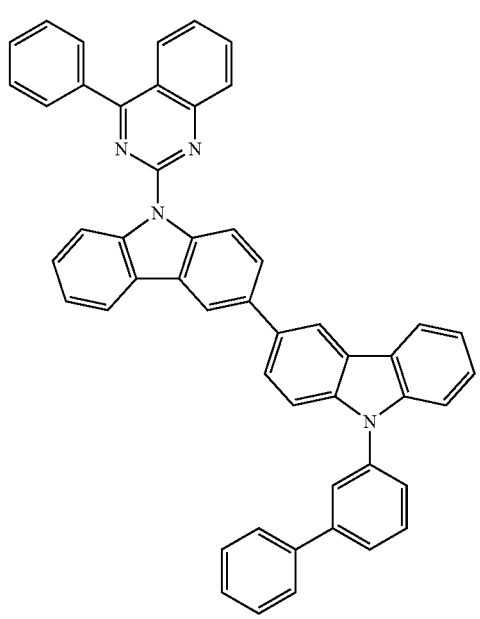

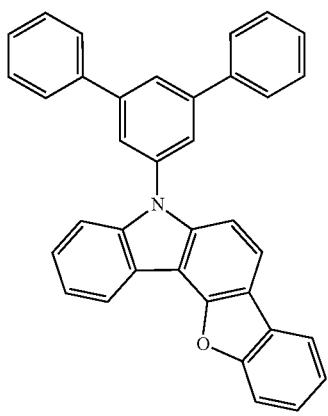
H42
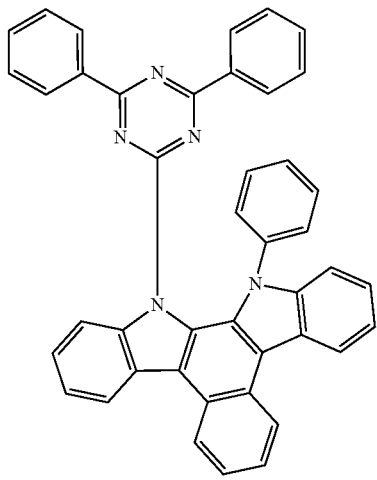
H45
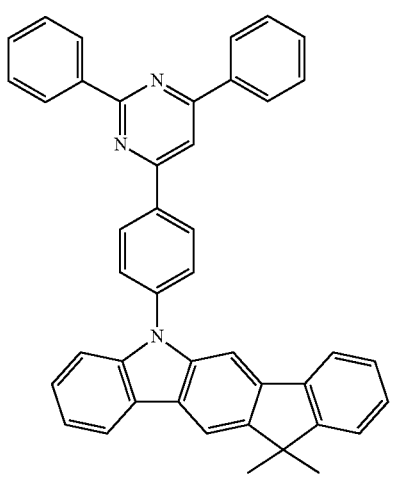
H43
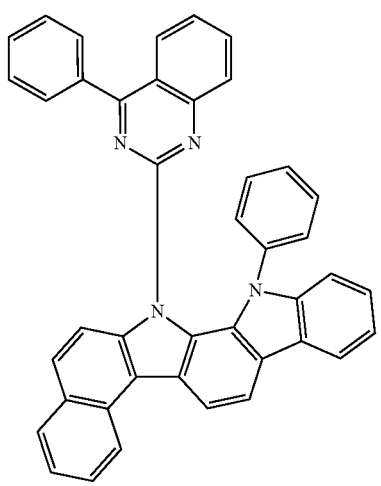
H46
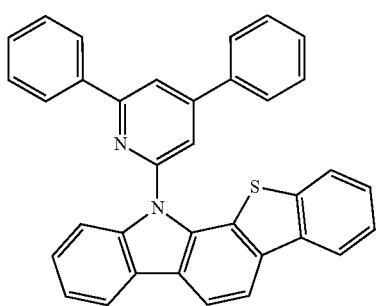
H44
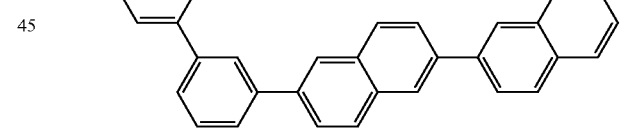
H47
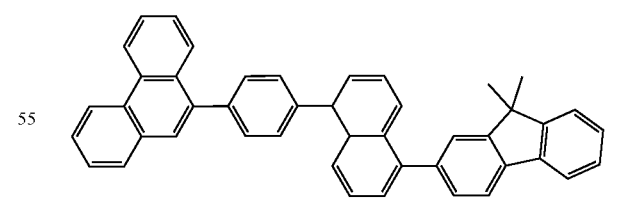
H48
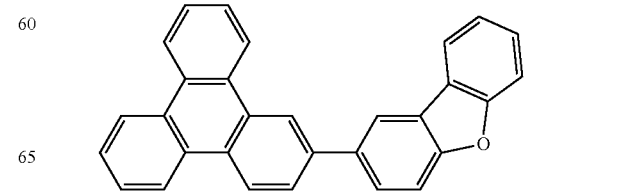
H49

-continued
H50
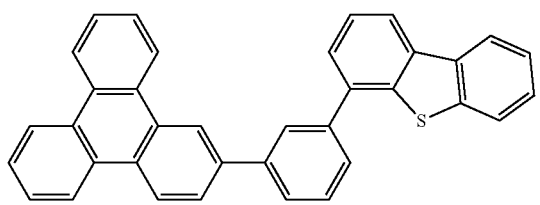
H51
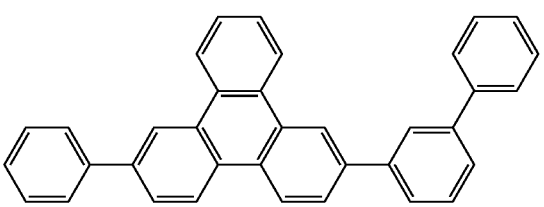
H52
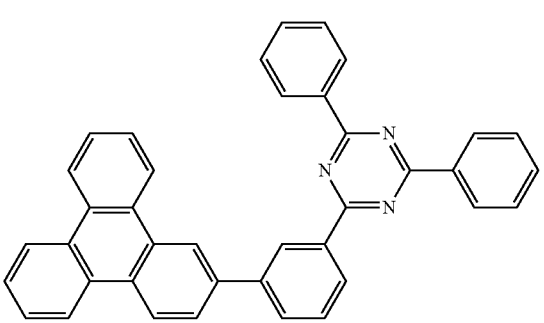
H53
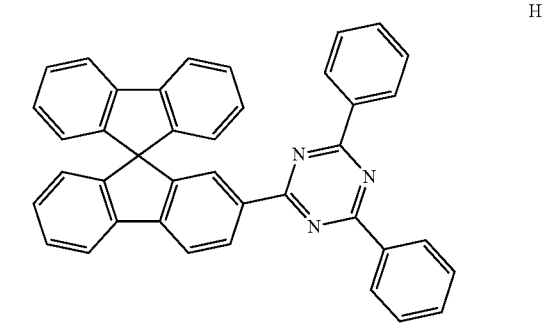
H54
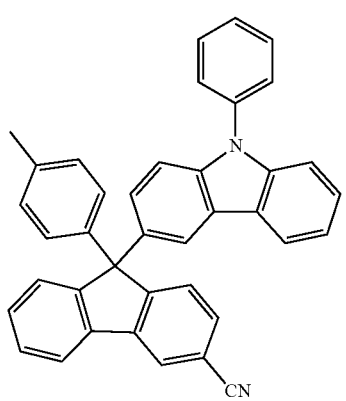
-continued
H55
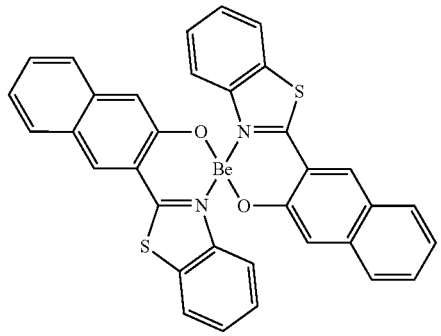
H56
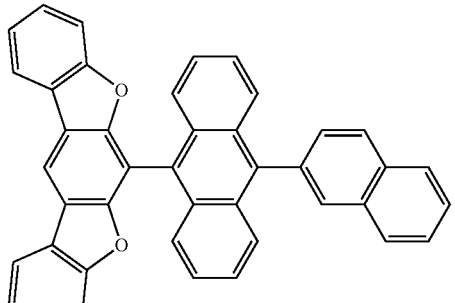
H57
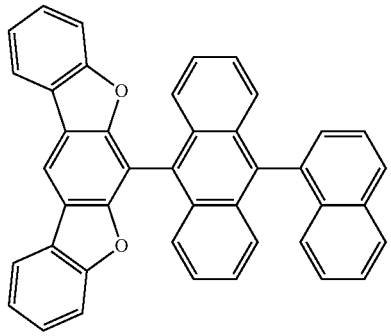
H58
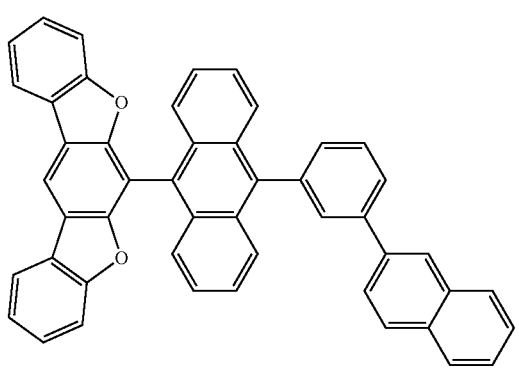

H59
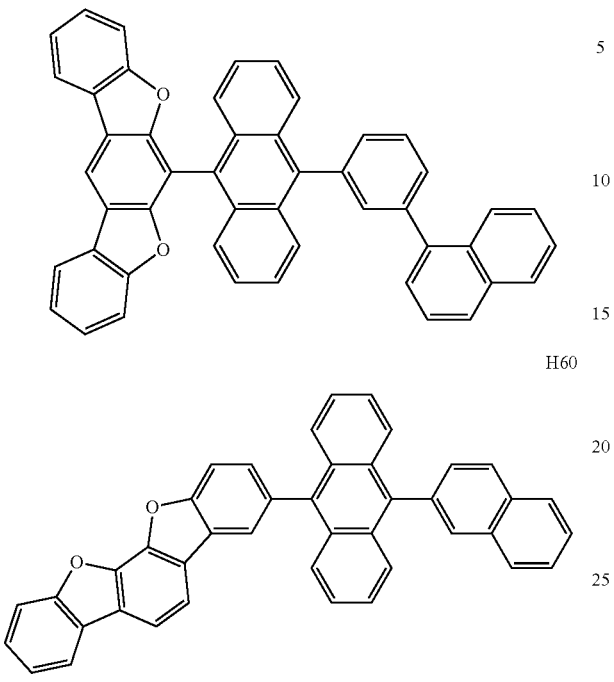
H60
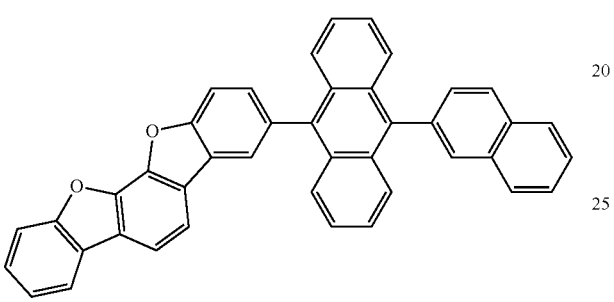
H61
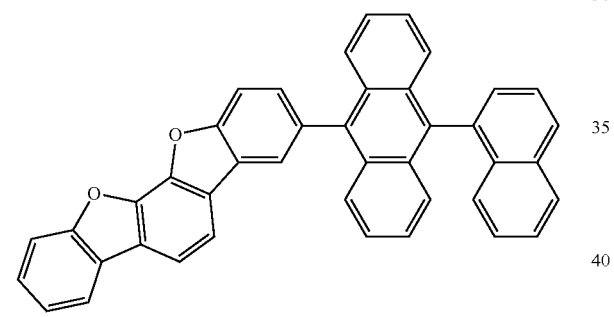
H62
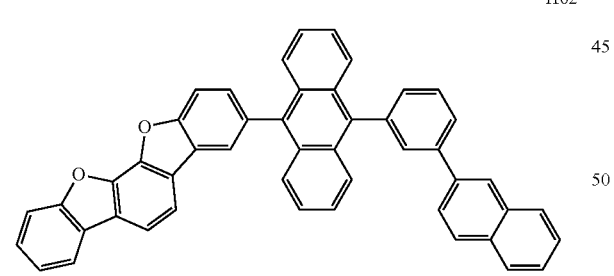
H63
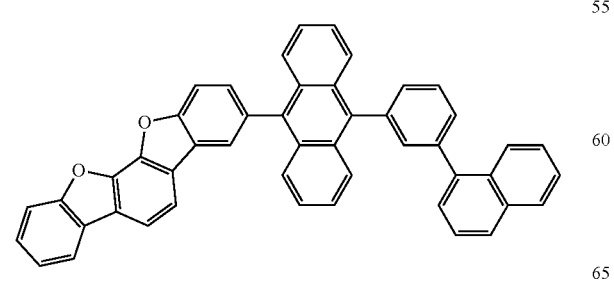
H64
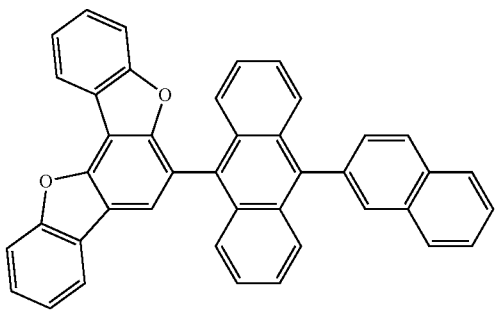
H65
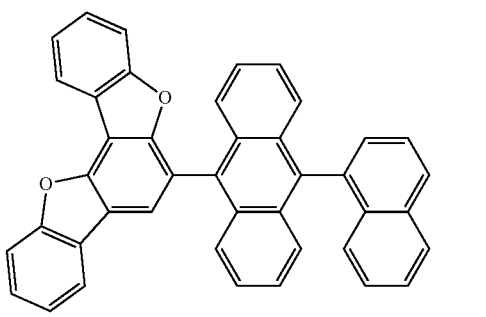
H66
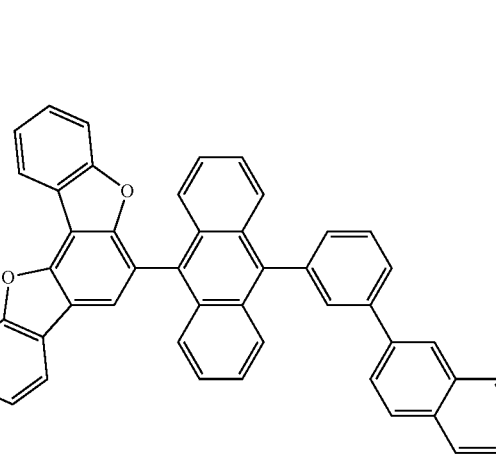
H67
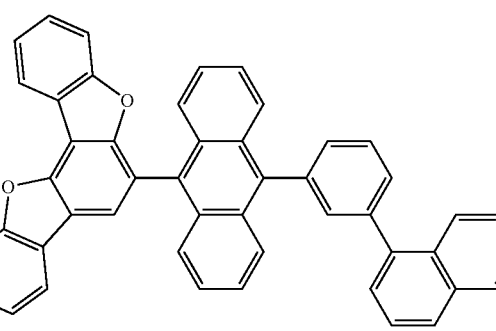

H68
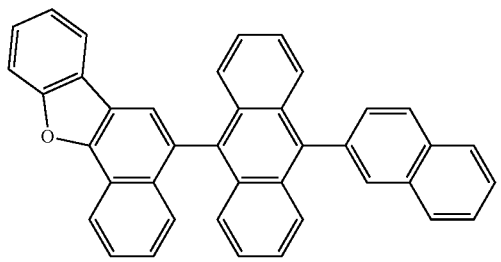
H69
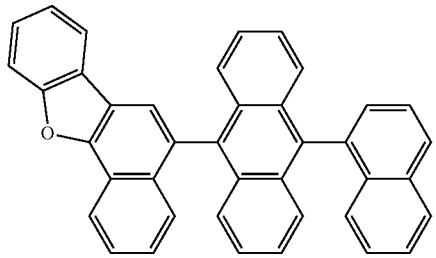
H70
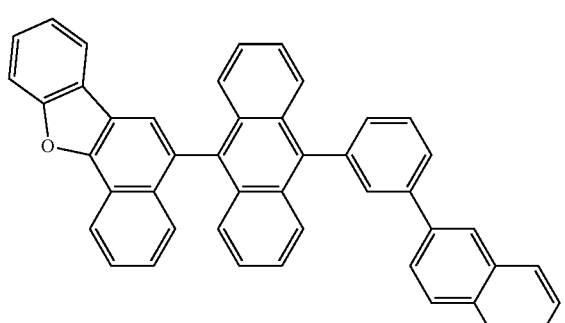
H71
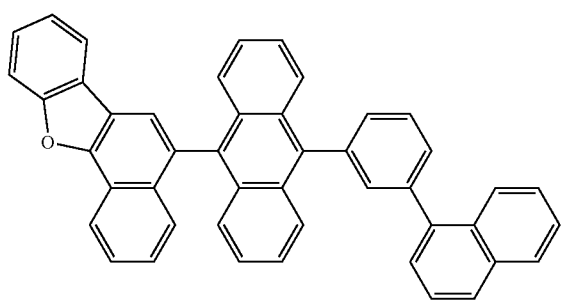
H72
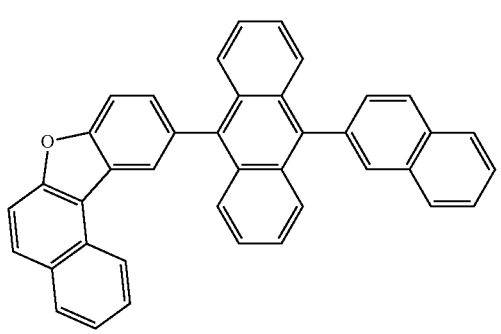
H73
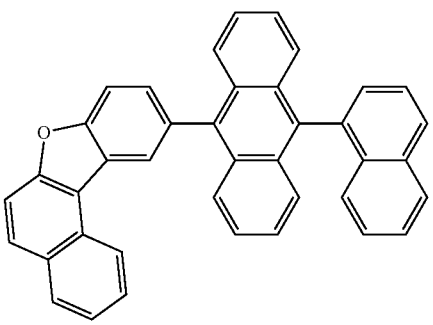
H74
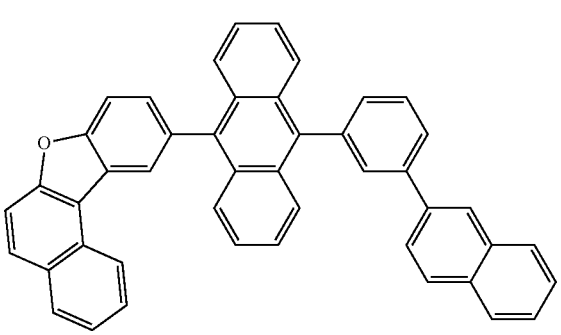
H75
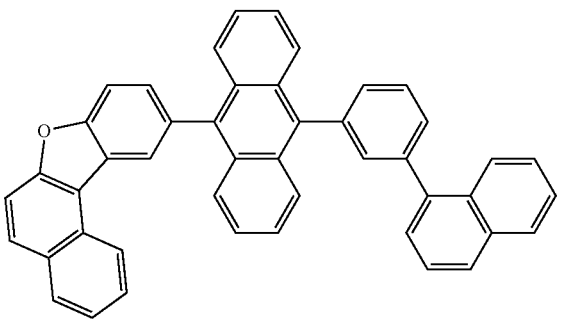
H76
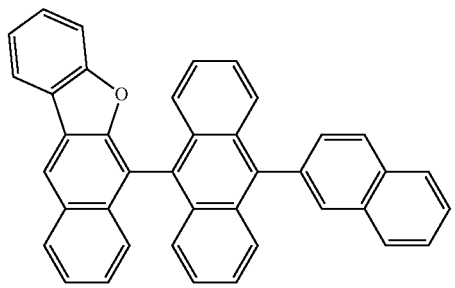
H77
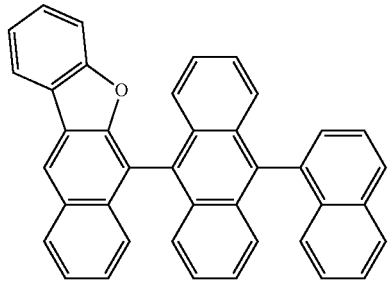

H78
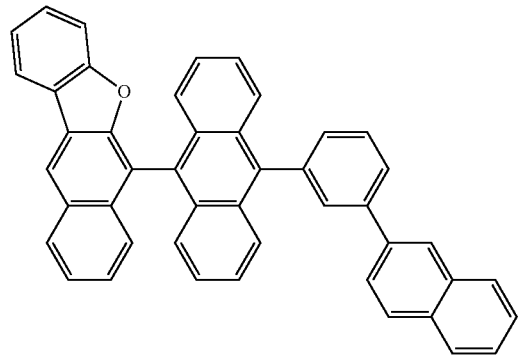
H79
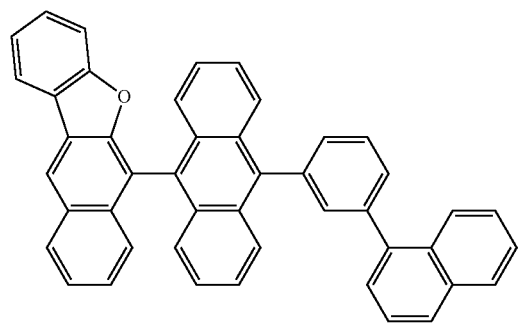
H80
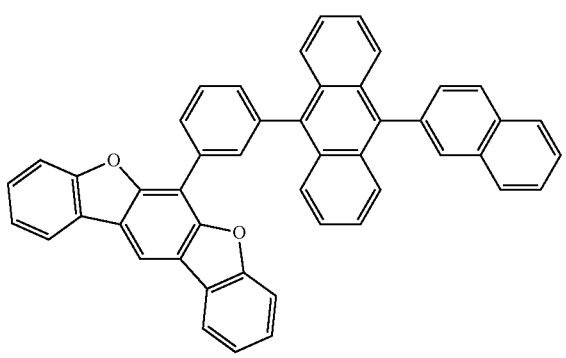
H81
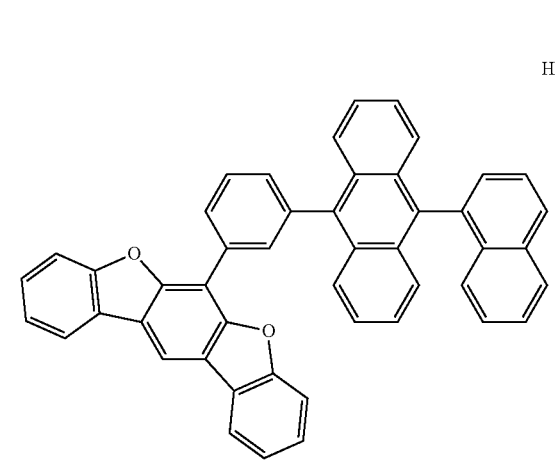
H82
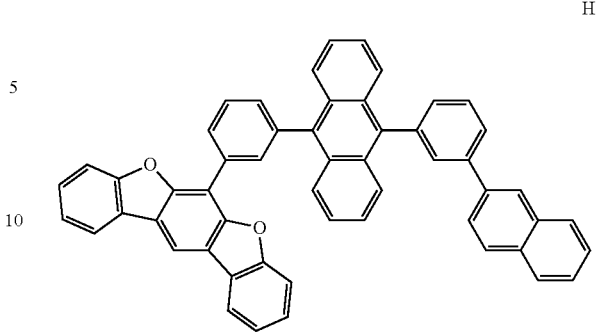
H83
H84
H85
H86

H87
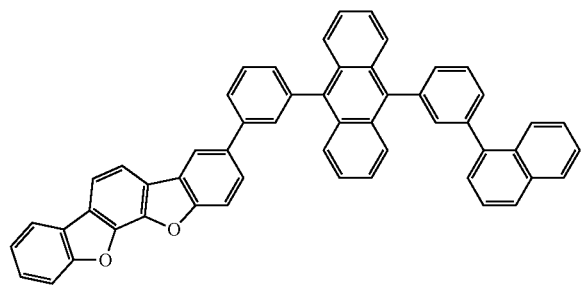
H88
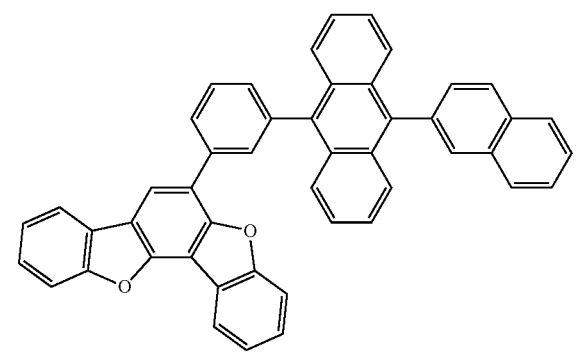
H89
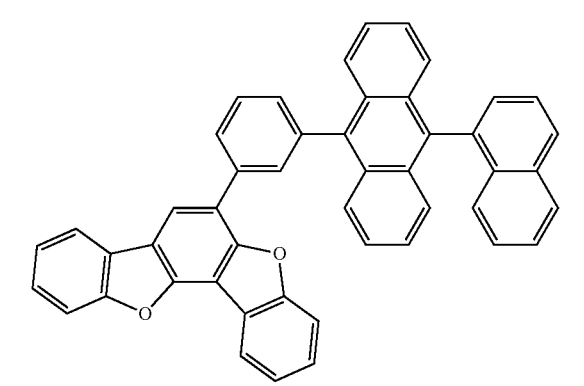
H90
H91
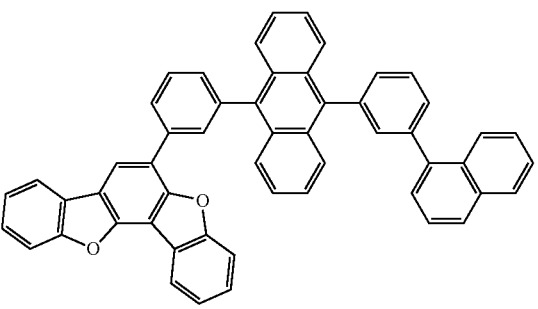
H92
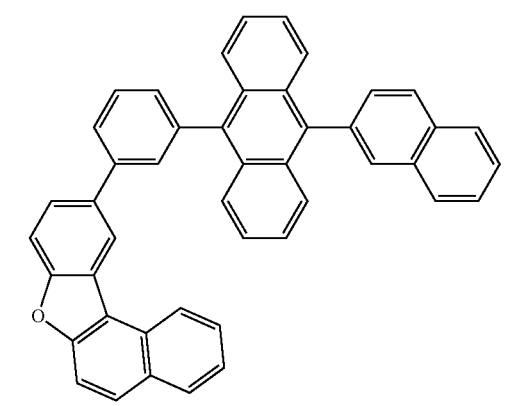
H93
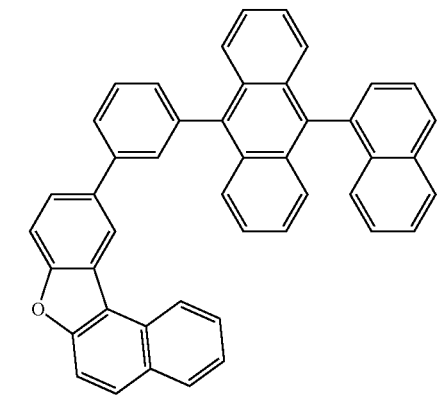
H94
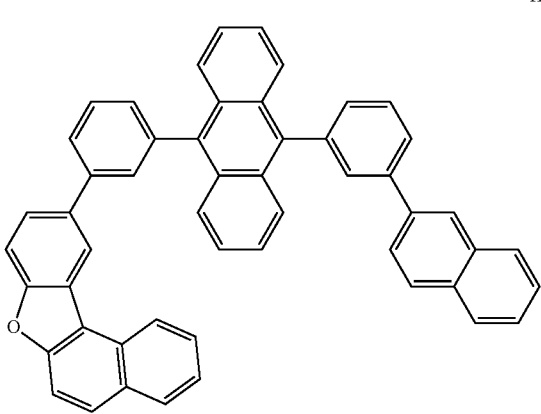

H95
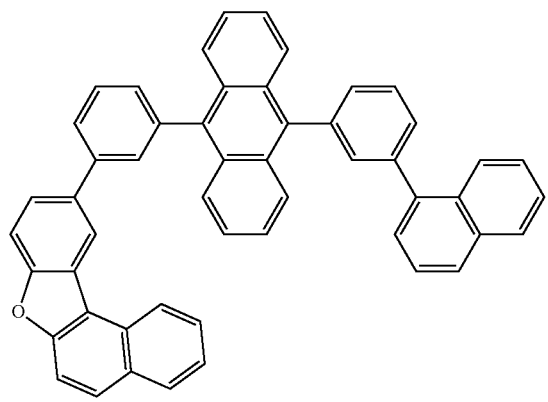
H96
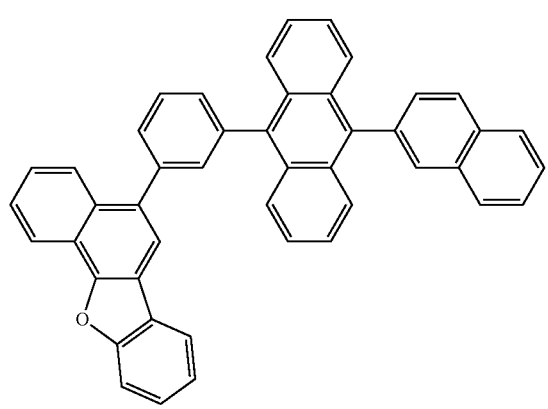
H97
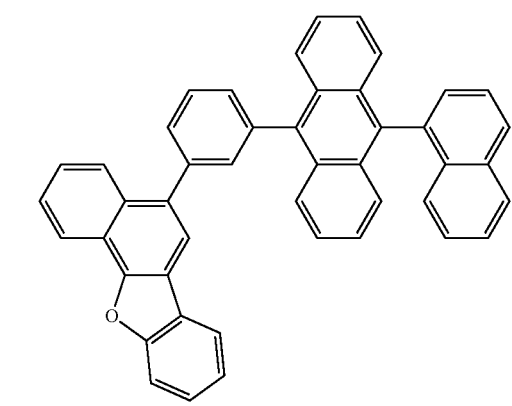
H98
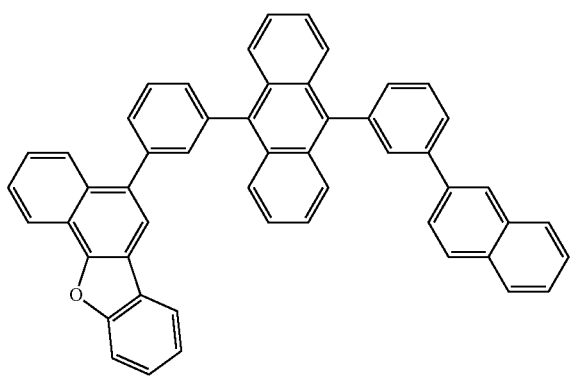
H99
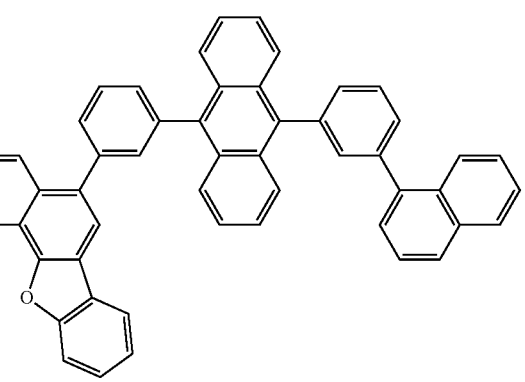
H100
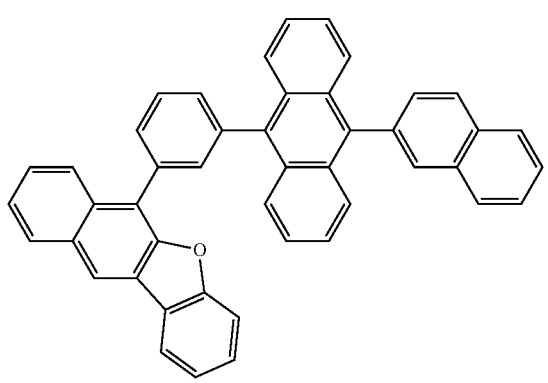
H101
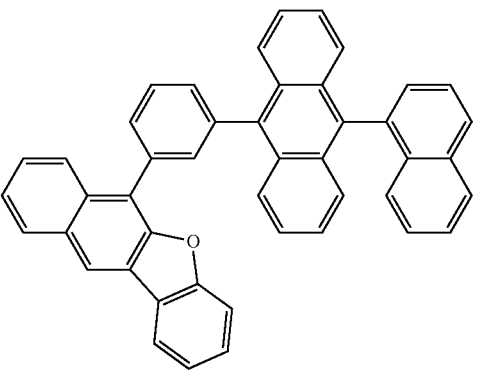
H102
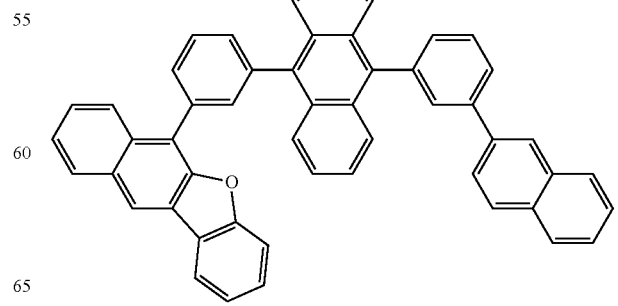

H103
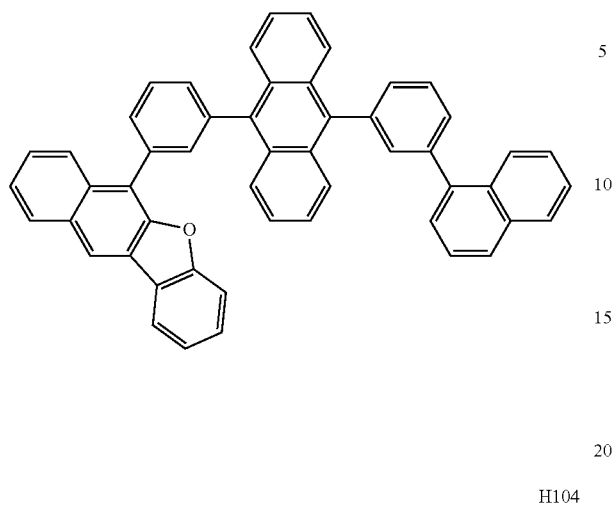
H104
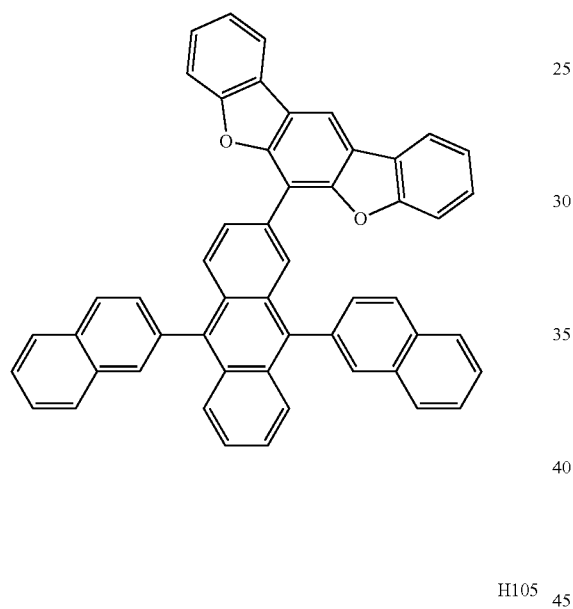
H105
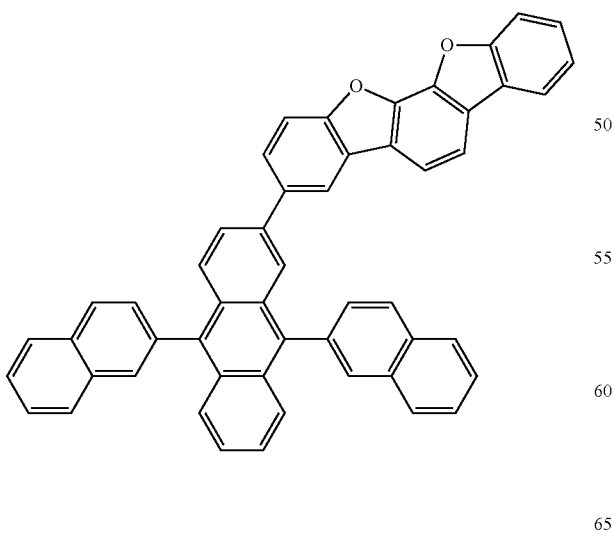
H106
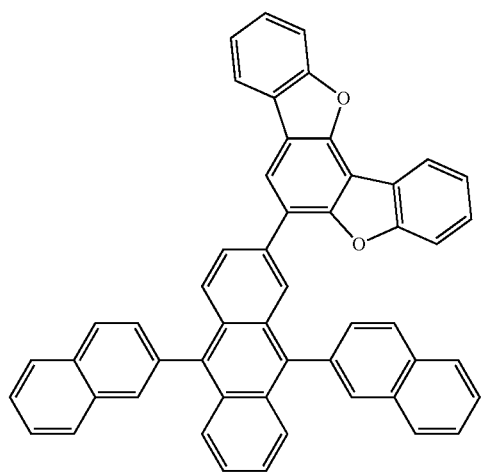
H107
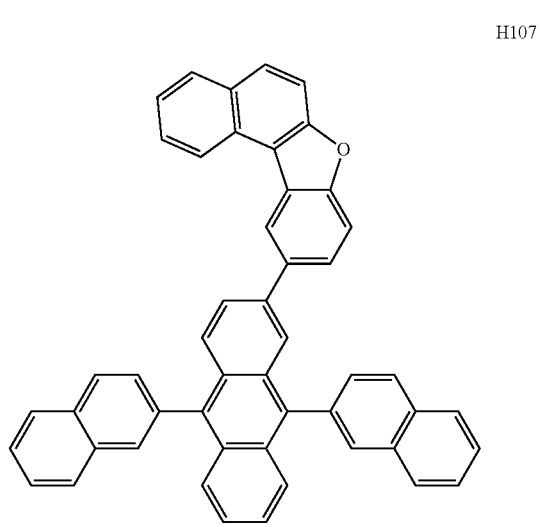
H108
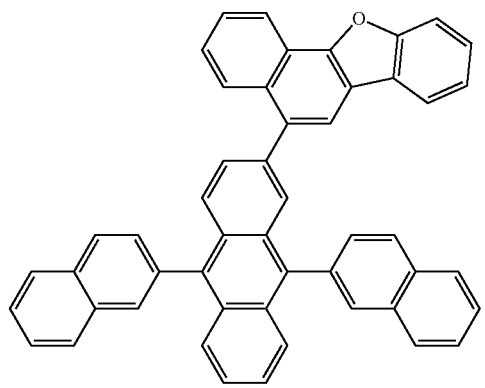

H109
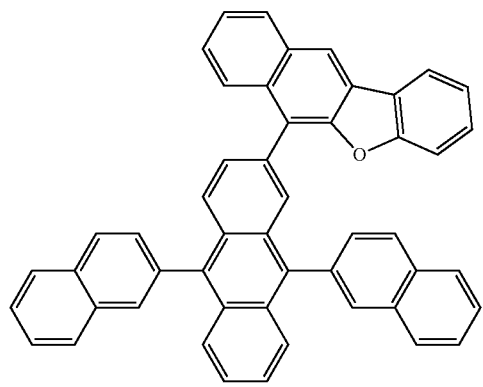
H110
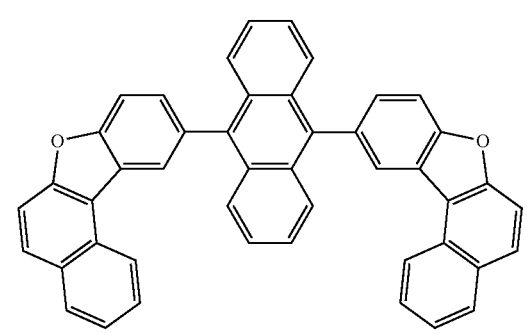
H111
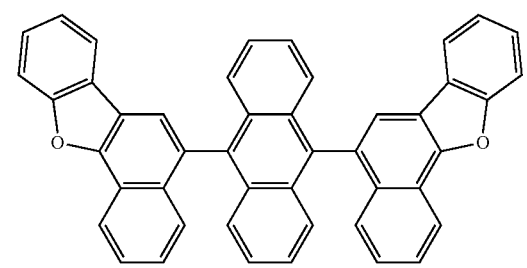
H112
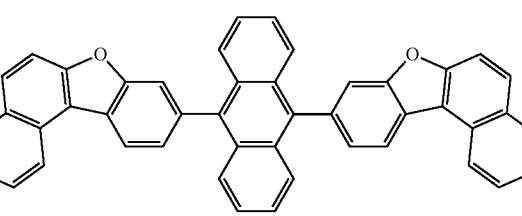
H113
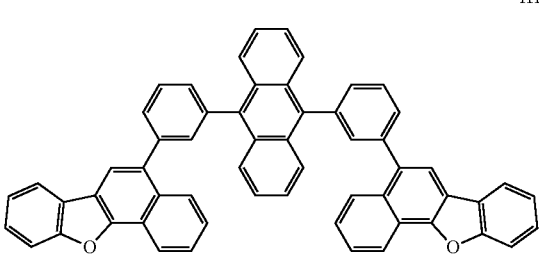
H114
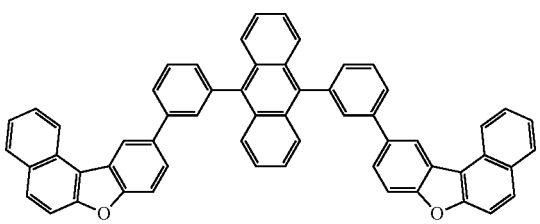
H115
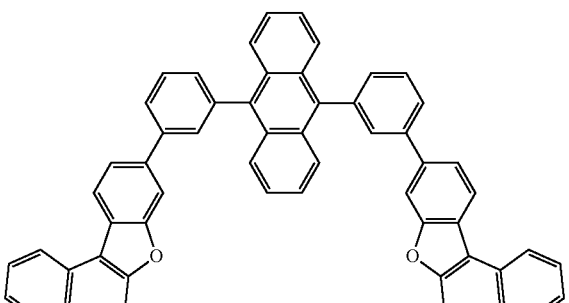
H116
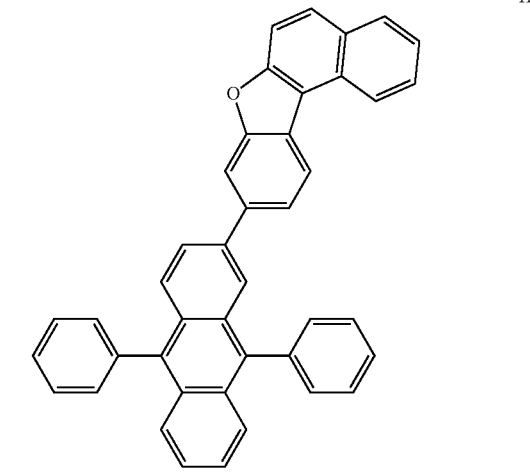
H117
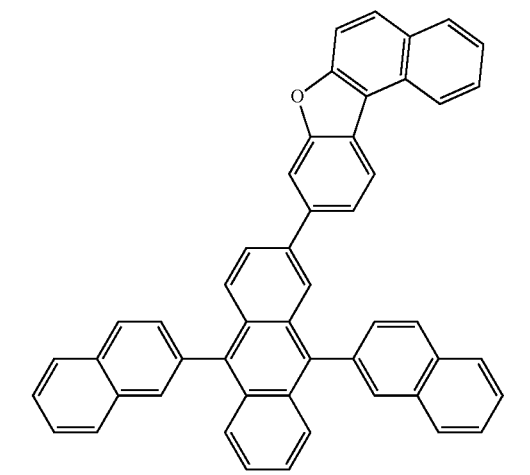

H118
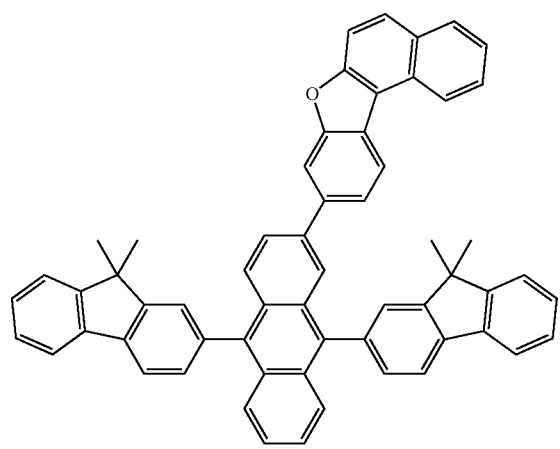
H119
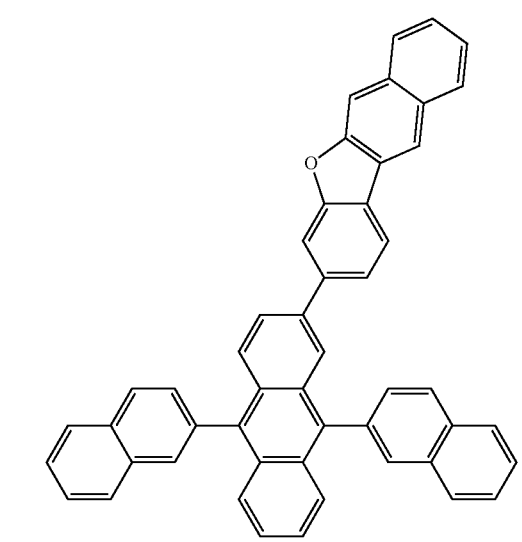
H120
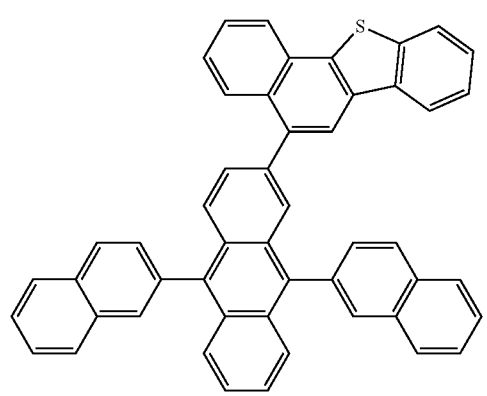
H121
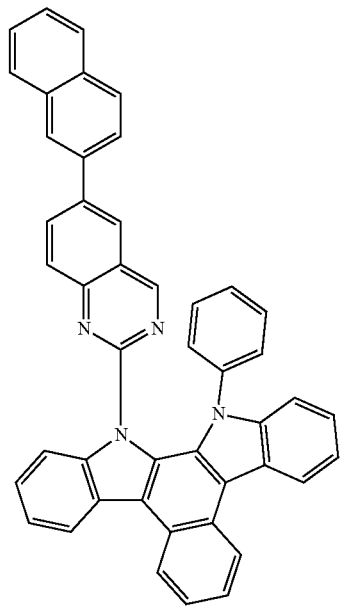
H122
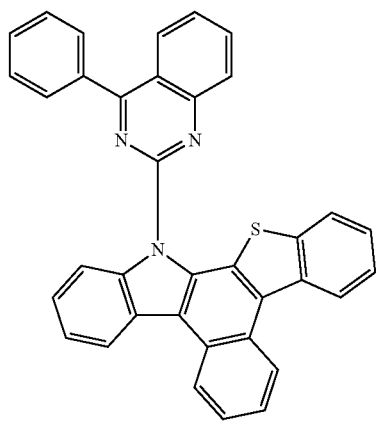
H123
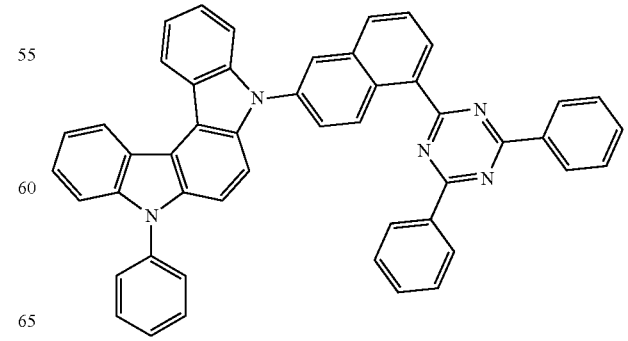

-continued

H124

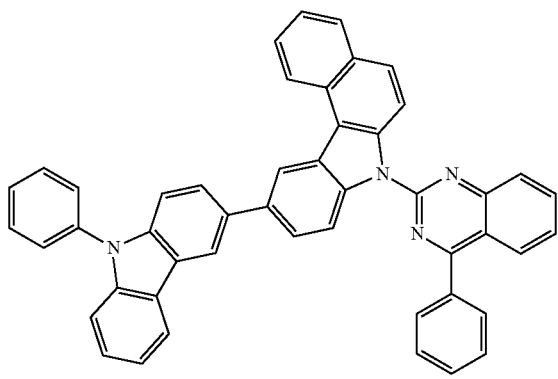

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or a combination thereof.

The phosphorescent dopant may be electrically neutral.

For example, the phosphorescent dopant may include an organometallic compound represented by Formula 401:

$M(L_{401})_{xc1}(L_{402})_{xc2}$ [Formula 401]

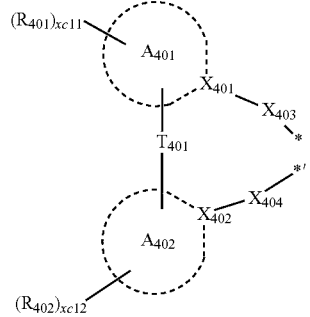

[Formula 402]

wherein, in Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more $L_{401}$(s) may be identical to or different from each other, $L_{402}$ may be an organic ligand, and xc2 may be 0, 1, 2, 3, or 4, wherein, when xc2 is 2 or more, two or more $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In embodiments, when xc1 in Formula 402 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ may each be the same as described in connection with $T_{401}$.

$L_{402}$ in Formula 401 may be an organic ligand. For example, $L_{402}$ may be a halogen group, a diketone group (for example, an acetylacetonate group), a carboxylic acid group (for example, a picolinate group), —C(=O), an isonitril group, a —CN group, a phosphorus group (for example, a phosphine group or a phosphite group), or a combination thereof.

The phosphorescent dopant may include, for example, one of Compounds PD1 to PD25, or a combination thereof:

PD1

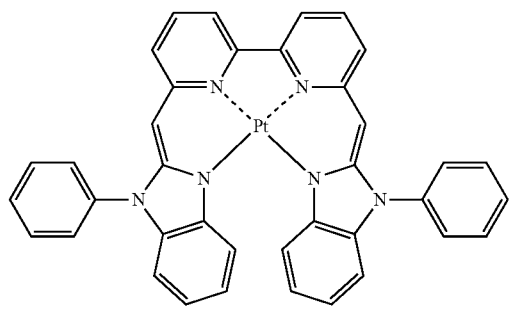

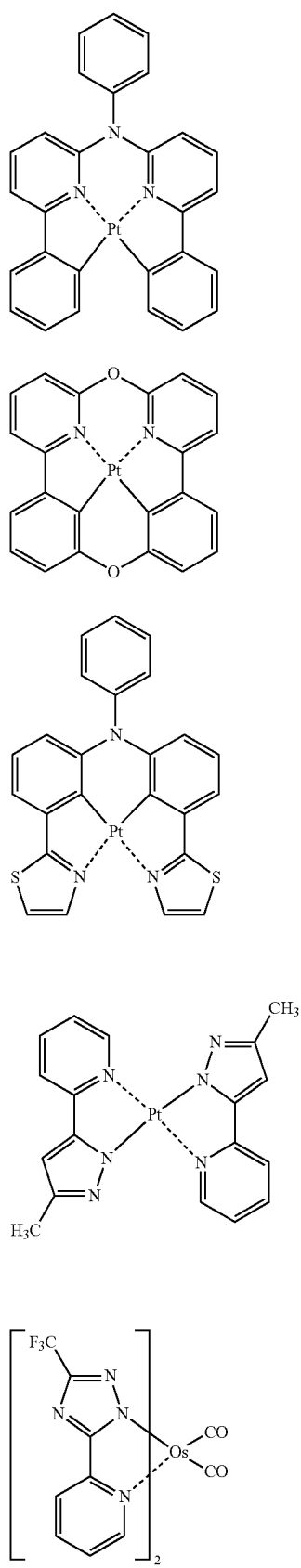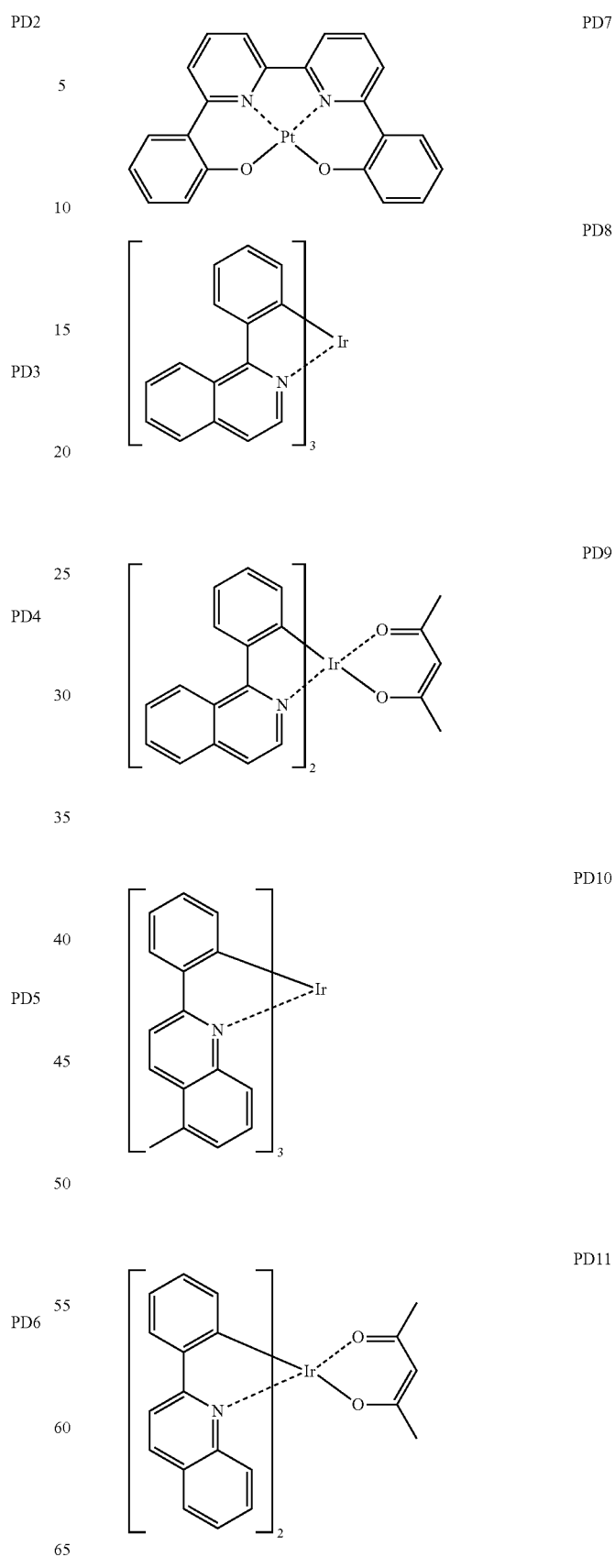

-continued
PD12
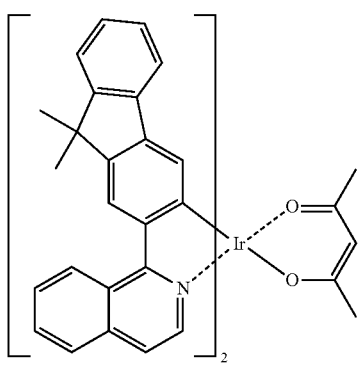
PD13
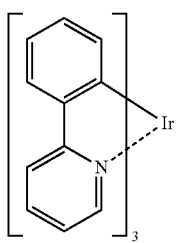
PD14
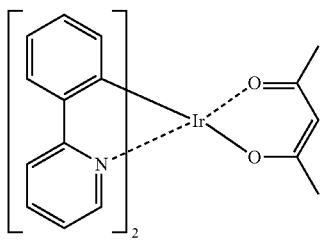
PD15
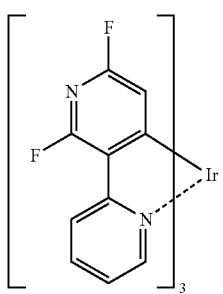
PD16
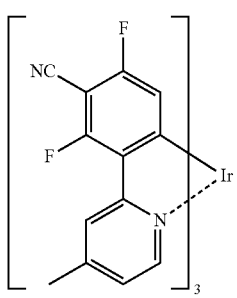
-continued
PD17
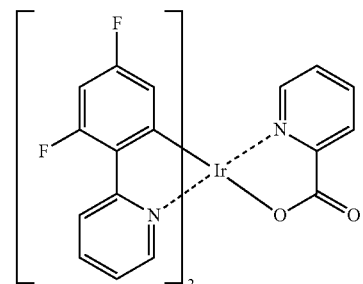
PD18
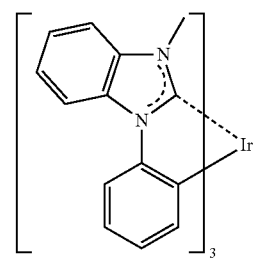
PD19
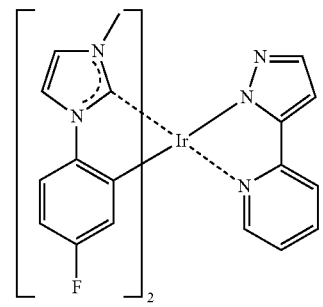
PD20
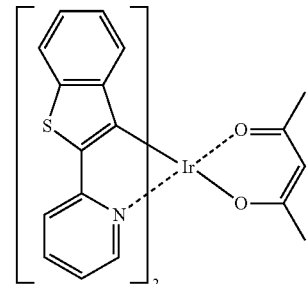
PD21
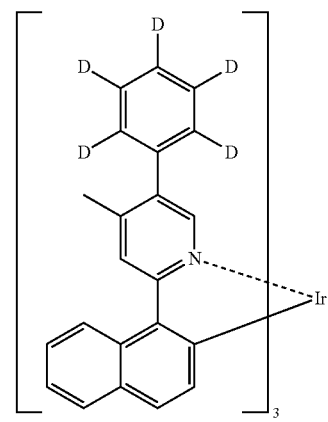

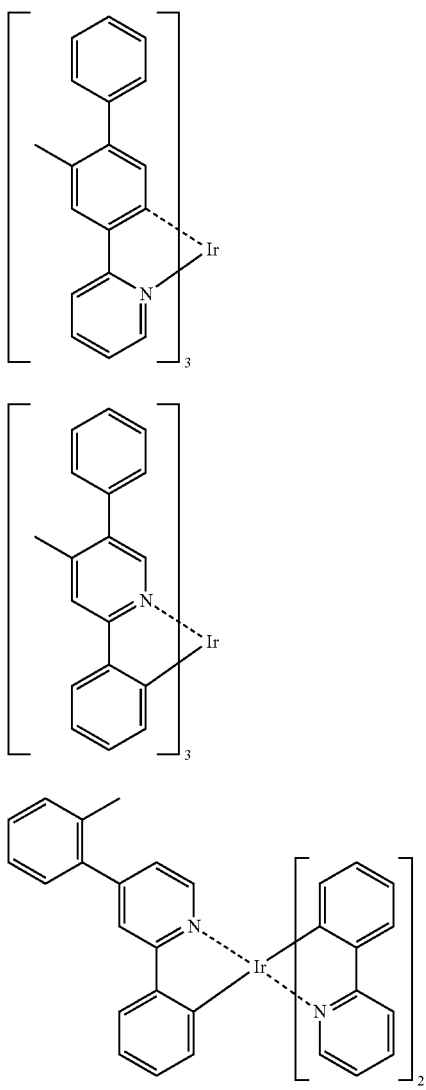

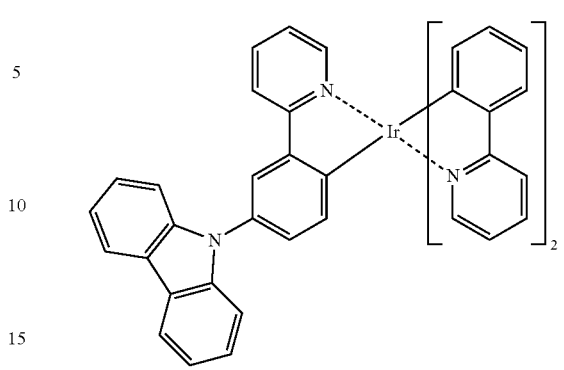

[Fluorescent Dopant]

The fluorescent dopant may include an amine group-containing compound, a styryl group-containing compound, or a combination thereof.

In an embodiment, the fluorescent dopant may include a compound represented by Formula 501:

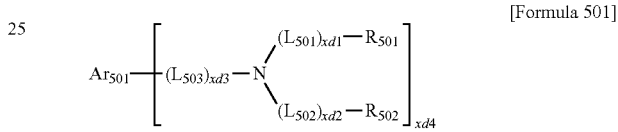

[Formula 501]

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (for example, an anthracene group, a chrysene group, or a pyrene group) in which three or more monocyclic groups are condensed.

In embodiments, xd4 in Formula 501 may be 2.

In embodiments, the fluorescent dopant may include one of Compounds FD1 to FD36; DPVBi; DPAVBi; or a combination thereof:

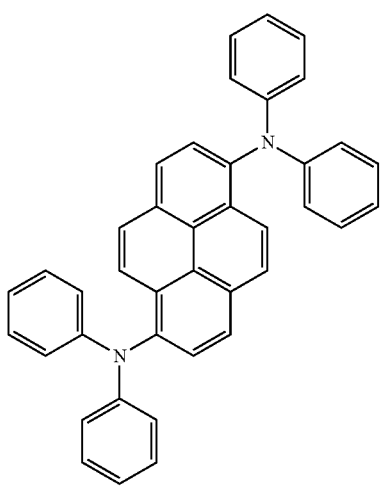

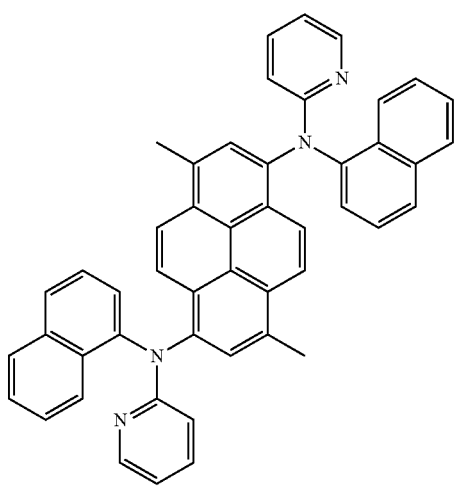

-continued
FD3
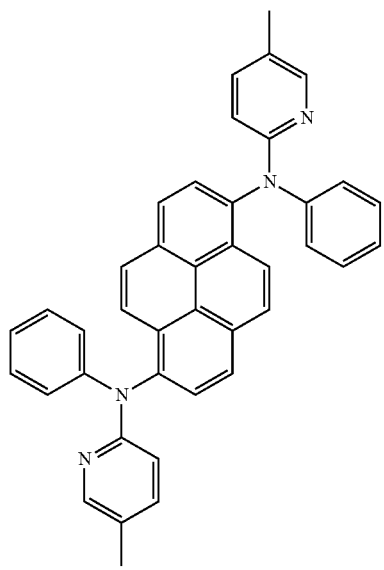
FD4
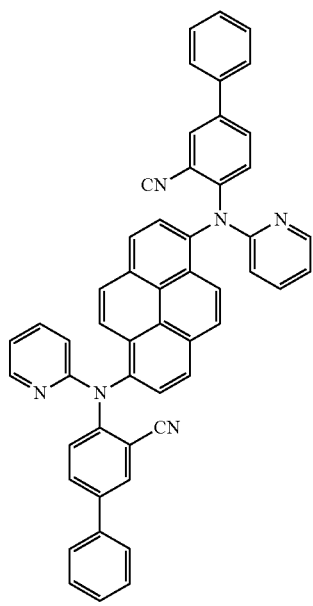
FD5
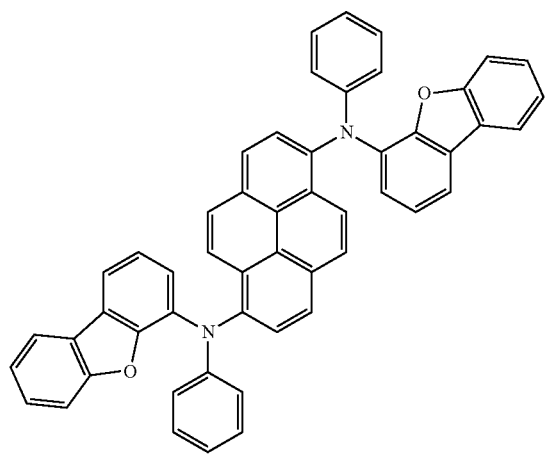
FD6
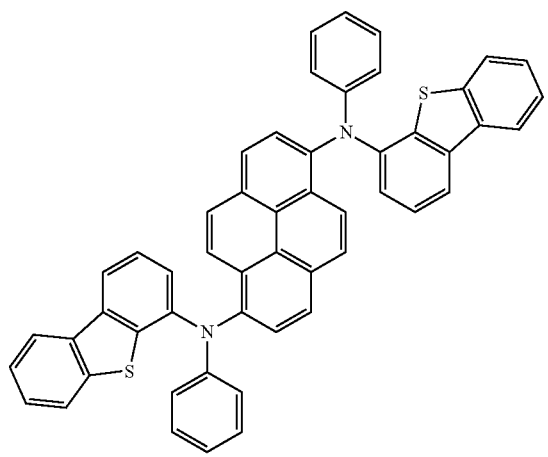
FD7
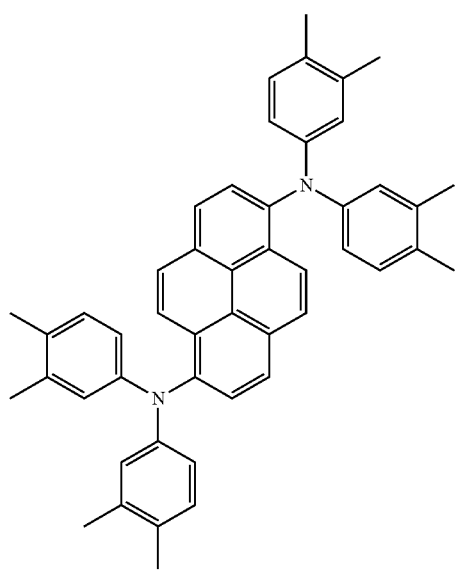
FD8
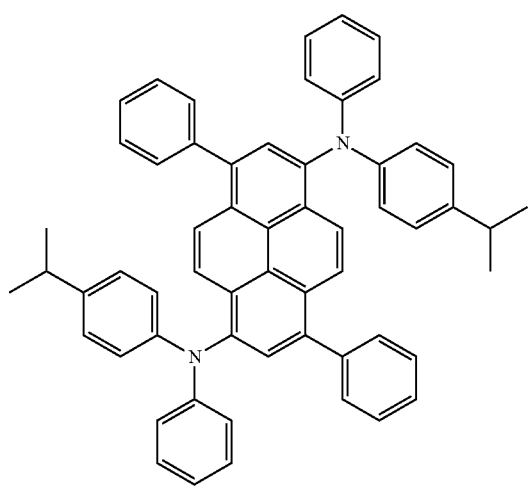

-continued
FD9
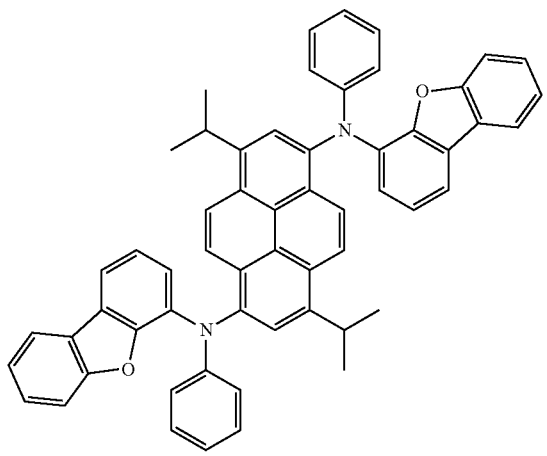
FD10
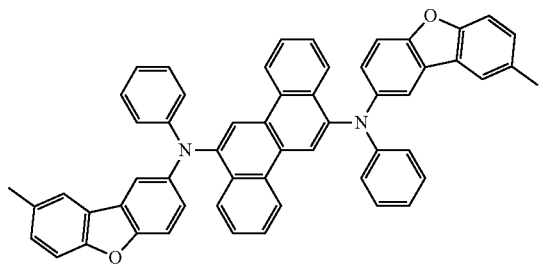
FD11
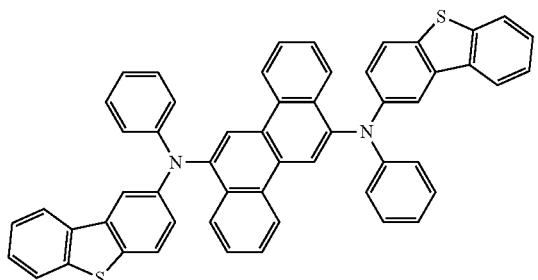
FD12
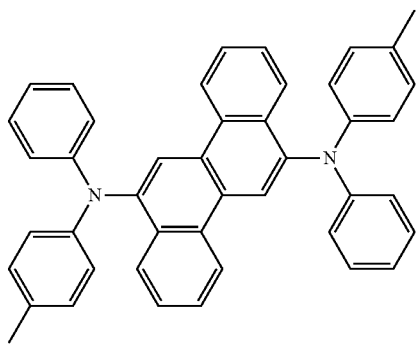
FD13
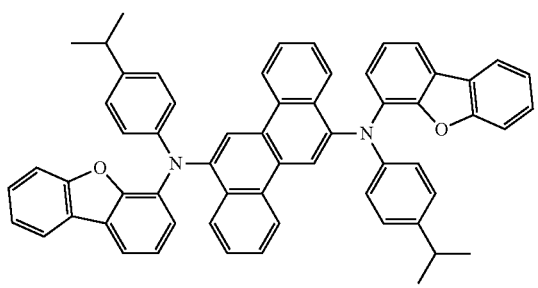
FD14
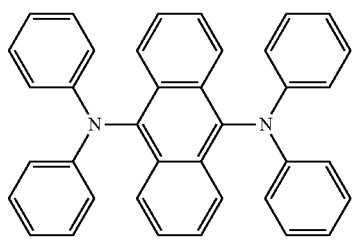
FD15
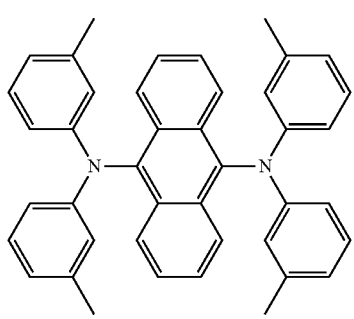
FD16
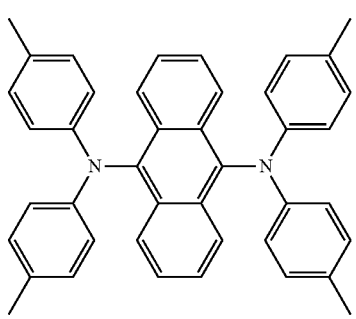

-continued
FD17
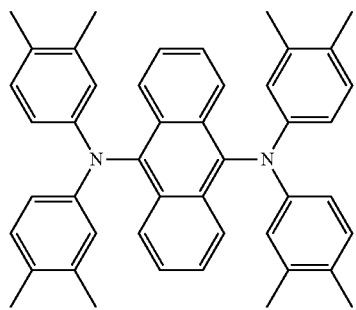
FD18
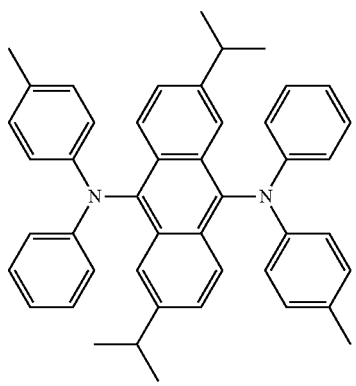
FD19
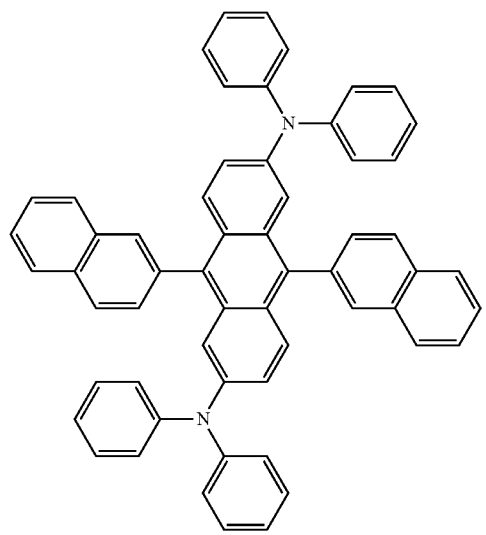
FD20
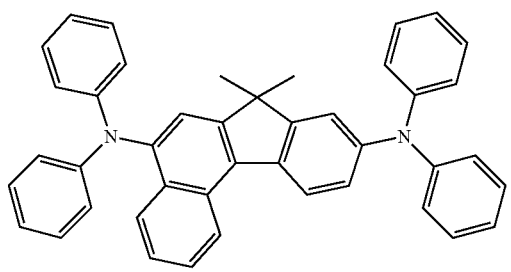
FD21
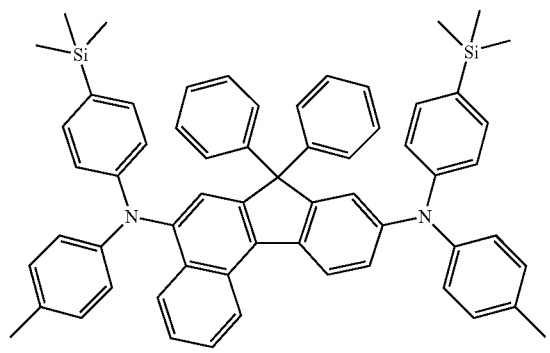
FD22
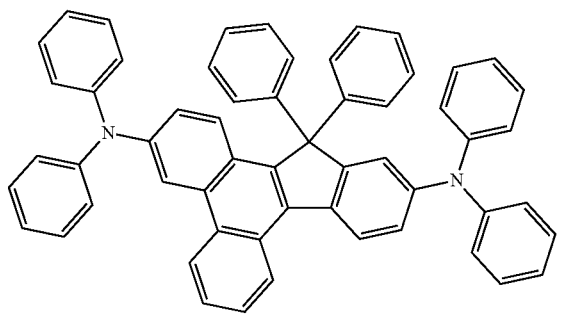
FD23
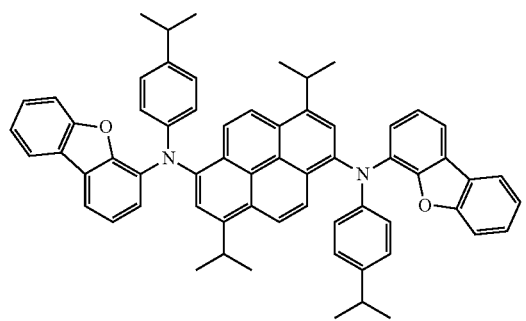
FD24
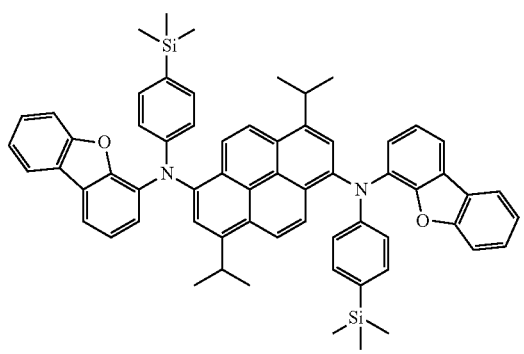

-continued
FD25
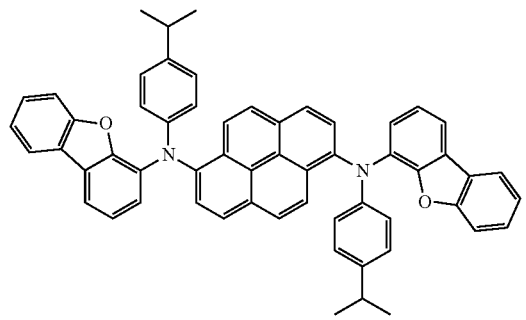
FD26
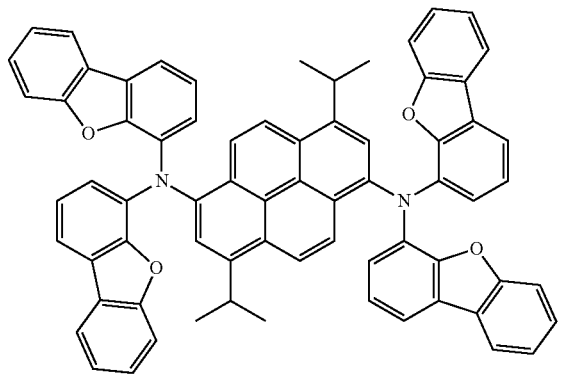
FD27
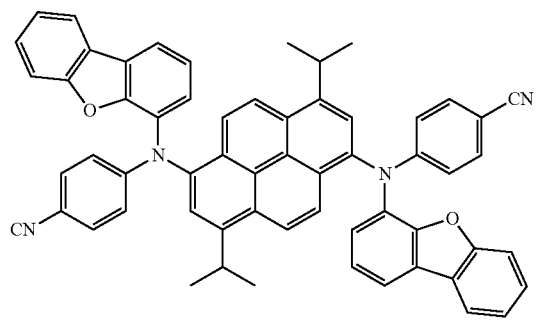
FD28
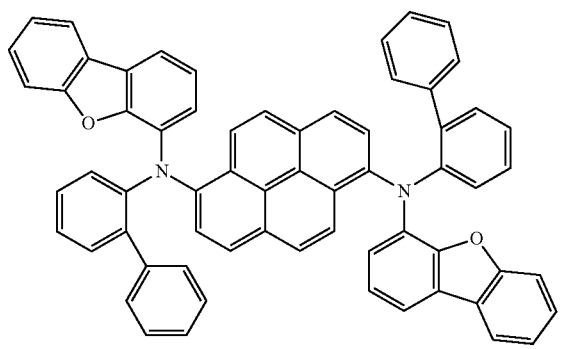
FD29
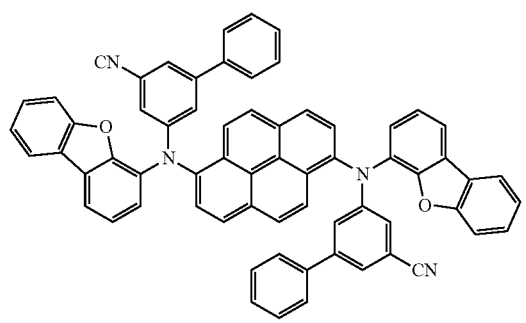
FD30
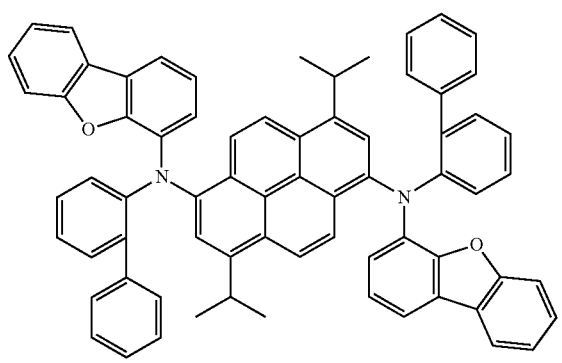
FD31
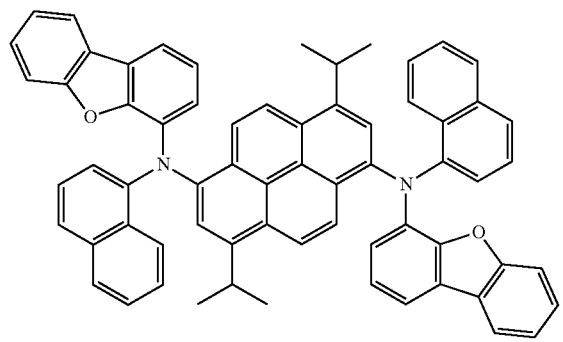
FD32
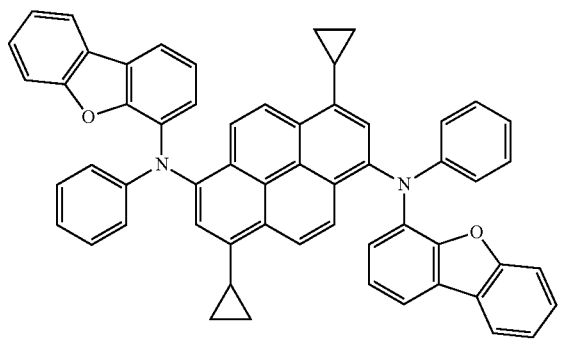

-continued
FD33
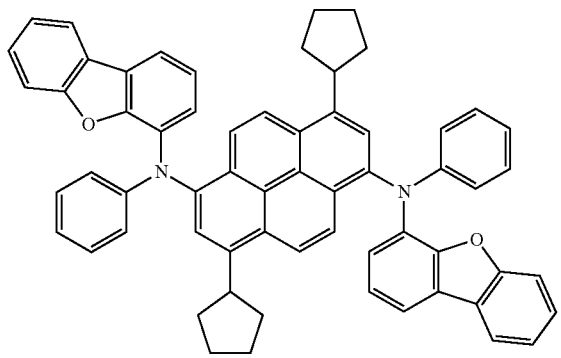
FD34
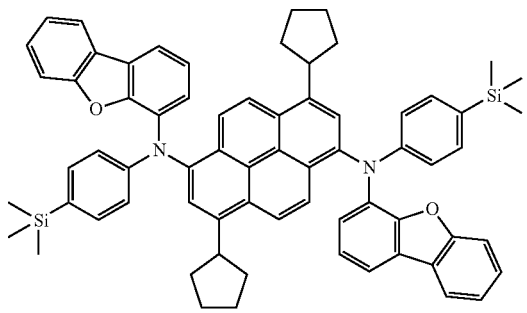
FD35
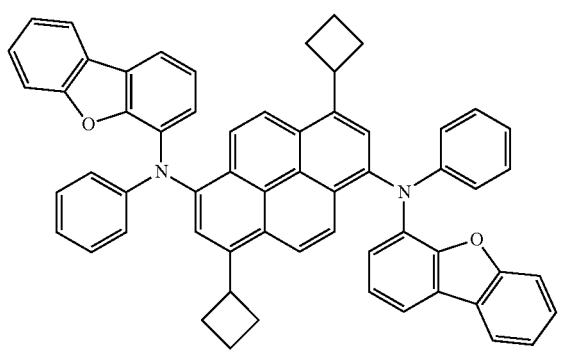
FD36
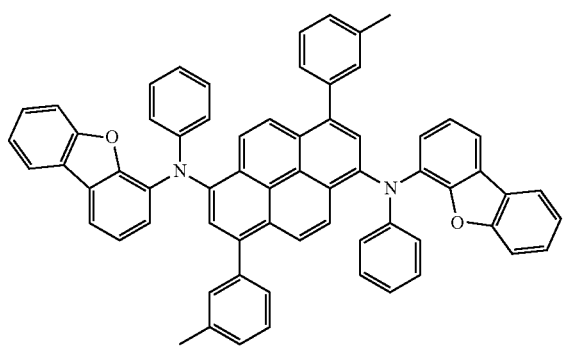
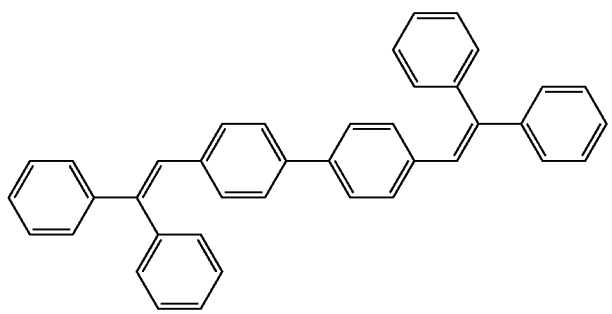
DPVBi
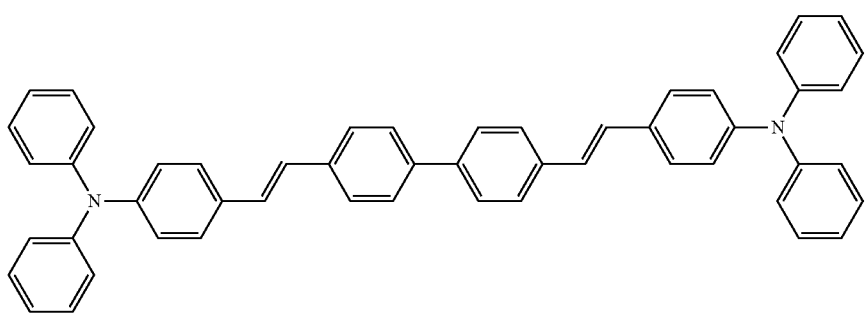
DPAVBi

[Delayed Fluorescence Material]

The emission layer 131 may include a delayed fluorescence material.

The delayed fluorescence material as used herein may be selected from any compound that is capable of emitting delayed fluorescence based on a delayed fluorescence emission mechanism.

The delayed fluorescence material included in the emission layer 131 may act as a host or a dopant depending on the type of other materials included in the emission layer 131.

In an embodiment, a difference between a triplet energy level (eV) of the delayed fluorescence material and a singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

For example, the delayed fluorescence material may include i) a material that includes at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), ii) a material including a $C_8$-$C_{60}$ polycyclic group in which two or more cyclic groups share boron (B) and are condensed with each other.

The delayed fluorescence material may include at least one of Compounds DF1 to DF9:

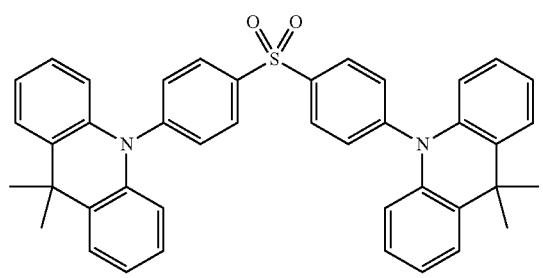

DF1(DMAC-DPS)

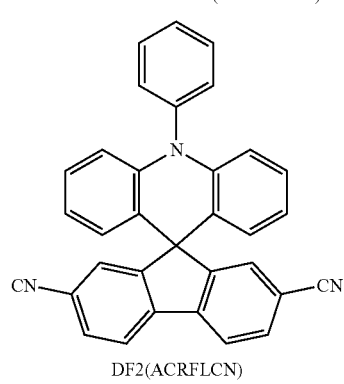

DF2(ACRFLCN)

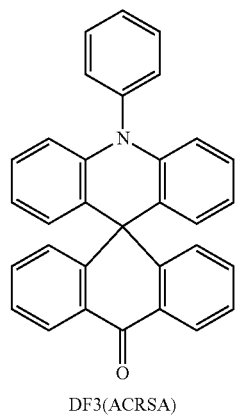

DF3(ACRSA)

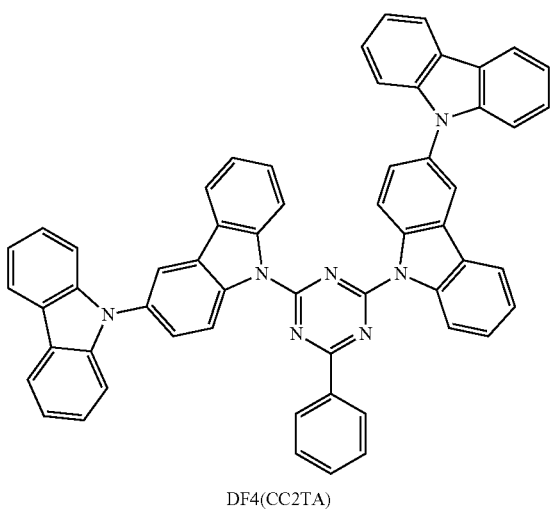

DF4(CC2TA)

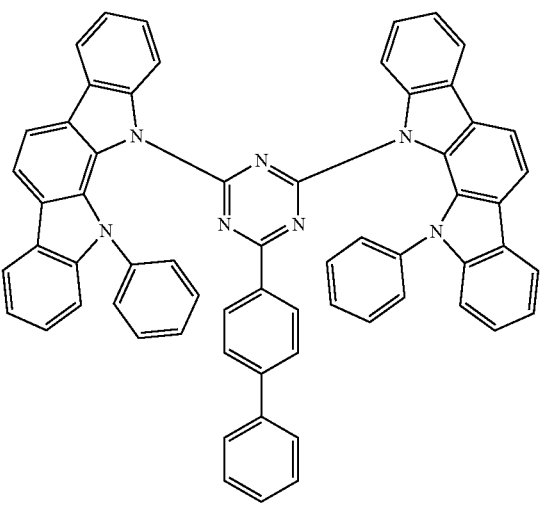

DF5(PIC-TRZ)

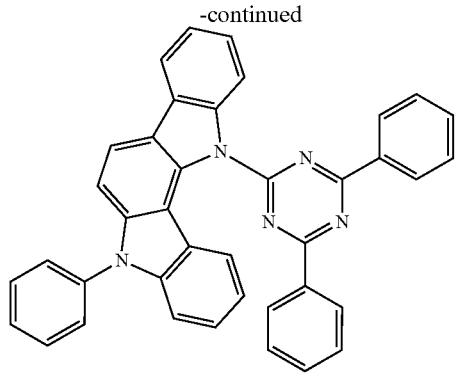

DF6(PIC-TRZ2)

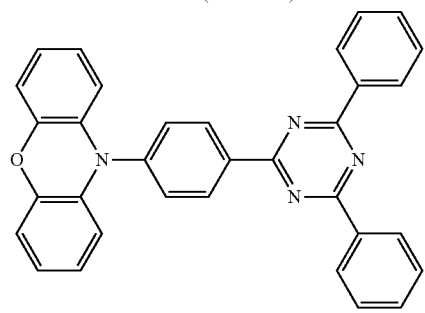

DF7(PXZ-TRZ)

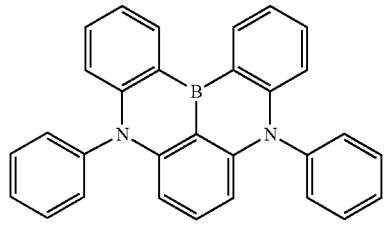

DF8(DABNA-1)

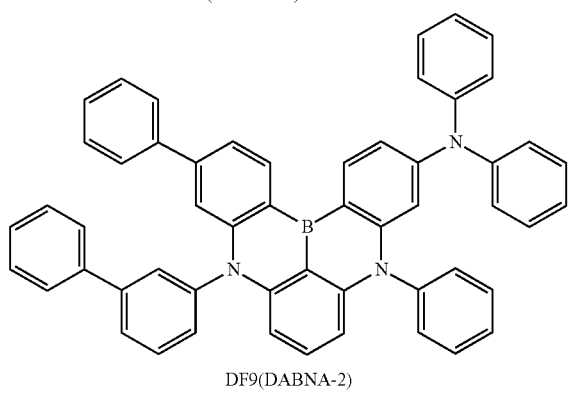

DF9(DABNA-2)

[Quantum Dot]

The emission layer 131 may include a quantum dot.

The quantum dot as used herein refers to the crystal of a semiconductor compound, and may include any material that is capable of emitting light of various emission wavelengths depending on the size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, or a process that is similar to these processes.

The wet chemical process refers to a method in which an organic solvent and a precursor material are mixed, and a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include Groups III-VI semiconductor compound, Groups II-VI semiconductor compound, Groups III-V semiconductor compound, Groups III-VI semiconductor compound, Group I-III-VI semiconductor compound, Groups IV-VI semiconductor compound, Group IV element or compound, or a combination thereof.

Examples of the Groups III-VI semiconductor compound are a binary compound, such as GaS, GaSe, $Ga_2Se_3$, GaTe, InS, InSe, $In_2Se_3$, or InTe; a ternary compound, such as AgInS, $AgInS_2$, CuInS, $CuInS_2$, $InGaS_3$, $InGaSe_3$; or a combination thereof.

Examples of the Groups II-VI semiconductor compound are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or a combination thereof.

Examples of the Groups III-V semiconductor compound are a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or a combination thereof. The Groups III-V semiconductor compound may further include a Group II element. Examples of the Groups III-V semiconductor compound further including a Group II element are InZnP, InGaZnP, and InAlZnP.

Examples of the Group I-III-VI semiconductor compound are a ternary compound, such as AgInS, $AgInS_2$, CuInS, $CuInS_2$, $CuGaO_2$, $AgGaO_2$, or $AgAlO_2$; or a combination thereof.

Examples of the Group IV-VI semiconductor compound are a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or a combination thereof.

In an embodiment, the Group IV element or compound may include a single element compound, such as Si or Ge; a binary compound, such as SiC or SiGe; or a combination thereof.

Each element included in the multi-element compound such as the binary compound, a ternary compound, and a quaternary compound may be present in a particle at a uniform concentration or a non-uniform concentration.

The quantum dot may have a single structure having a uniform concentration of each element included in the corresponding quantum dot or a dual structure of a core-shell. For example, the material included in the core may be different from the material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot are a metal or non-metal oxide, a semiconductor compound, or a combination thereof. Examples of the oxide of metal or non-metal are a binary compound, such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, or $NiO$; a ternary compound, such as $MgAl_2O_4$, $CoFe_2O_4$, $NiFe_2O_4$, or $CoMn_2O_4$; or a combination thereof. Examples of the semiconductor compound are, as described herein, Groups III-VI semiconductor compounds, Groups II-VI semiconductor compounds, Groups III-V semiconductor compounds, Groups III-VI semiconductor compounds, Groups I-III-VI semiconductor compounds, Groups IV-VI semiconductor compounds, or a combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or a combination thereof.

A full width at half maximum (FWHM) of an emission wavelength spectrum of the quantum dot may be about 45 nm or less. For example, the FWHM of an emission wavelength spectrum of the quantum dot may be about 40 nm or less. For example, the FWHM of an emission wavelength spectrum of the quantum dot may be about 30 nm or less. When the FWHM of the emission wavelength spectrum of the quantum dot is within this range, color purity or color reproduction may be improved. Light emitted through such quantum dots may be irradiated omnidirectionally. Accordingly, a wide viewing angle may be increased.

The quantum dot may be a spherical, a pyramidal, a multi-arm, or a cubic nanoparticle, a nanotube, a nanowire, a nanofiber, or a nanoplate particle.

By adjusting the size of the quantum dot, the energy band gap may also be adjusted, thereby obtaining light of various wavelengths in the quantum dot emission layer. Therefore, by using quantum dots of different sizes, a light-emitting device that emits light of various wavelengths may be implemented. In an embodiment, the size of the quantum dot may be selected to emit red, green, and/or blue light. The size of the quantum dot may be adjusted such that light of various colors are combined to emit white light.

[Electron Transport Region 140 in Interlayer 130]

The electron transport region 140 may have: i) a single-layered structure consisting of a single layer consisting of a single material, ii) a single-layered structure consisting of a single layer consisting of different materials, or iii) a multi-layered structure including layers including different materials.

The electron transport region 140 may include a buffer layer, a hole blocking layer, an electron control layer, an electron transport layer, an electron injection layer, or a combination thereof.

For example, the electron transport region 140 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, in each structure, layers are sequentially stacked on the emission layer 131.

In an embodiment, the electron transport region 140 may include a hole blocking layer, an electron transport layer, and an electron injection layer that are sequentially disposed on the emission layer 131.

The electron transport region 140 (for example, the buffer layer, the hole blocking layer, the electron control layer, or the electron transport layer in the electron transport region 140) may include a metal-free compound including at least one π electron-deficient nitrogen-containing $C_1$-$C_{60}$ cyclic group.

In an embodiment, the electron transport region 140 may include a compound represented by Formula 601:

$$[Ar_{601}]_{xe11}-[(L_{601})_{xe1}-R_{601}]_{xe21} \quad \text{[Formula 601]}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be the same as described in connection with $Q_1$, xe21 may be 1, 2, 3, 4, or 5, and at least one of $Ar_{601}$, $L_{601}$, and $R_{601}$ may each independently be a u electron-deficient nitrogen-containing $C_1$-$C_{60}$ cyclic group unsubstituted or substituted with at least one $R_{10a}$.

For example, when xe11 in Formula 601 is 2 or more, two or more $Ar_{601}$(s) may be linked to each other via a single bond.

In embodiments, $Ar_{601}$ in Formula 601 may be a substituted or unsubstituted anthracene group.

In an embodiment, the electron transport region 140 may include a compound represented by Formula 601-1:

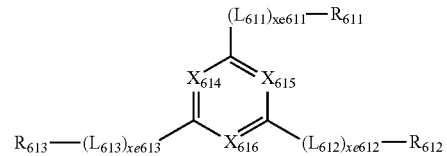

[Formula 601-1]

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region 140 may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or a combination thereof:

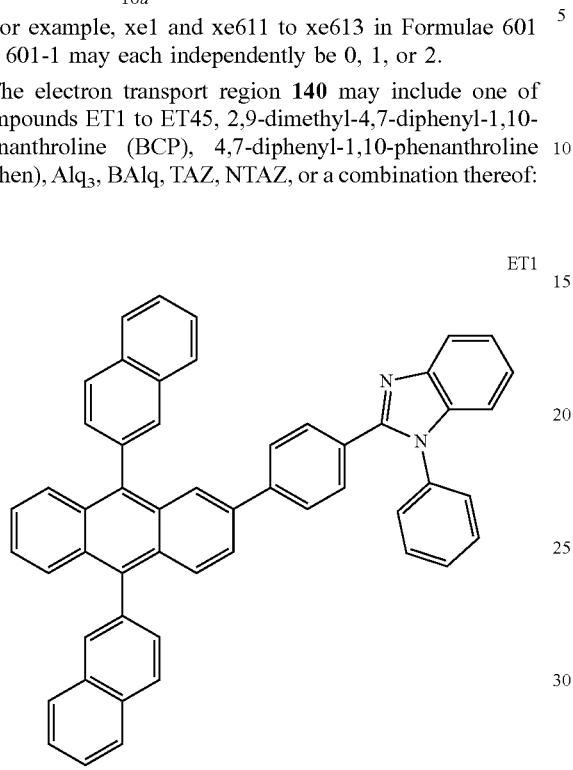

ET1

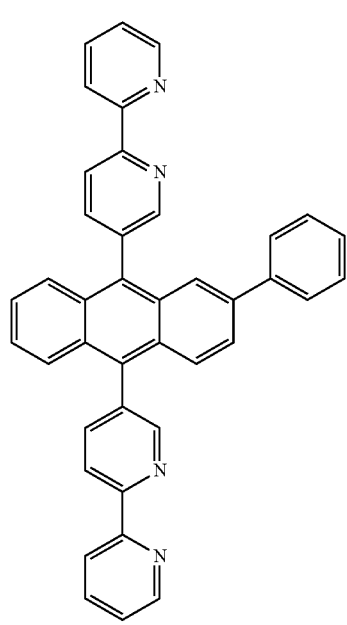

ET2

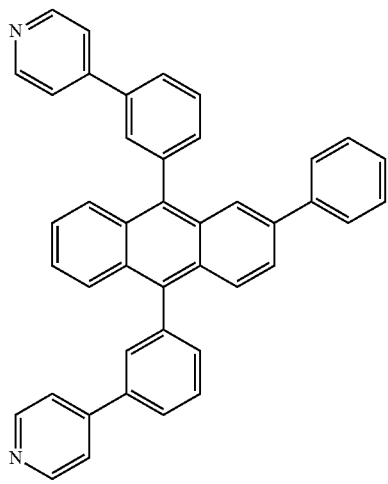

ET3

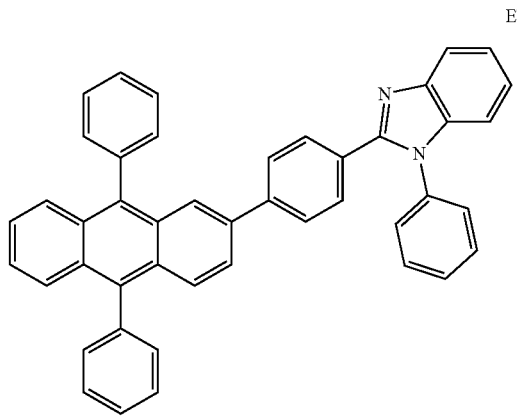

ET4

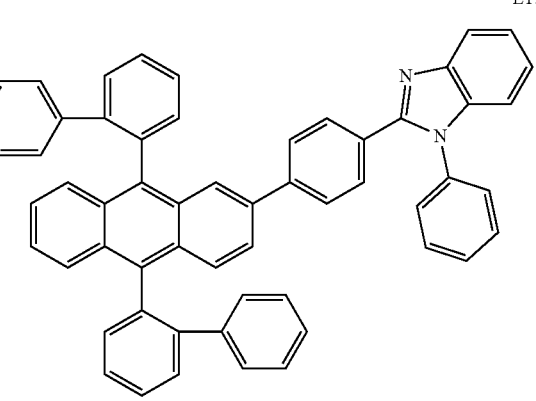

ET5

ET6
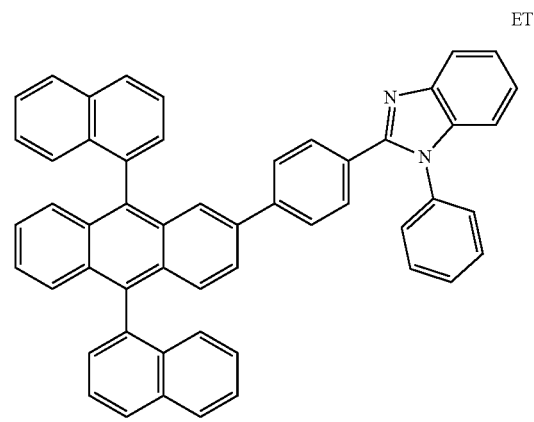
ET7
ET9
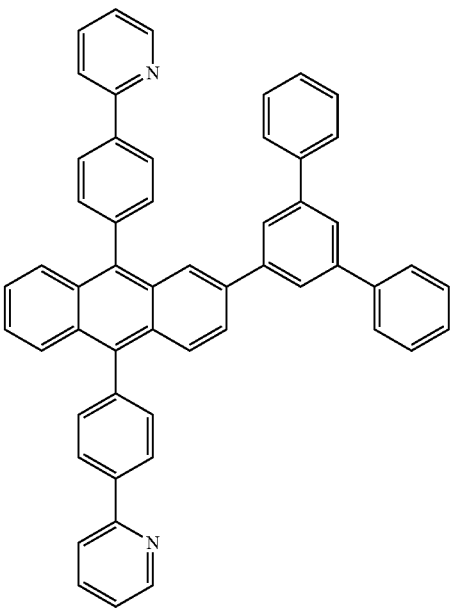
ET8
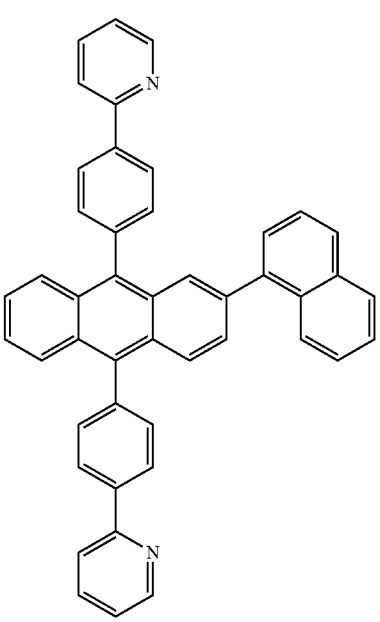
ET10

ET11
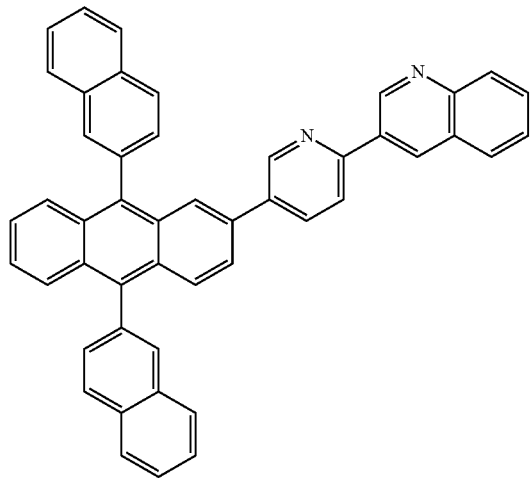
ET12
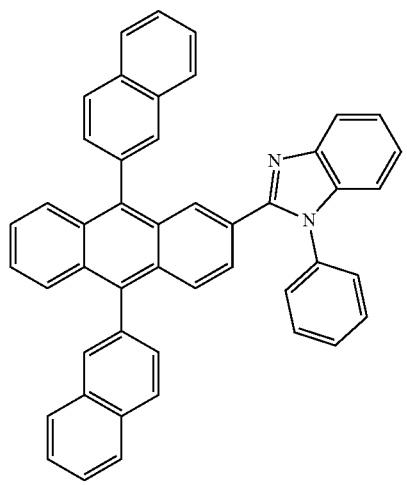
ET13
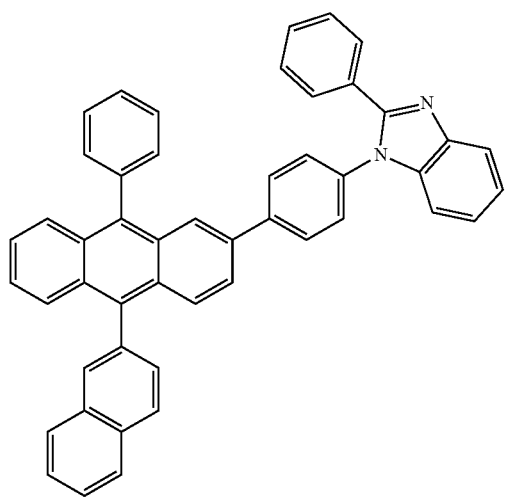
ET14
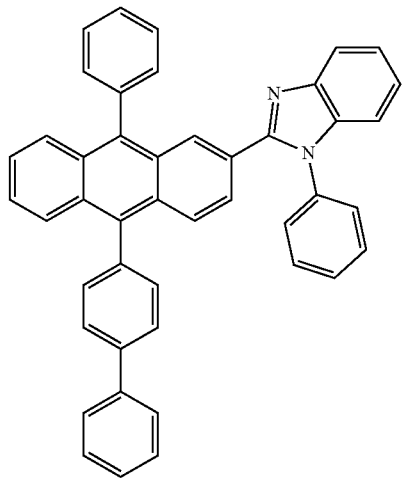
ET15
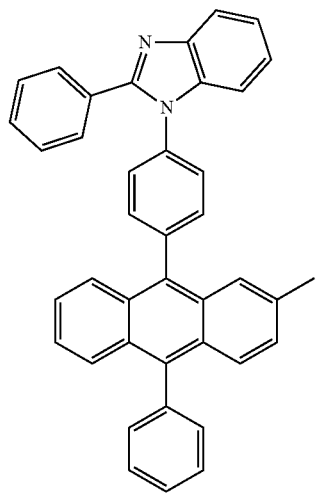
ET16
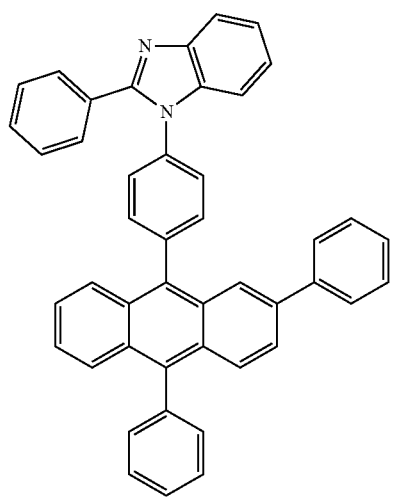

-continued
ET17
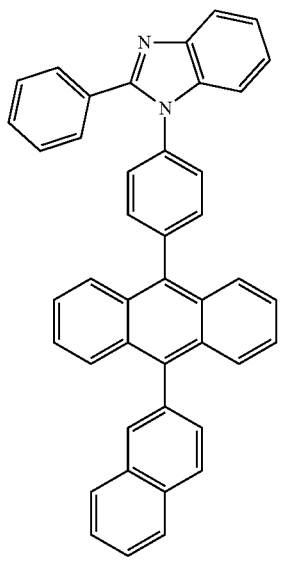
ET18
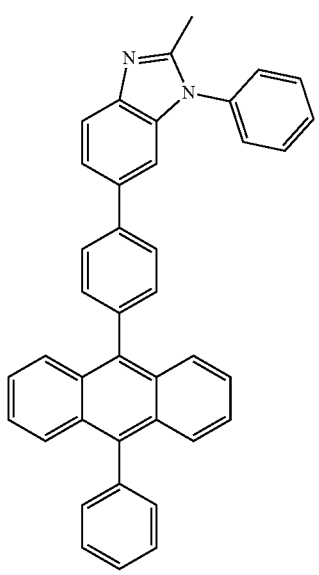
ET19
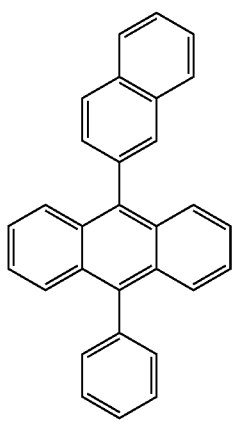
-continued
ET20
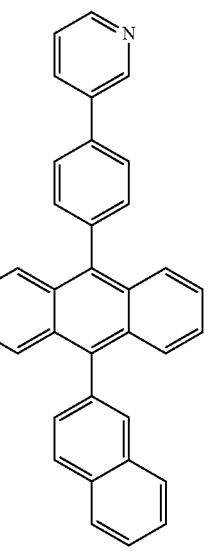
ET21
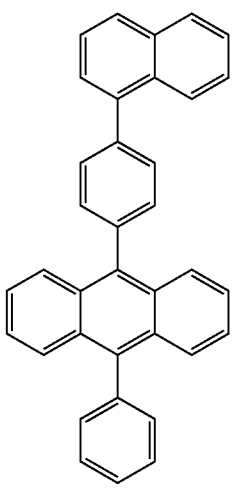
ET22
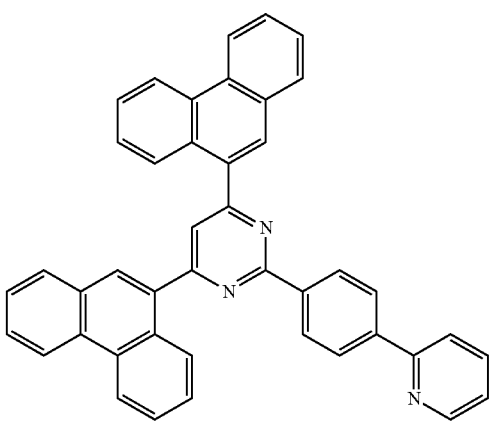

ET23
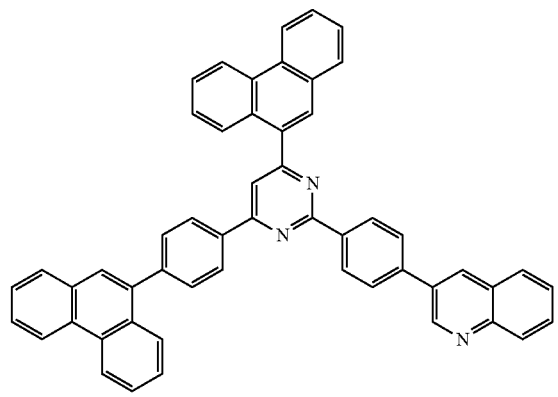
ET24
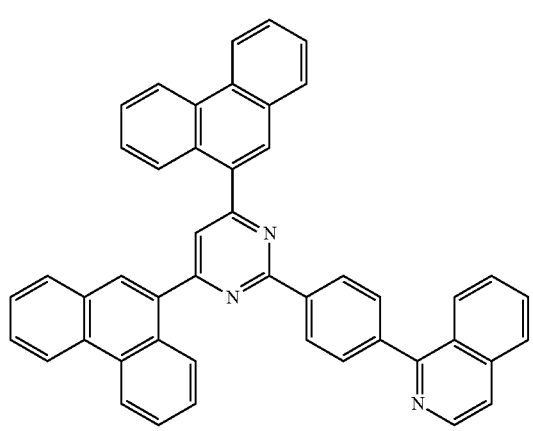
ET25
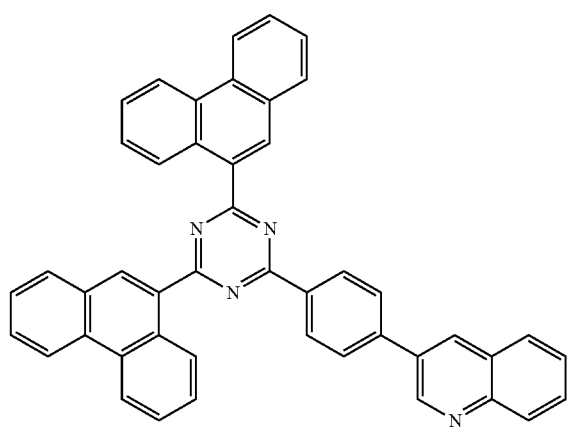
ET26
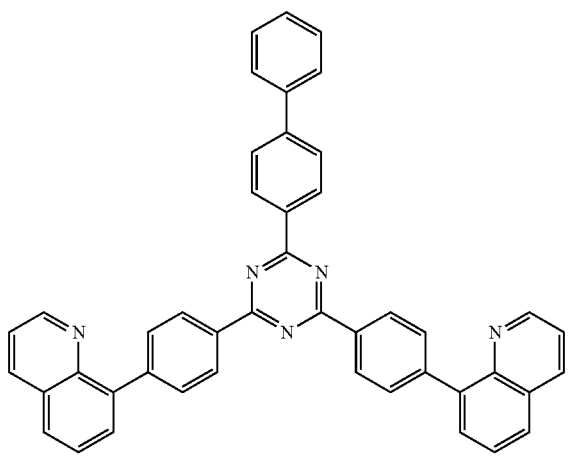
ET27
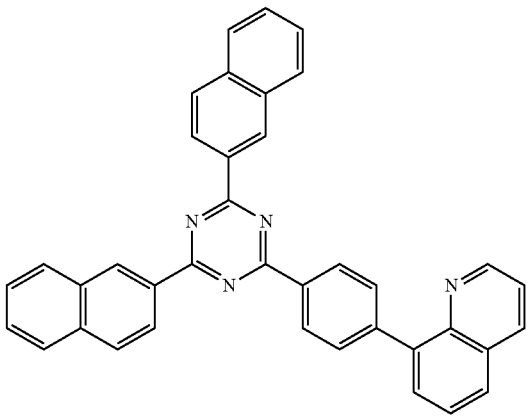
ET28
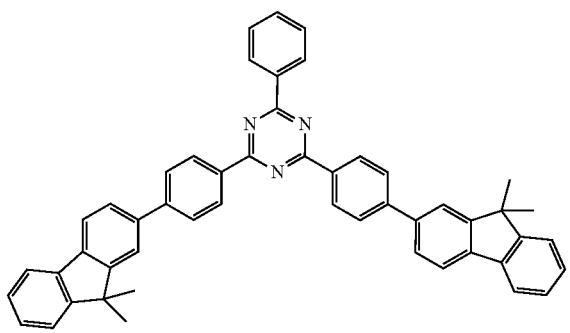

ET29
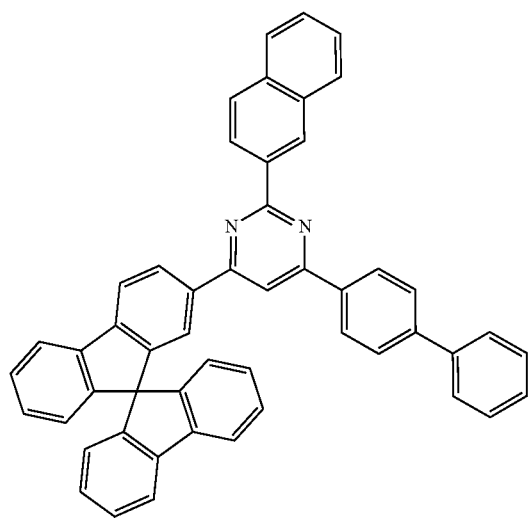
ET32
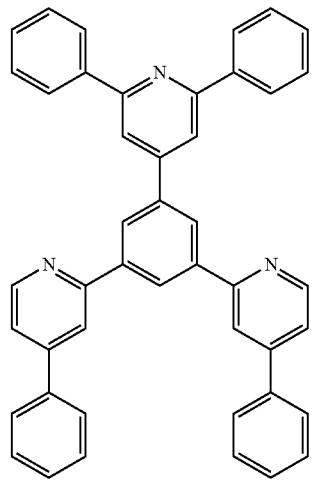
ET30
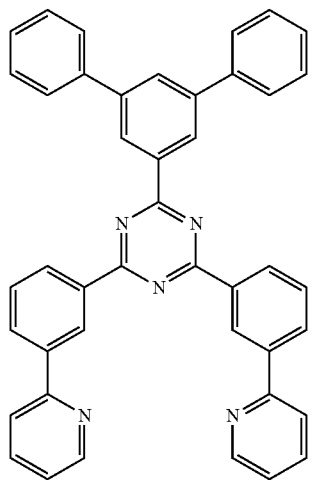
ET33
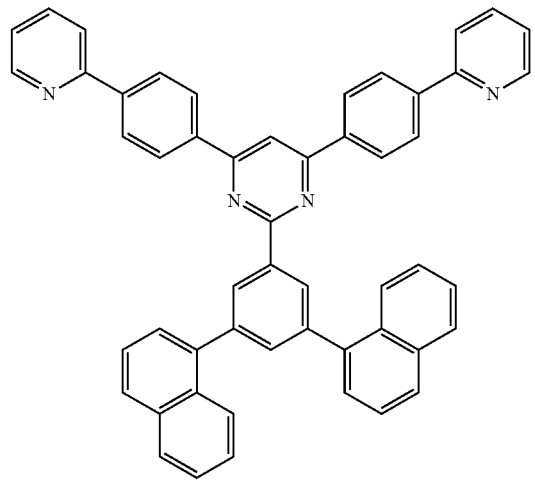
ET31
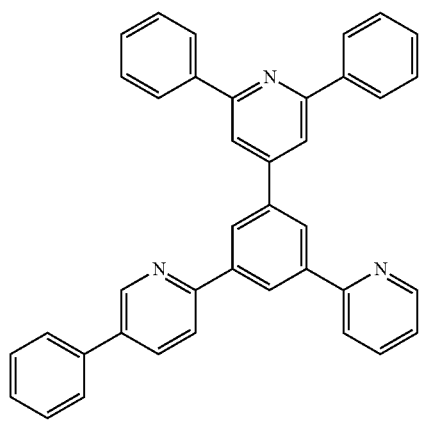
ET34
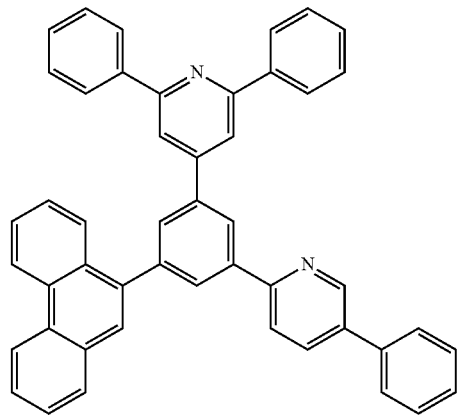

ET35
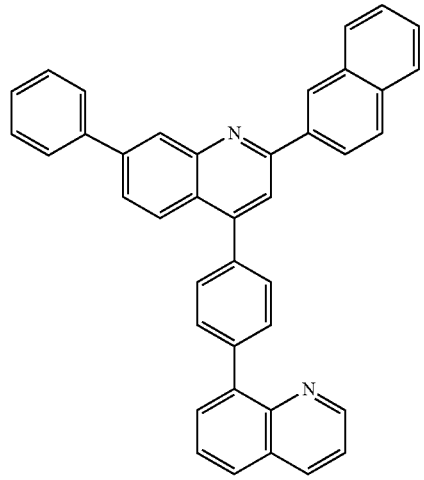
ET36
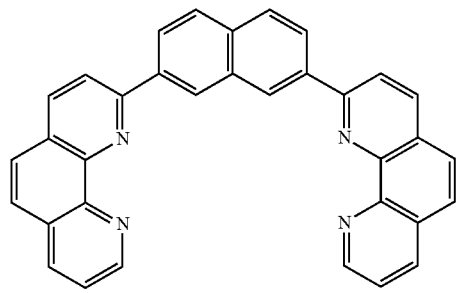
ET37
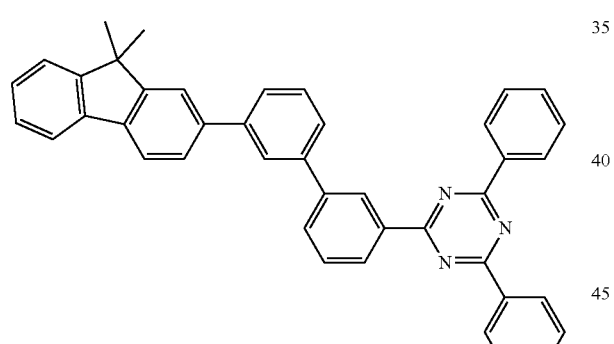
ET38
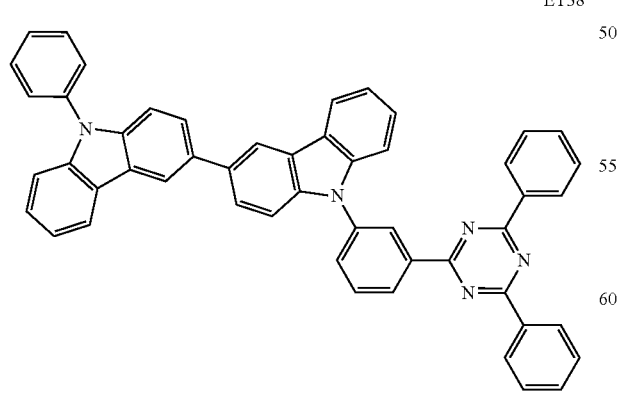
ET39
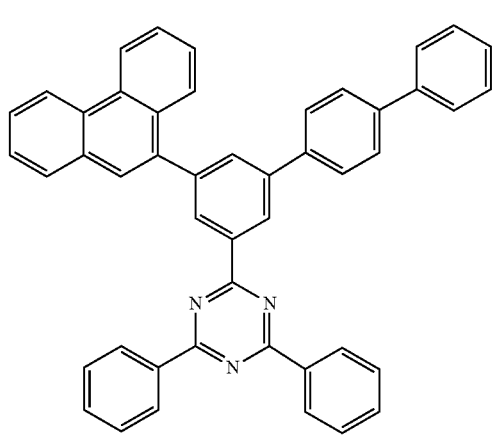
ET40
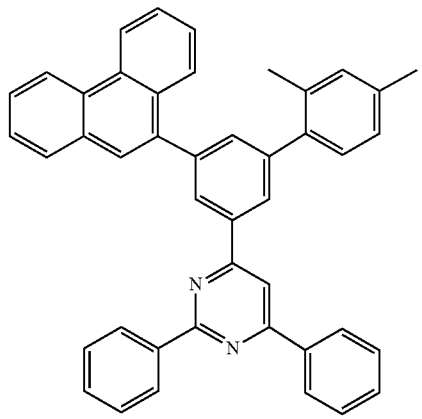
ET41
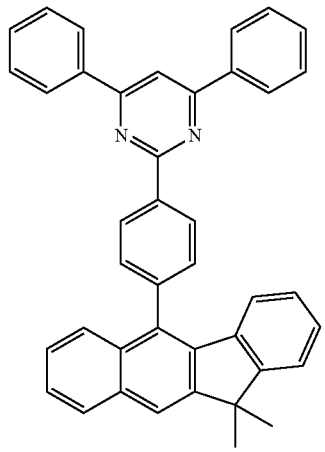

-continued

ET42

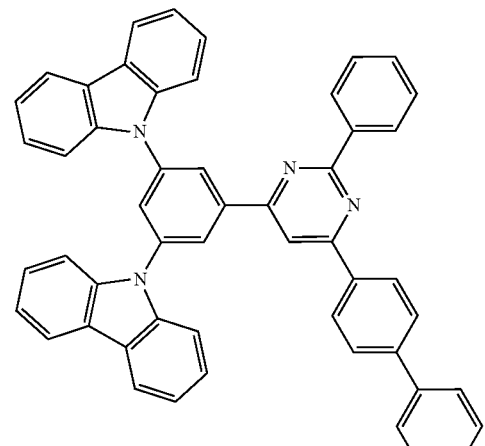

ET43

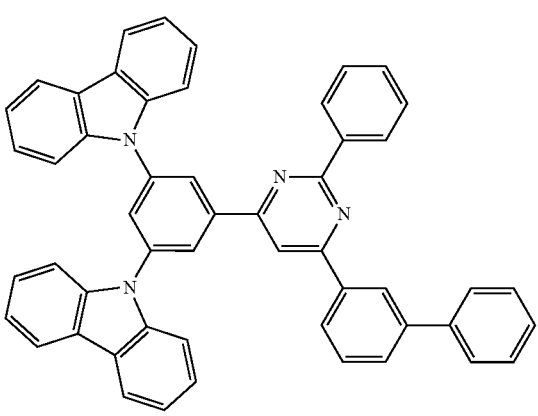

ET44

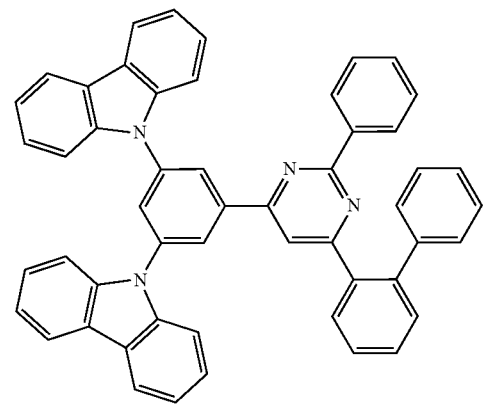

ET45

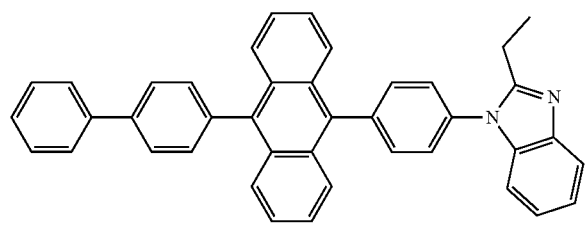

-continued

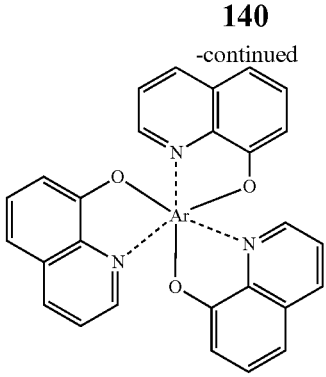

Alq₃

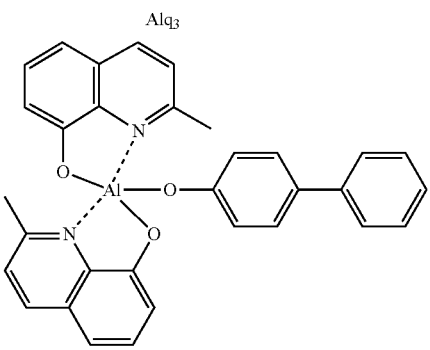

BAlq

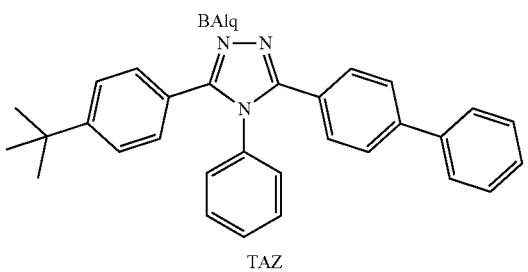

TAZ

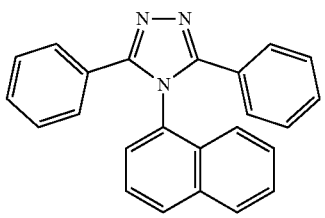

NTAZ

A thickness of the electron transport region 140 may be in a range of about 160 Å to about 5,000 Å. For example, the thickness of the electron transport region 140 may be in a range of about 100 Å to about 4,000 Å. When the electron transport region 140 includes a buffer layer, a hole blocking layer, an electron control layer, an electron transport layer, or a combination thereof, a thickness of the buffer layer, the hole blocking layer, or the electron control layer may each be in a range of about 20 Å to about 1000 Å, and a thickness of the electron transport layer may be in a range of about 100 Å to about 1,000 Å. For example, the thickness of the buffer layer, the hole blocking layer, or the electron control layer may each be in a range of about 30 Å to about 300 Å. For example, the thickness of the electron transport layer may be in a range of about 150 Å to about 500 Å. When the thickness of the buffer layer, the hole blocking layer, the electron control layer, the electron transport layer, and/or the electron transport layer are within these ranges, satisfactory hole transporting characteristics may be obtained without a substantial increase in driving voltage.

The electron transport region 140 (for example, the electron transport layer in the electron transport region 140) may further include, in addition to the materials described above, a metal-containing material.

The metal-containing material may include an alkali metal complex, an alkaline earth-metal complex, or a combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or a combination thereof.

For example, the metal-containing material may include a Li complex. The Li complex may include, for example, Compound ET-D1 (LiQ) or ET-D2:

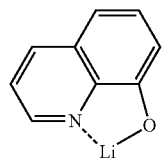

ET-D1

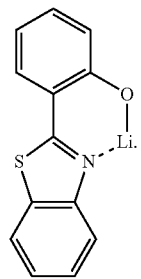

ET-D2

The electron transport region 140 may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of different materials, or iii) a multi-layered structure including layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof.

The alkali metal may include Li, Na, K, Rb, Cs, or a combination thereof. The alkaline earth metal may include Mg, Ca, Sr, Ba, or a combination thereof. The rare earth metal may include Sc, Y, Ce, Tb, Yb, Gd, or a combination thereof.

The alkali metal-containing compound, the alkaline earth metal-containing compound, and the rare earth metal-containing compound may be oxides and halides (for example, fluorides, chlorides, bromides, or iodides) of the alkali metal, the alkaline earth metal, and the rare earth metal, telluride, or a combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or a combination thereof. The alkaline earth metal-containing compound may include an alkaline earth metal compound, such as BaO, SrO, CaO, $Ba_xSr_{1-x}O$ (x is a real number that satisfies the condition of 0<x<1), or $Ba_xCa_{1-x}O$ (x is a real number that satisfies the condition of 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or a combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand linked to the metal ion, for example, hydroxyquinoline, hydroxyan isoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenyl benzimidazole, hydroxyphenylbenzothiazole, bipyridine, phenanthroline, cyclopentadiene, or a combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof, or may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) alkali metal, alkaline earth metal, rare earth metal, or a combination thereof. In an embodiment, the electron injection layer may be a KI:Yb co-deposited layer or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or a combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 150]

The second electrode 150 may be disposed on the interlayer 130 having such a structure. The second electrode 150 may be a cathode, which is an electron injection electrode, and as the material for the second electrode 150, a metal, an alloy, an electrically conductive compound, or a combination thereof, each having a low work function, may be used.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be disposed outside the first electrode 110, and/or a second capping layer may be disposed outside the second electrode 150. The light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer 131 of the interlayer 130 of the light-emitting device 10 may be emitted toward the outside through the first electrode 110, which is a semi-transmissive electrode or a transmissive electrode, and the first capping layer, and light generated in the emission layer 131 of the interlayer 130 of the light-emitting device 10 may be emitted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of equal to or greater than about 1.6 (at 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or a combination thereof.

In an embodiment, at least one of the first capping layer and the second capping layer may each independently include an amine group-containing compound.

In embodiments, at least one of the first capping layer and second capping layer may each independently include a compound represented by Formula 201, a compound represented by Formula 202, or a combination thereof.

In embodiments, at least one of the first capping layer and the second capping layer may each independently include one of Compounds HT28 to HT33, one of Compounds CP1 to CP6, β-NPB, or a combination thereof:

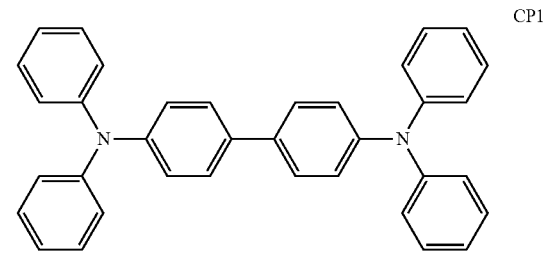

CP1

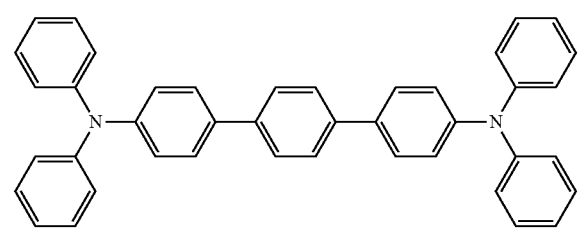

CP2

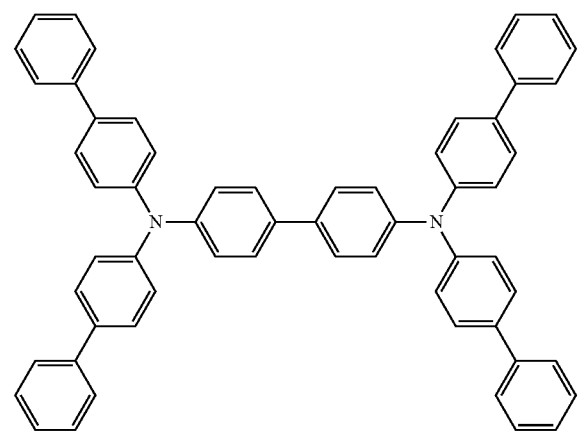

CP3

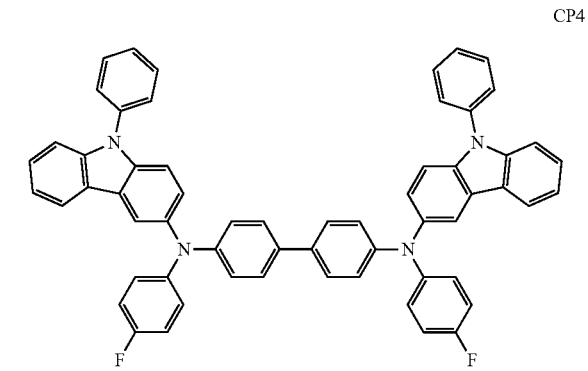

CP4

-continued

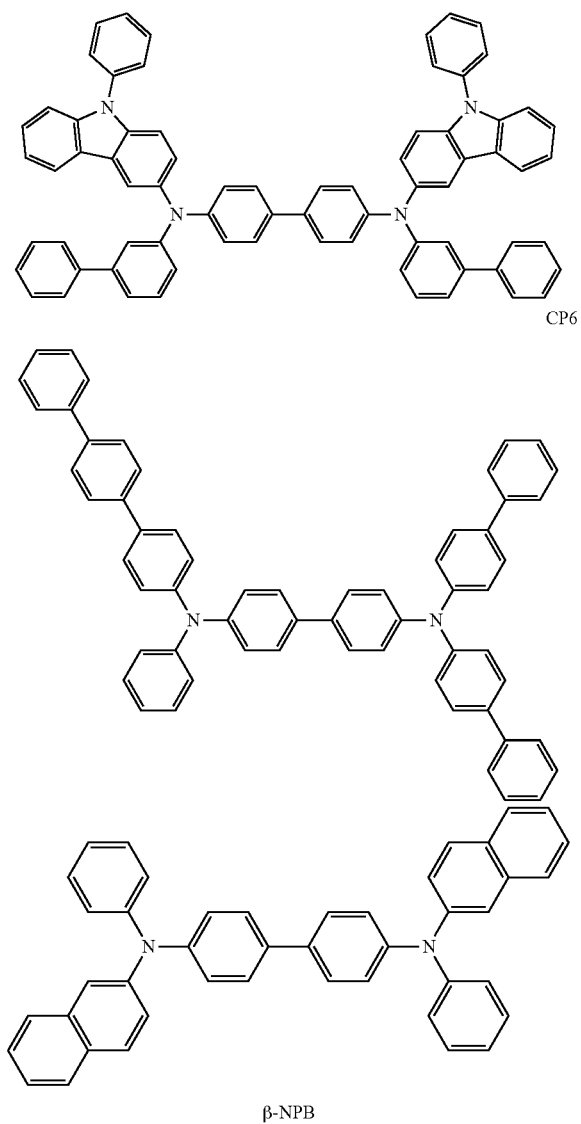

β-NPB

[Preparation Method]

Layers constituting the hole transport region 120, the emission layer 131, and layers constituting the electron transport region 140 may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region 120, the emission layer 131, and layers constituting the electron transport region 140 are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Another aspect of the disclosure provides a method of manufacturing the light-emitting device.

The method of manufacturing the light-emitting device may include: forming a hole injection layer on a first electrode, the hole injection layer including a first compound; forming a hole transport layer on the hole injection layer, the hole transport layer including a second compound having a glass transition temperature higher than the glass transition temperature of the first compound; forming an emission layer on the hole transport layer; forming a second electrode on the emission layer to form a light-emitting device; and performing heat treatment on the light-emitting device.

In an embodiment, the performing of the heat treatment on the light-emitting device may be performed at a temperature lower than the glass transition temperature of the second compound.

In an embodiment, before the forming of the emission layer, the method may further include forming an emission auxiliary layer, an electron blocking layer, or a combination thereof on the hole transport layer.

In an embodiment, before the forming of the second electrode, the method may further include forming an electron transport region on the emission layer. For example, the forming of the electron transport region may include forming an electron transport layer and an electron injection layer.

[Electronic Apparatus]

Another aspect of the disclosure provides an electronic apparatus including the light-emitting device.

For example, the electronic apparatus including the light-emitting device may be a light-emitting apparatus, an authentication apparatus, or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be disposed in at least one traveling direction of light emitted from the light-emitting device. For example, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be disposed between the subpixels to define each of the subpixels.

The color filter may further include the color filter areas and a light-blocking pattern disposed between adjacent color filter areas of the color filter areas, and the color conversion layer may further include the color conversion areas and a light-blocking pattern disposed between adjacent color conversion areas of the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. For example, the first color light may be red light, the second color light may be green light, and the third color light may be blue light. For example, the color filter areas (or the color conversion areas) may include quantum dots. In detail, the first area may include red quantum dots, the second area may include green quantum dots, and the third area may not include quantum dots. The quantum dot may be the same as described in the specification. Each of the first area, the second area, and/or the third area may further include a scattering body.

For example, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulation layer, or the like.

The active layer may include crystalline silicon, amorphous silicon, organic semiconductor, oxide semiconductor, or the like.

The electronic apparatus may further include a sealing part for sealing the light-emitting device. The sealing part may be disposed between the color filter and/or the color conversion layer and the light-emitting device. The sealing part allows light from the light-emitting device 10 to be extracted to the outside, while simultaneously preventing ambient air and moisture from penetrating into the light-emitting device 10. The sealing part may be a sealing substrate including a transparent glass substrate or a plastic substrate. The sealing part may be a thin film encapsulation layer including at least one layer of an organic layer and/or an inorganic layer. When the sealing part is a thin film encapsulation layer, the electronic apparatus may be flexible.

On the sealing part, in addition to the color filter and/or color conversion layer, various functional layers may be further disposed according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a fingertip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
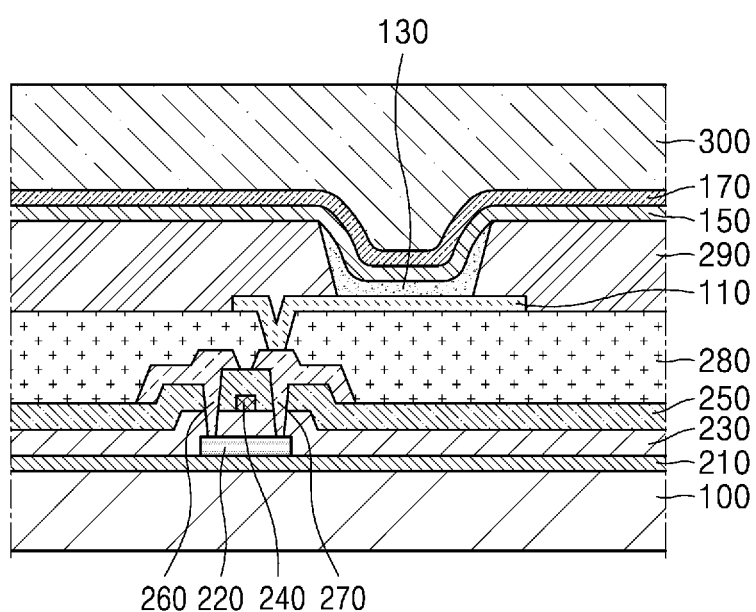
FIG. 2 is a schematic cross-sectional view of a light-emitting apparatus according to an embodiment of the disclosure.
Figure 3:
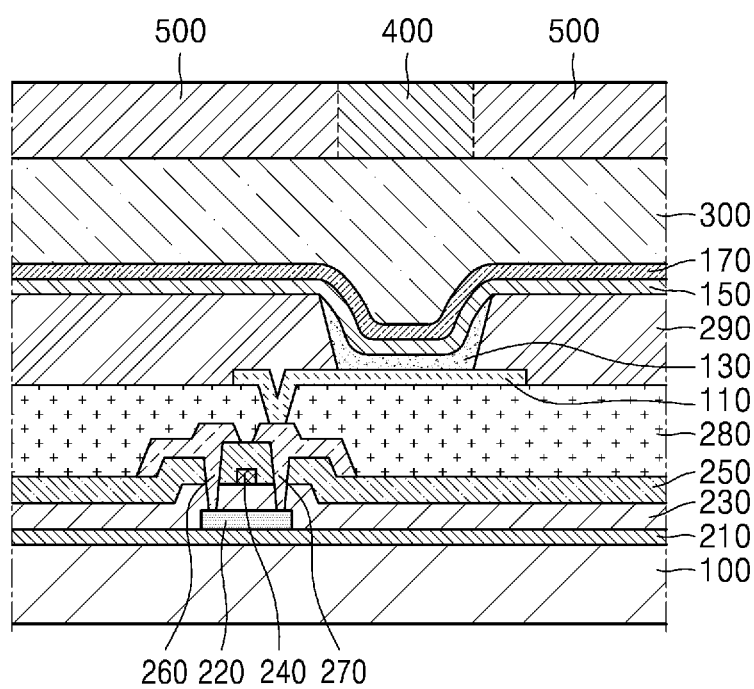
FIG. 3 is a schematic cross-sectional view of a light-emitting apparatus according to another embodiment of the disclosure.

[Description of FIGS. 2 and 3]

FIG. 2 is a schematic cross-sectional view showing a light-emitting apparatus according to an embodiment of the disclosure.

The light-emitting apparatus of FIG. 2 includes a substrate 100, a thin-film transistor (TFT), a light-emitting device, and an encapsulation portion 300 that seals light-emitting device.

The substrate 100 may be a flexible substrate, a glass substrate, or a metal substrate. A buffer layer 210 may be disposed on the substrate 100. The buffer layer 210 prevents the penetration of impurities through the substrate 100, and may provide a flat surface on the substrate 100.

A TFT may be disposed on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be disposed on the active layer 220, and the gate electrode 240 may be disposed on the gate insulating film 230.

An interlayer insulating film 250 may be disposed on the gate electrode 240. The interlayer insulating film 250 is disposed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be disposed on the interlayer insulating film 250. The interlayer insulating film 250 and the gate insulating film 230 may be formed to expose the source region and the drain region of the active layer 220, and the source electrode 260 and the drain electrode 270 may be disposed to be in contact with the exposed portions of the source region and the drain region of the active layer 220.

The TFT may be electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be disposed on the passivation layer 280. The passivation layer 280 does not completely cover the drain electrode 270 and exposes a portion of the drain electrode 270, and the first electrode 110 may be connected to the exposed portion of the drain electrode 270.

A pixel defining layer 290 including an insulating material may be disposed on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. Although not shown in FIG. 2, at least some layers of the interlayer 130 may extend beyond the upper portion of the pixel defining layer 290 and may thus be disposed in the form of a common layer.

The second electrode 150 may be disposed on the interlayer 130, and a capping layer 170 may be additionally formed on the second electrode 150. The capping layer 170 may be formed to cover the second electrode 150.

The encapsulation portion 300 may be disposed on the capping layer 170. The encapsulation portion 300 may be disposed on a light-emitting device and protects the light-emitting device from moisture or oxygen. The encapsulation portion 300 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE), or a combination thereof; or a combination of an inorganic film and an organic film.

FIG. 3 is a schematic cross-sectional view showing a light-emitting apparatus according to an embodiment of the disclosure.

The light-emitting apparatus of FIG. 3 is the same as the light-emitting apparatus of FIG. 2, except that a light-blocking pattern 500 and a functional region 400 are additionally disposed on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

Definition of Terms

The term "$C_3$-$C_{60}$ carbocyclic group" as used herein refers to a cyclic group that consists of carbon only and has three to sixty carbon atoms, and the term "$C_1$-$C_{60}$ heterocyclic group" as used herein refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that consists of one ring or a polycyclic group in which two or more rings are condensed with each other. For example, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the $\pi$ electron-rich $C_3$-$C_{60}$ cyclic group, or the $\pi$ electron-deficient nitrogen-containing $C_1$-$C_{60}$ cyclic group" as used herein refer to a group that is condensed with a cyclic group, a monovalent group, a polyvalent group (for example, a divalent group, a trivalent group, a tetravalent group, or the like), according to the structure of a formula described with corresponding terms. For example, "a benzene group" may be a benzo group, a phenyl group, a phenylene group, or the like, which may be easily understand by one of ordinary skill in the art according to the structure of a formula including the "benzene group."

For examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantyl group, a norbornyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be condensed to each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom other than carbon atoms, as a ring-forming atom, and no aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$R_{10a}$" as used herein refers to:
deuterium, —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or a combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si(Q$_{21}$)(Q$_{22}$)(Q$_{23}$), —N(Q$_{21}$)(Q$_{22}$), —B(Q$_{21}$)(Q$_{22}$), —C(═O)(Q$_{21}$), —S(═O)$_2$(Q$_{21}$), —P(═O)(Q$_{21}$)(Q$_{22}$), or a combination thereof; or —Si(Q$_{31}$)(Q$_{32}$)(Q$_{33}$), —N(Q$_{31}$)(Q$_{32}$), —B(Q$_{31}$)(Q$_{32}$), —C(═O)(Q$_{31}$), —S(═O)$_2$(Q$_{31}$), or —P(═O)(Q$_{31}$)(Q$_{32}$).

In the specification, Q$_1$ to Q$_3$, Q$_{11}$ to Q$_{13}$, Q$_{21}$ to Q$_{23}$ and Q$_{31}$ to Q$_{33}$ may each independently be: hydrogen; deuterium; —F; —Cl; —Br; —I; a hydroxyl group; a cyano group; a nitro group; a C$_1$-C$_{60}$ alkyl group; a C$_2$-C$_{60}$ alkenyl group; a C$_2$-C$_{60}$ alkynyl group; a alkoxy group; or a C$_3$-C$_{60}$ carbocyclic group or a C$_1$-C$_{60}$ heterocyclic group, each unsubstituted or substituted with deuterium, —F, a cyano group, a C$_1$-C$_{60}$ alkyl group, a C$_1$-C$_{60}$ alkoxy group, a phenyl group, a biphenyl group, or a combination thereof.

The term "hetero atom" as used herein refers to any atom other than a carbon atom. Examples of the heteroatom are O, S, N, P, Si, B, Ge, Se, and a combination thereof.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a C$_6$-C$_{60}$ aryl group as a substituent.

The term "terphenyl group" as used herein refers to "a phenyl group substituted with a biphenyl group". In other words, the "terphenyl group" is a substituted phenyl group having, as a substituent, a C$_6$-C$_{60}$ aryl group substituted with a C$_6$-C$_{60}$ aryl group.

* and *' as used herein, unless defined otherwise, each refer to a binding site to a neighboring atom in a corresponding formula.

Hereinafter, a compound according to embodiments and a light-emitting device according to embodiments will be described in detail with reference to Synthesis Examples and Examples. The wording "B was used instead of A" used in describing Synthesis Examples refers to that an identical molar equivalent of B was used in place of A.

EXAMPLES

Synthesis Examples

Synthesis Example 1: Synthesis of Compound 1-1

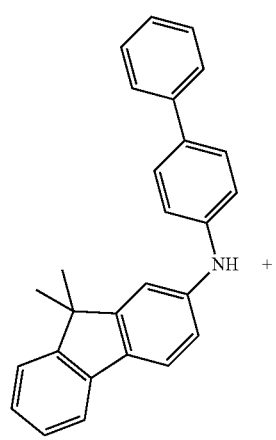

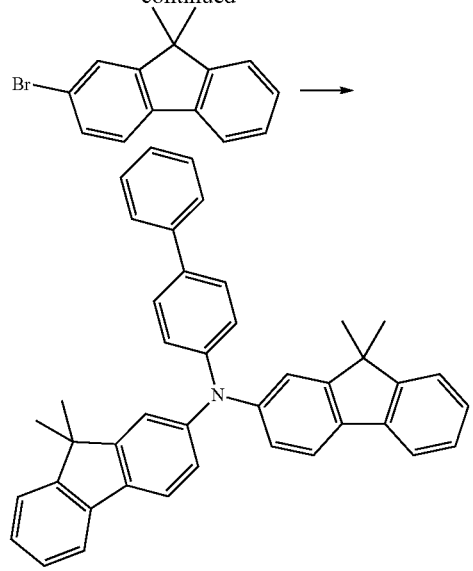

1-1

2-bromo-9,9-dimethyl-9H-fluorene (2.7 g, 10 mmol) was dissolved in anhydrous toluene, and N-([1,1'-biphenyl]-4-yl)-9,9-dimethyl-9H-fluoren-2-amine (3.6 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: hexane:dichloromethane, 6:1 v/v). The solvent was removed, so as to obtain Compound 1-1 as a white solid (4.5 g, 8.2 mmol, yield of 82%). $^1$H NMR (d$^6$-DMSO, 500 MHz): δ 1.69 (12H, —CH$_3$), 7.14 (2H), 7.28-7.40 (9H), 7.49-7.54 (6H), 7.70 (2H), 7.85-7.89 (4H) ppm.

Synthesis Example 2: Synthesis of Compound 1-2

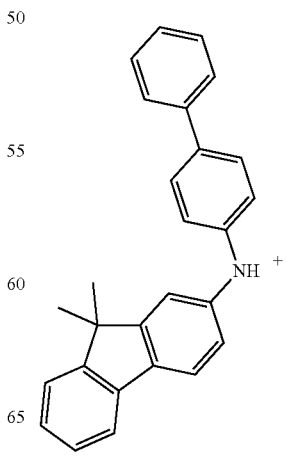

-continued

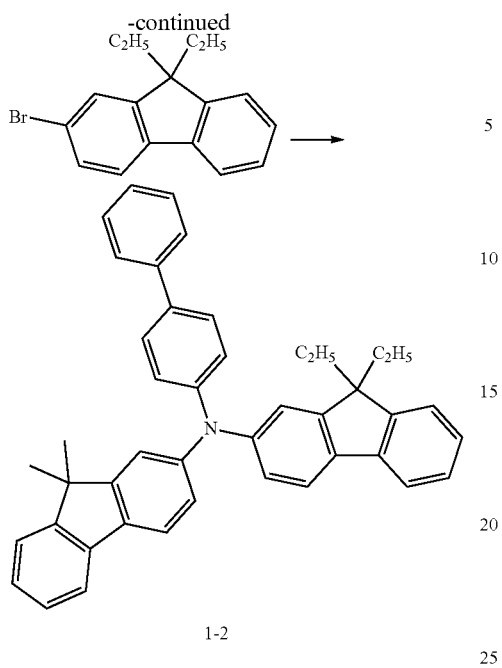

1-2

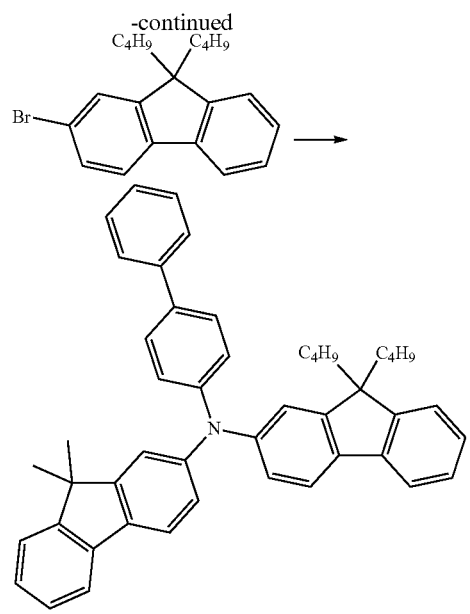

1-3

2-bromo-9,9-diethyl-9H-fluorene (3.0 g, 10 mmol) was dissolved in anhydrous toluene, and N-([1,1'-biphenyl]-4-yl)-9,9-dimethyl-9H-fluoren-2-amine (3.6 g, 10 mmol), CsCO₃ (6.0 g, 32 mmol), Pd(OAc)₂ (0.25 g, 1.1 mmol), and t-Bu₃P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO₄. The resultant solution was filtered to remove a solid therefrom, concentrated, and purified by column chromatography (solvent: hexane:dichloromethane, 6:1 v/v). The solvent was removed, so as to obtain Compound 1-2 as a white solid (4.6 g, 8.0 mmol, yield of 80%). ¹H NMR (d⁶-DMSO, 500 MHz): δ 0.89 (6H, —CH₃), 1.68 (6H, —CH₃), 1.89 (4H, —CH₂—), 7.10 (2H), 7.26-7.39 (9H), 7.48 (2H), 7.57 (4H), 7.70 (2H), 7.83 (2H), 7.92 (2H) ppm.

Synthesis Example 3: Synthesis of Compound 1-3

2-bromo-9,9-dibutyl-9H-fluorene (3.6 g, 10 mmol) was dissolved in anhydrous toluene, and N-([1,1'-biphenyl]-4-yl)-9,9-dimethyl-9H-fluoren-2-amine (3.6 g, 10 mmol), CsCO₃ (6.0 g, 32 mmol), Pd(OAc)₂ (0.25 g, 1.1 mmol), and t-Bu₃P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO₄. The resultant solution was filtered to remove a solid therefrom, concentrated, and purified by column chromatography (solvent: hexane:dichloromethane, 5:1 v/v). The solvent was removed, so as to obtain Compound 1-3 as a white solid (4.7 g, 7.4 mmol, yield of 74%). ¹H NMR (d⁶-DMSO, 500 MHz): δ 0.90 (6H, —CH₃), 1.27-1.29 (8H, —CH₂—), 1.69 (6H, —CH₃), 1.84 (4H, —CH₂—), 7.17 (2H), 7.25-7.41 (9H), 7.50 (2H), 7.56 (4H), 7.72 (2H), 7.84 (2H), 7.91 (2H) ppm.

Synthesis Example 4: Synthesis of Compound 1-4

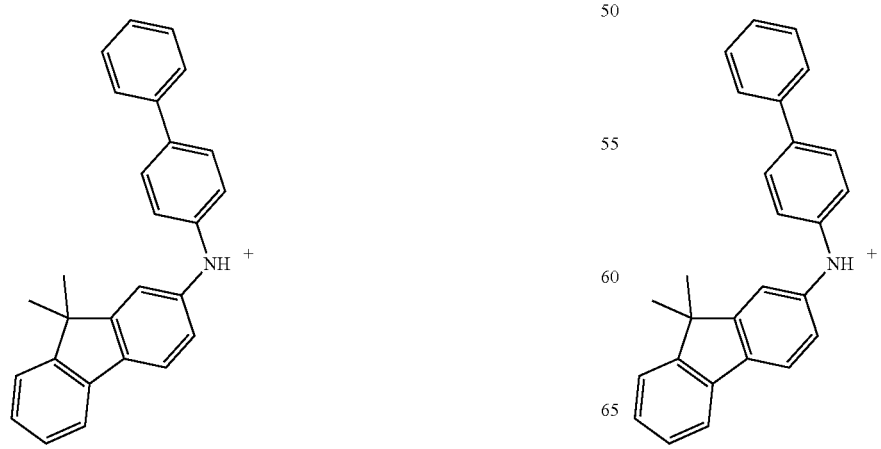

-continued

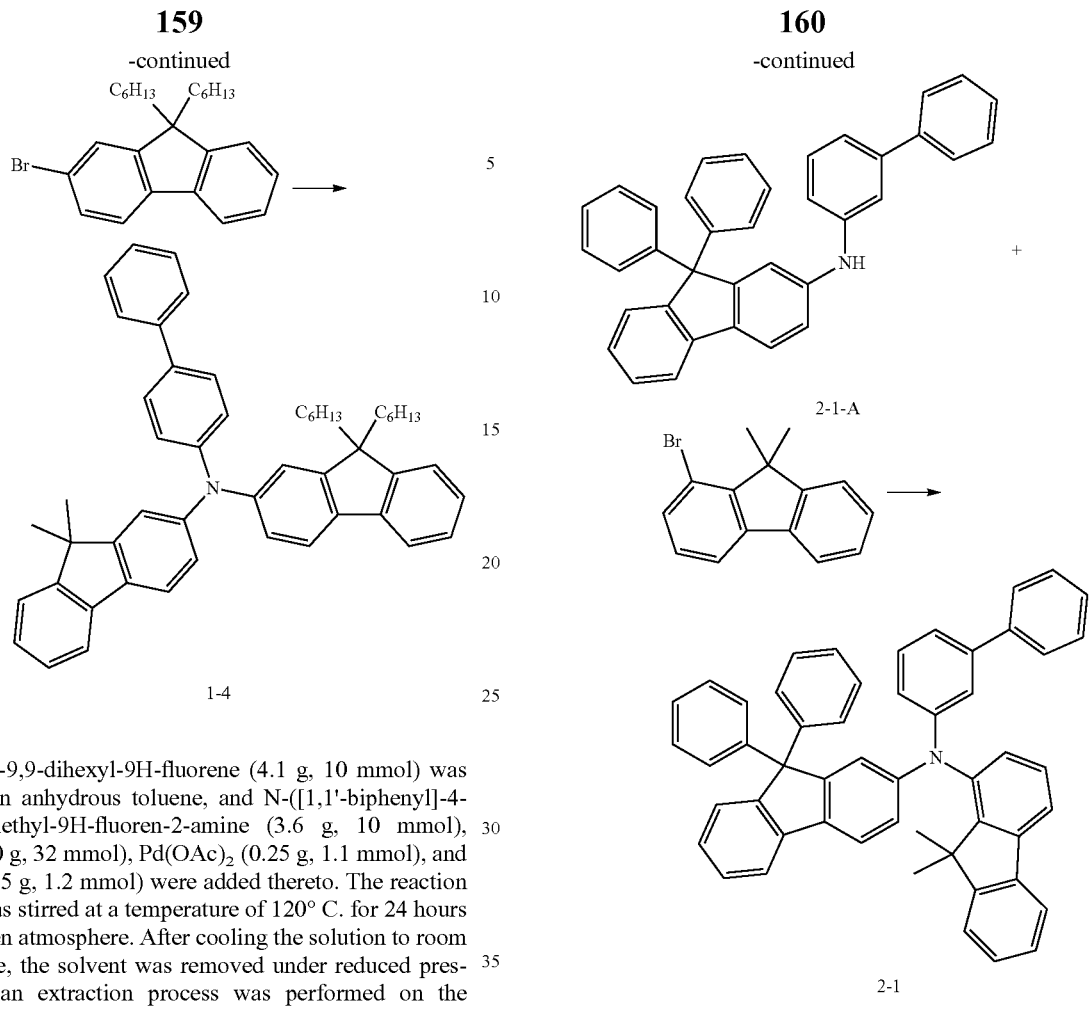

2-bromo-9,9-dihexyl-9H-fluorene (4.1 g, 10 mmol) was dissolved in anhydrous toluene, and N-([1,1'-biphenyl]-4-yl)-9,9-dimethyl-9H-fluoren-2-amine (3.6 g, 10 mmol), $CsCO_3$ (6.0 g, 32 mmol), $Pd(OAc)_2$ (0.25 g, 1.1 mmol), and $t-Bu_3P$ (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using $MgSO_4$. The resultant solution was filtered to remove a solid therefrom, concentrated, and purified by column chromatography (solvent: hexane:dichloromethane, 5:1 v/v). The solvent was removed, so as to obtain Compound 1-4 as a white solid (4.6 g, 6.6 mmol, yield of 66%). $^1H$ NMR ($d^6$-DMSO, 500 MHz): δ 0.88 (6H, —$CH_3$), 1.29 (16H, —$CH_2$—), 1.69 (6H, —$CH_3$), 1.83 (4H, —$CH_2$—), 7.16 (2H), 7.28-7.49 (11H), 7.55 (4H), 7.75 (2H), 7.86 (2H), 7.90 (2H) ppm.

Synthesis Example 5: Synthesis of Compound 2-1

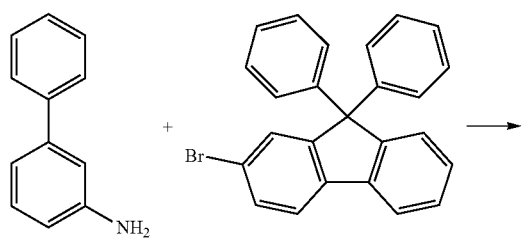

(1) Synthesis of Intermediate 2-1-A 3-aminobiphenyl (17 g, 0.10 mol), 2-bromo-9,9-diphenyl-9H-fluorene (40 g, 0.10 mol), t-BuONa (14 g, 0.15 mol), $t-Bu_3P$ (0.6 g, 3.0 mmol), and $Pd_2(dba)_3$ (2.7 g, 3.0 mmol) were added to a reaction vessel (i.e., a Schlenk tube), dried for 2 hours in a vacuum state, and dissolved in toluene (500 mL). The reaction solution was stirred at a temperature of 130° C. for 24 hours in a nitrogen atmosphere, and cooled to room temperature. The solvent was removed under reduced pressure, and the resultant product was washed with an excess of dichloromethane and distilled water. An extraction process was performed thereon to separate an organic layer. The separated organic layer was dried using $MgSO_4$, and purified by column chromatography (solvent: dichloromethane), so as to obtain Intermediate 2-1-A (44 g, 91 mmol, yield of 91%).

(2) Synthesis of Compound 2-1

1-bromo-9,9-dimethyl-9H-fluorene (2.7 g, 10 mmol) was dissolved in anhydrous toluene, and Intermediate 2-1-A (4.9 g, 10 mmol), $CsCO_3$ (6.0 g, 32 mmol), $Pd(OAc)_2$ (0.25 g, 1.1 mmol), and $t-Bu_3P$ (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using $MgSO_4$. The resultant solution was filtered to remove a solid therefrom, concentrated, and purified by column chromatography (solvent: hexane:dichloromethane, 3:1 v/v). The solvent was removed, so as to obtain Compound 2-1 as a white solid (4.6 g, 6.8 mmol, yield of 68%). $^1$H NMR (d$^6$-DMSO, 500 MHz): δ 1.70 (6H, —CH$_3$), 7.06-7.10 (5H), 7.16-7.19 (5H), 7.26-7.41 (12H), 7.49-7.56 (6H), 7.75 (2H), 7.84-7.90 (3H) ppm.

Synthesis Example 6: Synthesis of Compound 2-2

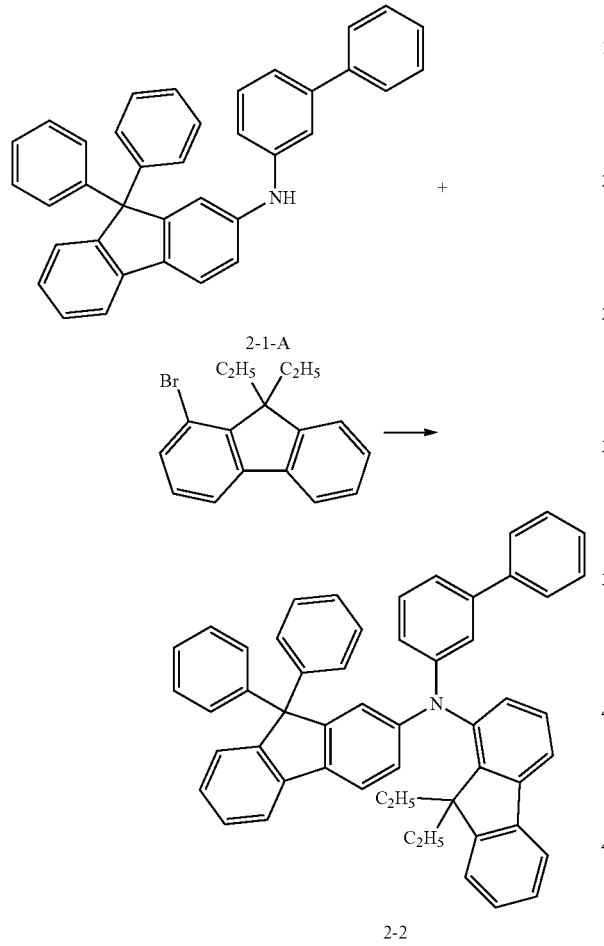

1-bromo-9,9-diethyl-9H-fluorene (3.0 g, 10 mmol) was dissolved in anhydrous toluene, and Intermediate 2-1-A (4.9 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: hexane:dichloromethane, 3:1 v/v). The solvent was removed, so as to obtain Compound 2-2 as a white solid (4.2 g, 6.0 mmol, yield of 60%). $^1$H NMR (d$^6$-DMSO, 500 MHz): δ 0.89 (6H, —CH$_3$), 1.89 (4H, —CH$_2$—), 7.05-7.11 (5H), 7.16-7.18 (5H), 7.27-7.40 (12H), 7.50-7.56 (6H), 7.73 (2H), 7.86-7.90 (3H) ppm.

Synthesis Example 7: Synthesis of Compound 2-3

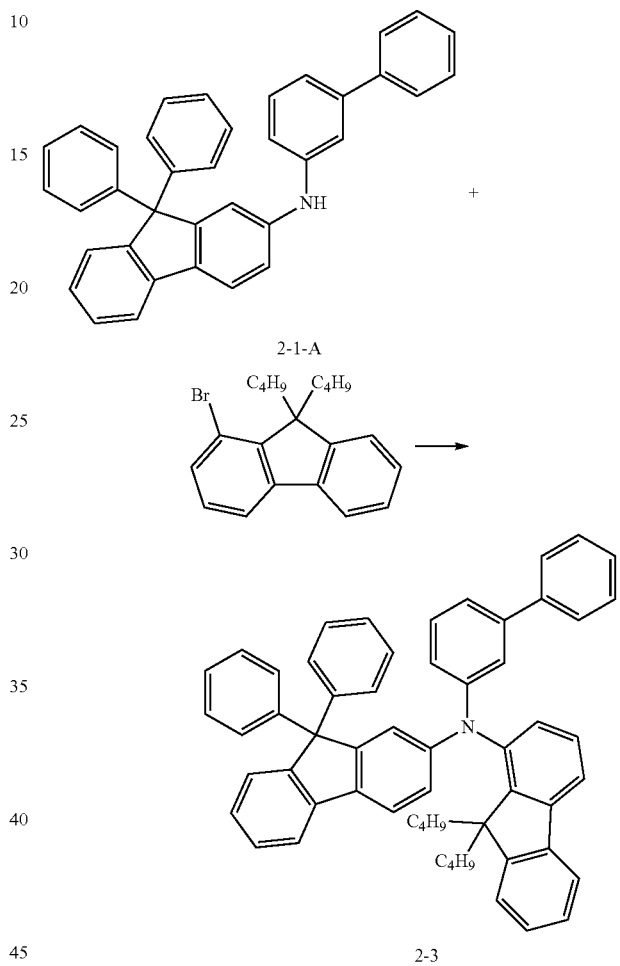

1-bromo-9,9-dibutyl-9H-fluorene (3.6 g, 10 mmol) was dissolved in anhydrous toluene, and Intermediate 2-1-A (4.9 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: hexane:dichloromethane, 2:1 v/v). The solvent was removed, so as to obtain Compound 2-3 as a white solid (4.2 g, 5.5 mmol, yield of 55%). $^1$H NMR (d$^6$-DMSO, 500 MHz): δ 0.88 (6H, —CH$_3$), 1.26-1.29 (8H), 1.83 (4H, —CH$_2$—), 7.06-7.10 (5H), 7.17-7.20 (5H), 7.26-7.41 (12H), 7.52-7.58 (6H), 7.70 (2H), 7.88-7.91 (3H) ppm.

Synthesis Example 8: Synthesis of Compound 2-4

Synthesis Example 9: Synthesis of Compound 3-1

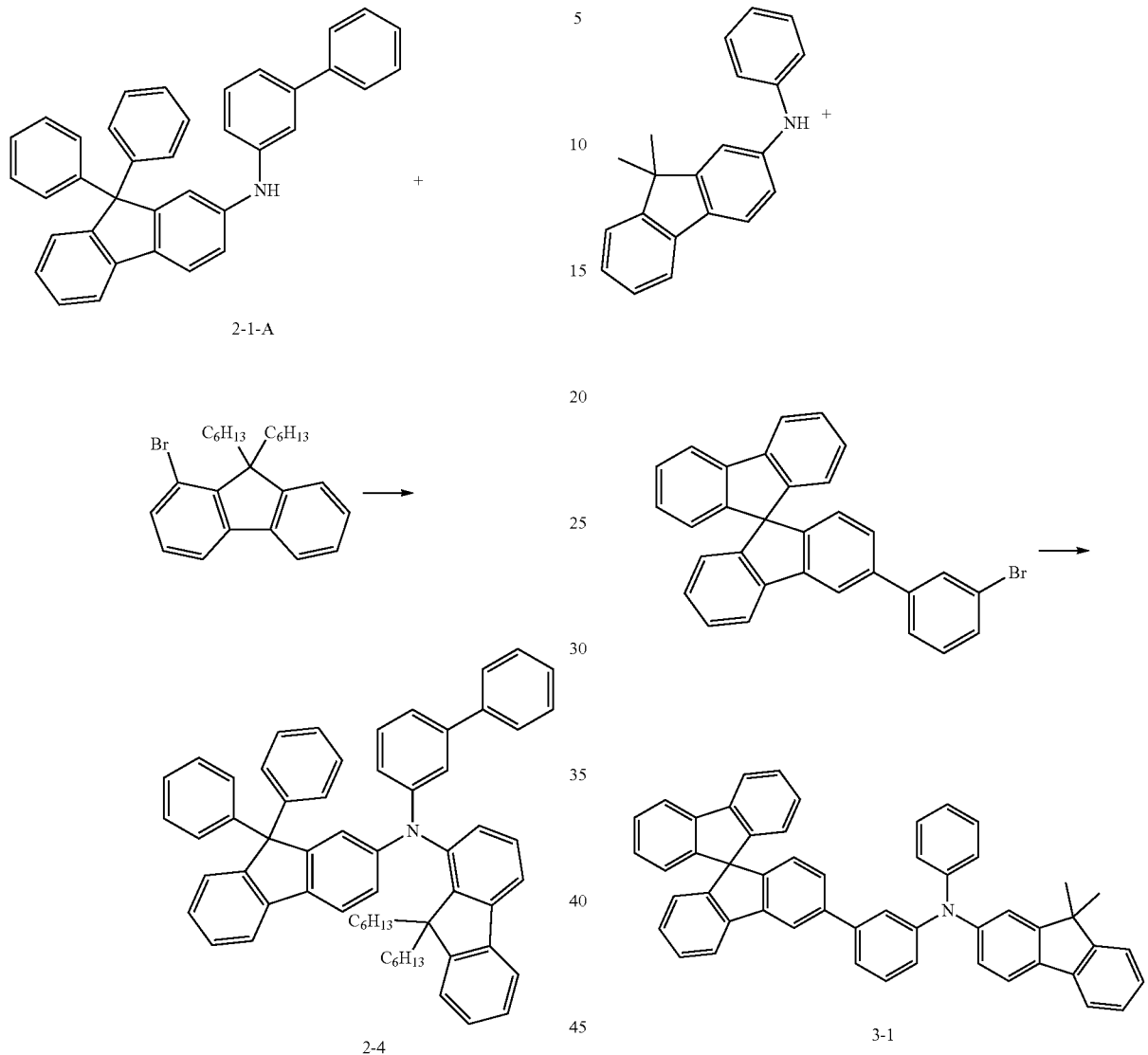

1-bromo-9,9-dihexyl-9H-fluorene (4.1 g, 10 mmol) was dissolved in anhydrous toluene, and Intermediate 2-1-A (4.9 g, 10 mmol), CsCO₃ (6.0 g, 32 mmol), Pd(OAc)₂ (0.25 g, 1.1 mmol), and t-Bu₃P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO₄. The resultant solution was filtered to remove a solid therefrom, concentrated, and purified by column chromatography (solvent: hexane:dichloromethane, 2:1 v/v). The solvent was removed, so as to obtain Compound 2-4 as a white solid (5.2 g, 6.4 mmol, yield of 64%). ¹H NMR (d⁶-DMSO, 500 MHz): δ 0.89 (6H, —CH₃), 1.26-1.30 (16H), 1.86 (4H, —CH₂—), 7.05-7.10 (5H), 7.18-7.21 (5H), 7.27-7.41 (12H), 7.48-7.55 (6H), 7.72 (2H), 7.86-7.91 (3H) ppm.

3-(3-bromophenyl)-9,9'-spirobi[fluorine] (4.7 g, 10 mmol) was dissolved in anhydrous toluene, and 9,9-dimethyl-N-phenyl-9H-fluoren-2-amine (2.9 g, 10 mmol), CsCO₃ (6.0 g, 32 mmol), Pd(OAc)₂ (0.25 g, 1.1 mmol), and t-Bu₃P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO₄. The resultant solution was filtered to remove a solid therefrom, concentrated, and purified by column chromatography (solvent: hexane:dichloromethane, 3:1 v/v). The solvent was removed, so as to obtain Compound 3-1 as a white solid (5.1 g, 7.5 mmol, yield of 75%). ¹H NMR (d⁶-DMSO, 500 MHz): δ 1.65 (6H, —CH₃), 7.00-7.08 (3H), 7.16-7.18 (3H), 7.24-7.45 (13H), 7.60 (4H), 7.70-7.72 (2H), 7.86-7.90 (5H), 8.17 (1H) ppm.

Synthesis Example 10: Synthesis of Compound 3-2

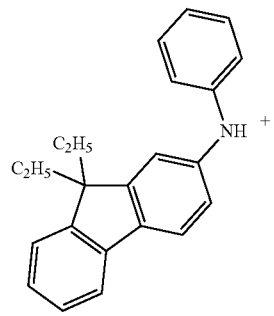

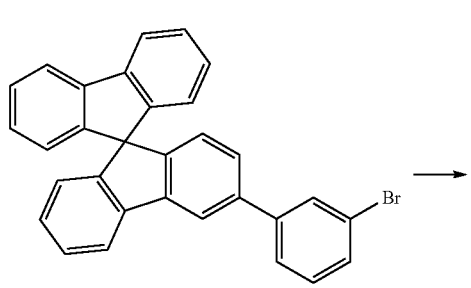

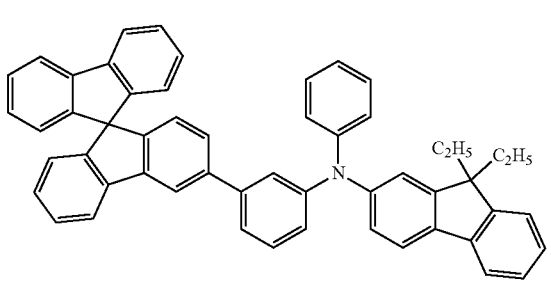

3-2

3-(3-bromophenyl)-9,9'-spirobi[fluorine] (4.7 g, 10 mmol) was dissolved in anhydrous toluene, and 9,9-diethyl-N-phenyl-9H-fluoren-2-amine (3.1 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: hexane:dichloromethane, 3:1 v/v). The solvent was removed, so as to obtain Compound 3-2 as a white solid (4.6 g, 6.6 mmol, yield of 66%). $^1$H NMR (d$^6$-DMSO, 500 MHz): δ 0.85 (6H, —CH$_3$), 1.89 (4H, —CH$_2$—), 6.99-7.08 (3H), 7.15-7.19 (3H), 7.28-7.45 (13H), 7.56 (4H), 7.67-7.70 (2H), 7.85-7.90 (5H), 8.15 (1H) ppm.

Synthesis Example 11: Synthesis of Compound 3-3

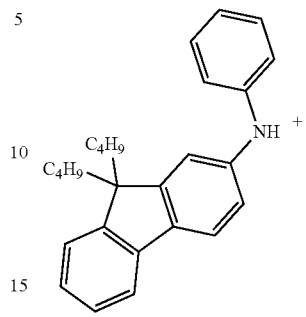

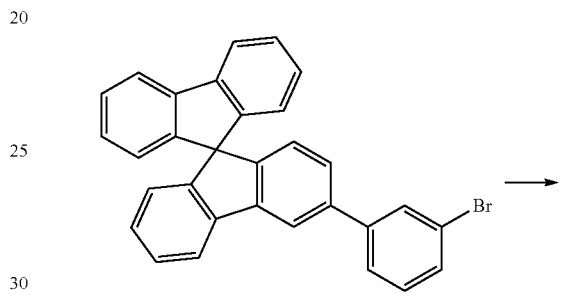

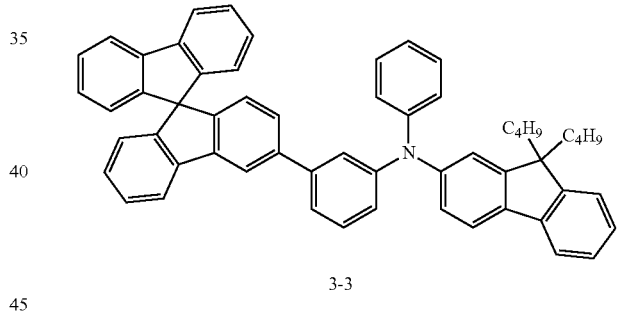

3-3

3-(3-bromophenyl)-9,9'-spirobi[fluorine] (4.7 g, 10 mmol) was dissolved in anhydrous toluene, and 9,9-dibutyl-N-phenyl-9H-fluoren-2-amine (3.7 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: hexane:dichloromethane, 2:1 v/v). The solvent was removed, so as to obtain Compound 3-3 as a white solid (4.0 g, 5.3 mmol, yield of 53%). $^1$H NMR (d$^6$-DMSO, 500 MHz): δ 0.88 (6H, —CH$_3$), 1.26-1.30 (8H, —CH$_2$—), 1.83 (4H, —CH$_2$—), 7.00-7.10 (3H), 7.16-7.38 (16H), 7.56 (4H), 7.67-7.70 (2H), 7.86-7.89 (5H), 8.17 (1H) ppm.

Synthesis Example 12: Synthesis of Compound 3-4

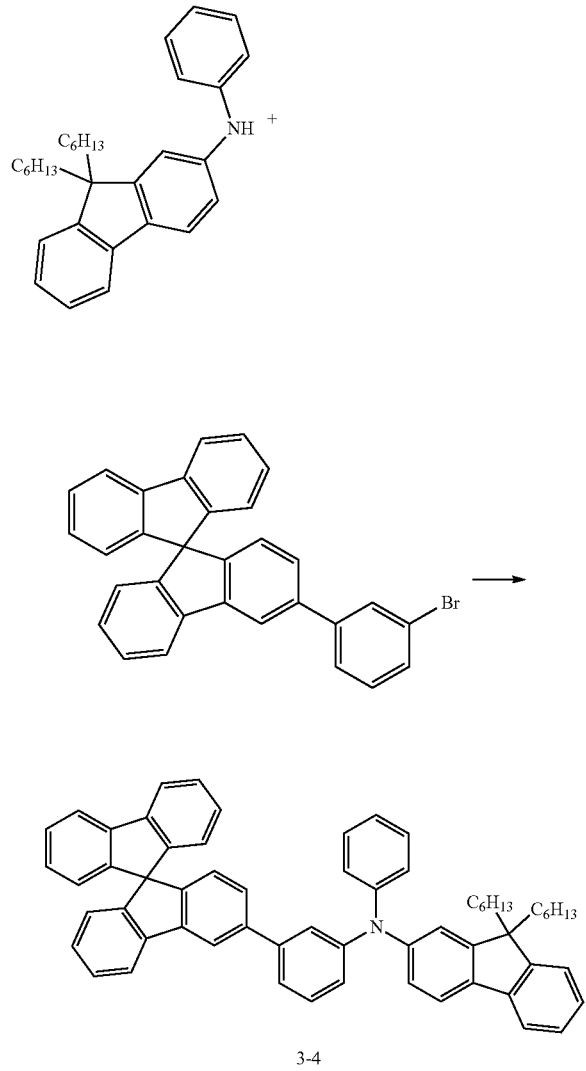

3-4

3-(3-bromophenyl)-9,9'-spirobi[fluorine] (4.7 g, 10 mmol) was dissolved in anhydrous toluene, and 9,9-dihexyl-N-phenyl-9H-fluoren-2-amine (4.3 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: hexane:dichloromethane, 1:1 v/v). The solvent was removed, so as to obtain Compound 3-4 as a white solid (5.6 g, 6.9 mmol, yield of 69%). $^1$H NMR (d$^6$-DMSO, 500 MHz): δ 0.85 (6H, —CH$_3$), 1.26-1.30 (16H, —CH$_2$—), 1.85 (4H, —CH$_2$—), 7.00-7.08 (3H), 7.19-7.38 (16H), 7.54 (4H), 7.64-7.67 (2H), 7.85-7.90 (5H), 8.13 (1H) ppm.

Synthesis Example 13: Synthesis of Compound 4-1

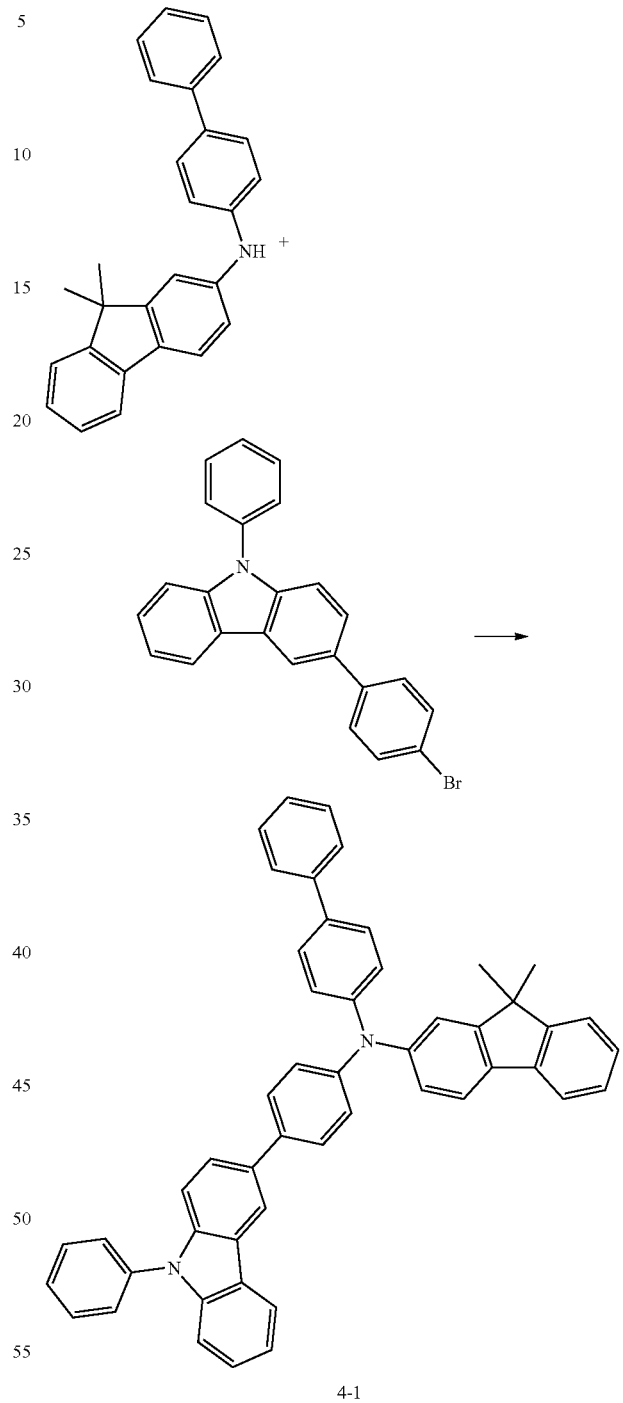

4-1

3-(4-bromophenyl)-9-phenyl-9H-carbazole (4.0 g, 10 mmol) was dissolved in anhydrous toluene, and N-([1,1'-biphenyl]-4-yl)-9,9-dimethyl-9H-fluoren-2-amine (3.6 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: dichloromethane). The solvent was removed, so as to obtain Compound 4-1 as a white solid (5.8 g, 8.5 mmol, yield of 85%). $^1$H NMR (d$^6$-DMSO, 500 MHz): δ 1.64 (6H, —CH$_3$), 7.16-7.20 (2H), 7.30-7.40 (8H), 7.49-7.62 (14H), 7.74 (2H), 7.89-7.91 (3H), 8.13 (1H), 8.19 (1H), 8.30 (1H) ppm.

Synthesis Example 14: Synthesis of Compound 4-2

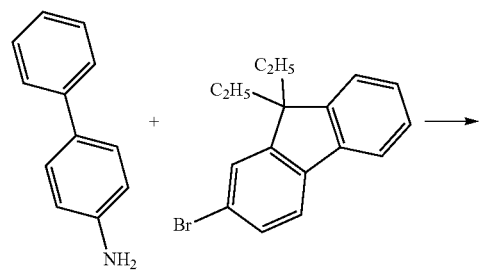

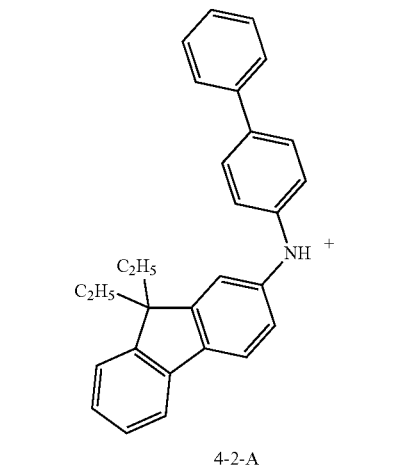

4-2-A

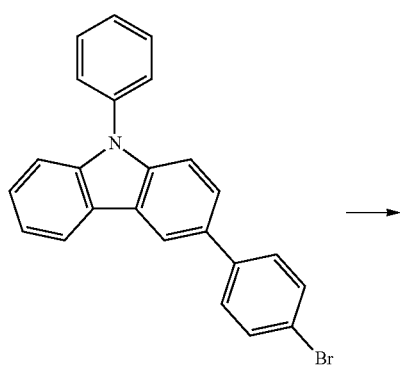

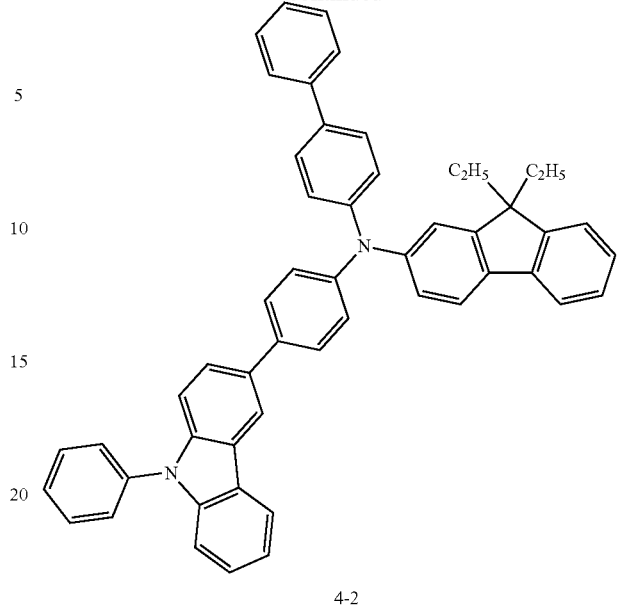

4-2

(1) Synthesis of Intermediate 4-2-A 4-aminobiphenyl (17 g, 0.10 mol), 2-bromo-9,9-diethyl-9H-fluorene (30 g, 0.10 mol), t-BuONa (14 g, 0.15 mol), t-Bu$_3$P (0.6 g, 3.0 mmol), and Pd$_2$(dba)$_3$ (2.7 g, 3.0 mmol) were added to a reaction vessel (i.e., a Schlenk tube), dried for 2 hours in a vacuum state, and dissolved in toluene (500 mL). The reaction solution was stirred at a temperature of 130° C. for 24 hours in a nitrogen atmosphere, and cooled to room temperature. The solvent was removed under reduced pressure, and the resultant product was washed with an excess of dichloromethane and distilled water. An extraction process was performed thereon to separate an organic layer. The separated organic layer was dried using MgSO$_4$, and purified by column chromatography (solvent: dichloromethane), so as to obtain Intermediate 4-2-A (35 g, 90 mmol, yield of 90%).

(2) Synthesis of Compound 4-2

3-(4-bromophenyl)-9-phenyl-9H-carbazole (4.0 g, 10 mmol) was dissolved in anhydrous toluene, and Intermediate 4-1-A (3.9 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: dichloromethane). The solvent was removed, so as to obtain Compound 4-2 as a white solid (4.4 g, 6.2 mmol, yield of 62%). $^1$H NMR (d$^6$-DMSO, 500 MHz): δ 0.80 (6H, —CH$_3$), 1.85 (4H, —CH$_2$—), 7.13-7.19 (2H), 7.26-7.38 (8H), 7.50-7.61 (14H), 7.75 (2H), 7.89-7.92 (3H), 8.12 (1H), 8.20 (1H), 8.32 (1H) ppm.

Synthesis Example 15: Synthesis of Compound 4-3

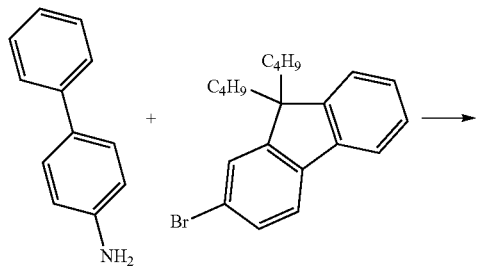

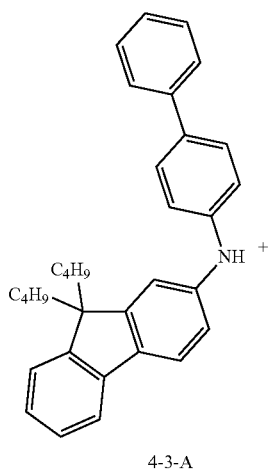

4-3-A

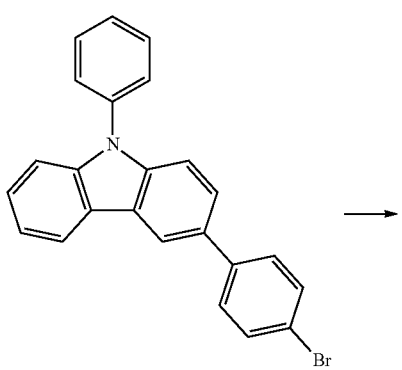

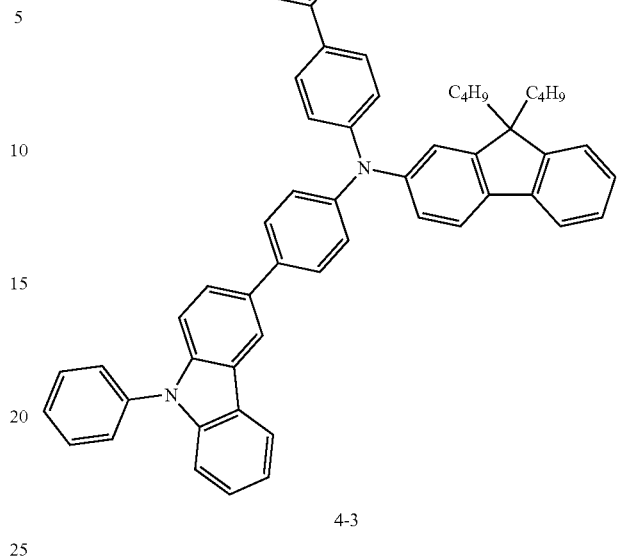

4-3

(1) Synthesis of Intermediate 4-3-A 4-aminobiphenyl (17 g, 0.10 mol), 2-bromo-9,9-dibutyl-9H-fluorene (36 g, 0.10 mol), t-BuONa (14 g, 0.15 mol), t-Bu$_3$P (0.6 g, 3.0 mmol), and Pd$_2$(dba)$_3$ (2.7 g, 3.0 mmol) were added to a reaction vessel (i.e., a Schlenk tube), dried for 2 hours in a vacuum state, and dissolved in toluene (500 mL). The reaction solution was stirred at a temperature of 130° C. for 24 hours in a nitrogen atmosphere, and cooled to room temperature. The solvent was removed under reduced pressure, and the resultant product was washed with an excess of dichloromethane and distilled water. An extraction process was performed thereon to separate an organic layer. The separated organic layer was dried using MgSO$_4$, and purified by column chromatography (solvent: dichloromethane), so as to obtain Intermediate 4-3-A (28 g, 63 mmol, yield of 63%).

(2) Synthesis of Compound 4-3

3-(4-bromophenyl)-9-phenyl-9H-carbazole (4.0 g, 10 mmol) was dissolved in anhydrous toluene, and Intermediate 4-3-A (4.5 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: dichloromethane). The solvent was removed, so as to obtain Compound 4-3 as a white solid (4.0 g, 5.4 mmol, yield of 54%). $^1$H NMR (d$^6$-DMSO, 500 MHz): δ 0.89 (6H, —CH$_3$), 1.28-1.33 (8H, —CH$_2$—), 1.89 (4H, —CH$_2$—), 7.15-7.20 (2H), 7.29-7.40 (8H), 7.50-7.62 (14H), 7.77 (2H), 7.90-7.94 (3H), 8.09 (1H), 8.21 (1H), 8.30 (1H) ppm.

Synthesis Example 16: Synthesis of Compound 4-4

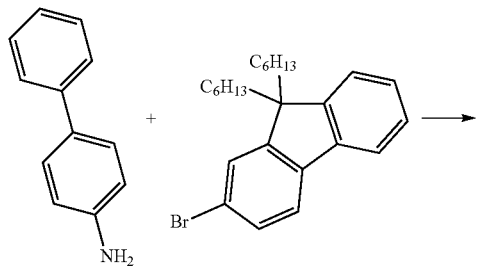

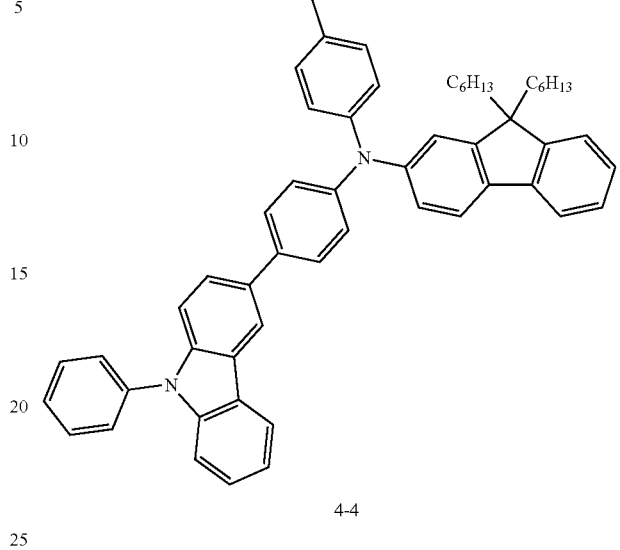

4-4

(1) Synthesis of Intermediate 4-4-A 4-aminobiphenyl (17 g, 0.10 mol), 2-bromo-9,9-dibutyl-9H-fluorene (41 g, 0.10 mol), t-BuONa (14 g, 0.15 mol), t-Bu$_3$P (0.6 g, 3.0 mmol), and Pd$_2$(dba)$_3$ (2.7 g, 3.0 mmol) were added to a reaction vessel (i.e., a Schlenk tube), dried for 2 hours in a vacuum state, and dissolved in toluene (500 mL). The reaction solution was stirred at a temperature of 130° C. for 24 hours in a nitrogen atmosphere, and cooled to room temperature. The solvent was removed under reduced pressure, and the resultant product was washed with an excess of dichloromethane and distilled water. An extraction process was performed thereon to separate an organic layer. The separated organic layer was dried using MgSO$_4$, and purified by column chromatography (solvent: dichloromethane), so as to obtain Intermediate 4-4-A (35 g, 70 mmol, yield of 70%).

(2) Synthesis of Compound 4-4

3-(4-bromophenyl)-9-phenyl-9H-carbazole (4.0 g, 10 mmol) was dissolved in anhydrous toluene, and Intermediate 4-4-A (5.0 g, 10 mmol), CsCO$_3$ (6.0 g, 32 mmol), Pd(OAc)$_2$ (0.25 g, 1.1 mmol), and t-Bu$_3$P (0.25 g, 1.2 mmol) were added thereto. The reaction solution was stirred at a temperature of 120° C. for 24 hours in a nitrogen atmosphere. After cooling the solution to room temperature, the solvent was removed under reduced pressure, and an extraction process was performed on the remaining solid using dichloromethane. After washing the extracted solution with water and brine solution, the water was removed using MgSO$_4$. The resultant solution was filtered to remove a solid therefrom, concentrated, and purified by column chromatography (solvent: dichloromethane). The solvent was removed, so as to obtain Compound 4-4 as a white solid (3.7 g, 4.5 mmol, yield of 45%). $^1$H NMR (d$^6$-DMSO, 500 MHz): δ 0.87 (6H, —CH$_3$), 1.25-1.28 (16H, —CH$_2$—), 1.90 (4H, —CH$_2$—), 7.13-7.18 (2H), 7.28-7.37 (8H), 7.51-7.62 (14H), 7.79 (2H), 7.89-7.93 (3H), 8.15 (1H), 8.24 (1H), 8.35 (1H) ppm.

Evaluation Example 1: Measurement of Glass Transition Temperature

By using a differential scanning calorimeter (TA instruments Q20), glass transition temperatures of Compounds 1-1 to 1-4, 2-1 to 2-4, 3-1 to 3-4, and 4-1 to 4-4 used in Examples and Comparative Examples were measured under conditions of 10° C./min, and the results are shown in Table 1.
TABLE 1
| Compound | 1-1 | 1-2 | 1-3 | 1-4 |
|---|---|---|---|---|
| Tg (° C.) | 130 | 121 | 92 | 66 |
| Compound | 2-1 | 2-2 | 2-3 | 2-4 |
| Tg (° C.) | 134 | 128 | 98 | 73 |
| Compound | 3-1 | 3-2 | 3-3 | 3-4 |
| Tg (° C.) | 146 | 134 | 107 | 84 |
| Compound | 4-1 | 4-2 | 4-3 | 4-4 |
| Tg (° C.) | 131 | 116 | 94 | 69 |
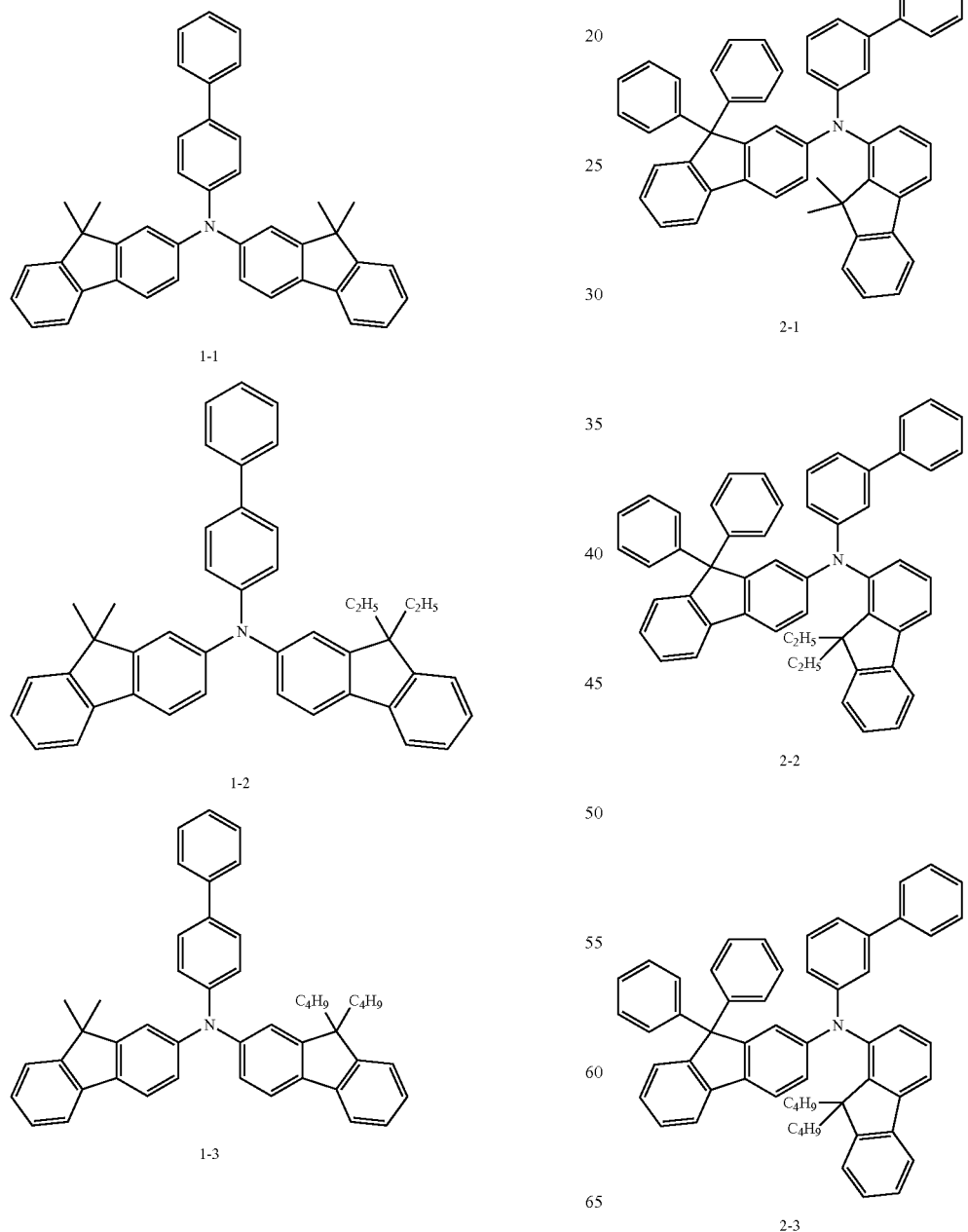
TABLE 1-continued TABLE 1-continued
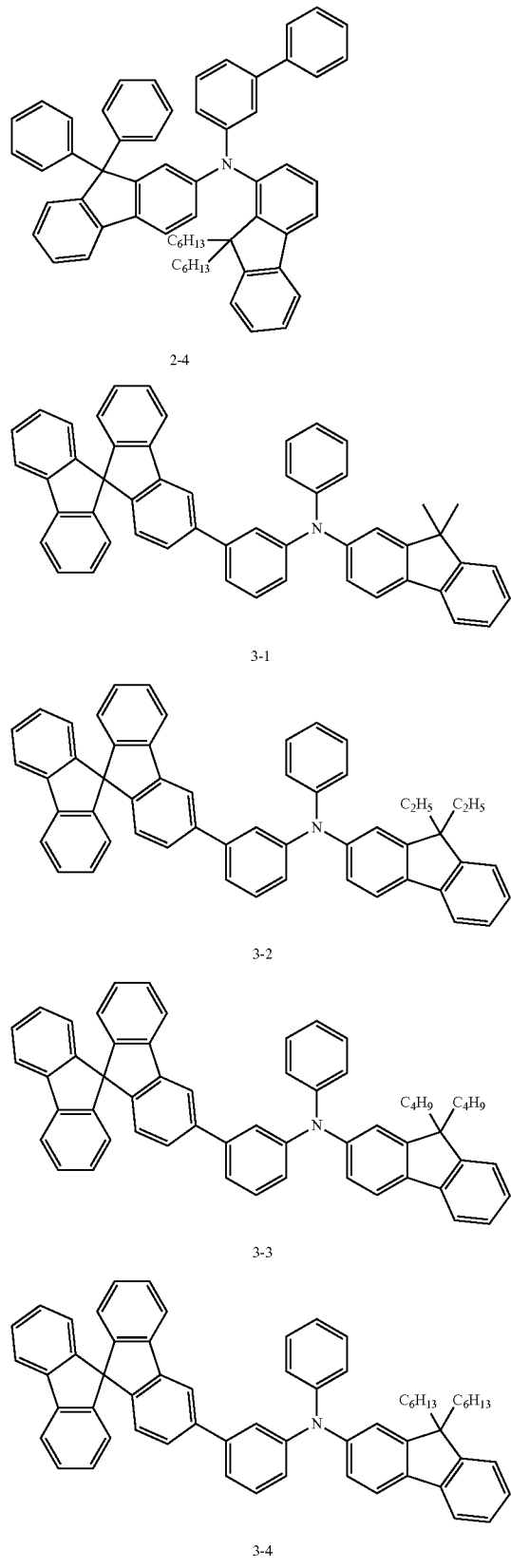
2-4
3-1
3-2
3-3
3-4
TABLE 1-continued
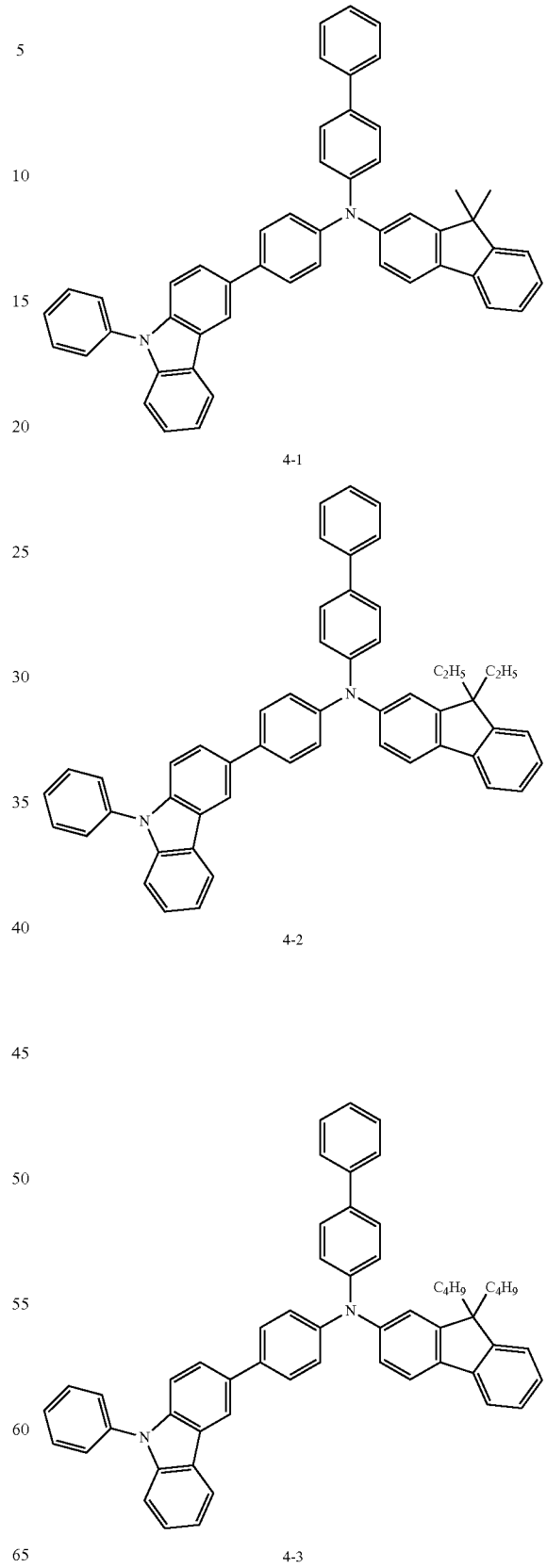
4-1
4-2
4-3

TABLE 1-continued

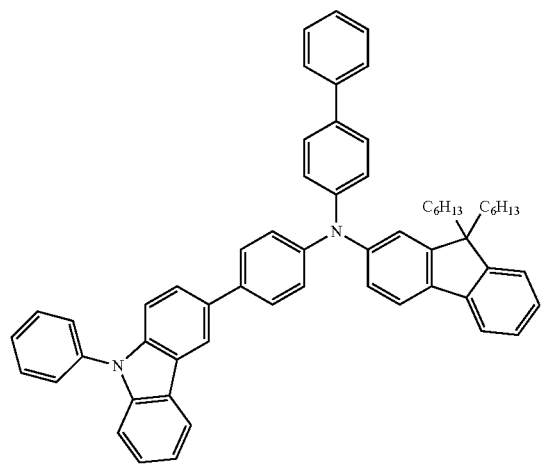

4-4

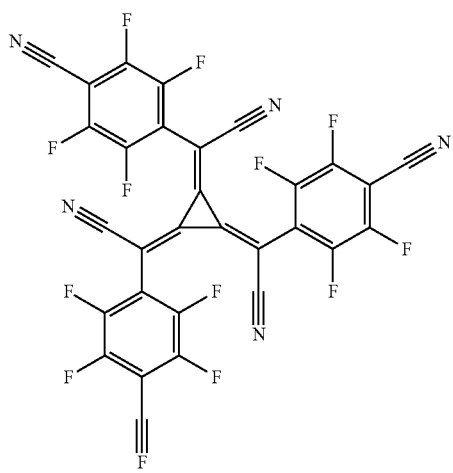

NPD-9

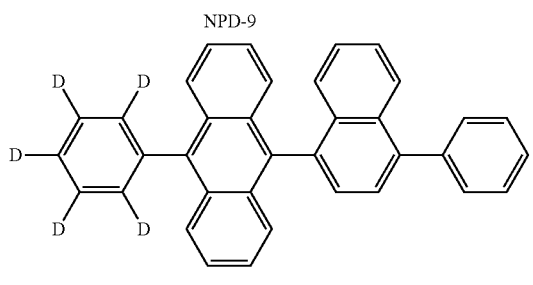

HOST1

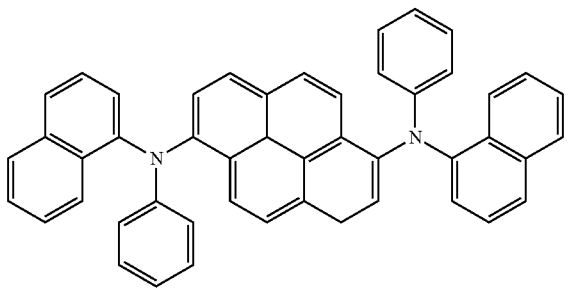

DOPANT1

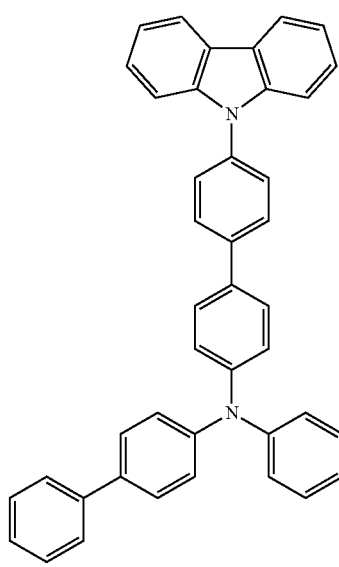

HT2

Referring to Table 1, it was confirmed that, among the compounds, the glass transition temperatures decreases as the number of carbon atoms of the alkyl group substituted on carbon 9 of the fluorene group increased.

Manufacturing Examples of Device

Comparative Example 1

An ITO glass substrate was cut to a size of 50 mm×50 mm×0.5 mm, sonicated with isopropyl alcohol and pure water each for 10 minutes, and cleaned by exposure to ultraviolet rays and ozone for 10 minutes. The resultant glass substrate was loaded onto a vacuum deposition apparatus. Compound 1-1 and NDP-9 (Novaled Company) (3 wt %) were co-deposited to form a hole injection layer having a thickness of 100 Å, and Compound 1-1 was deposited on the hole injection layer to form a hole transport layer having a thickness of 600 Å. Subsequently, Compound HT1 was vacuum-deposited on the hole transport layer to form an electron blocking layer having a thickness of 50 Å. HOST1: DOPANT1 were deposited at a weight ratio of 97:3 on the electron blocking layer to form an emission layer having a thickness of 300 Å. Compound T2T was vacuum-deposited on the emission layer to form a hole blocking layer having a thickness of 50 Å. TPBi and LiQ (lithium quinolate) were vacuum-deposited at a weight ratio of 1:1 on the hole blocking layer to form an electron transport layer having a thickness of 310 Å. Subsequently, as an electron injection layer and an anode, LiF (8 Å) and Al (1,000 Å) were deposited on the electron transport layer, thereby manufacturing a light-emitting device. A heat treatment process was performed on the manufactured light-emitting device at a temperature of 85° C., thereby completing the manufacture of the light-emitting device.

-continued

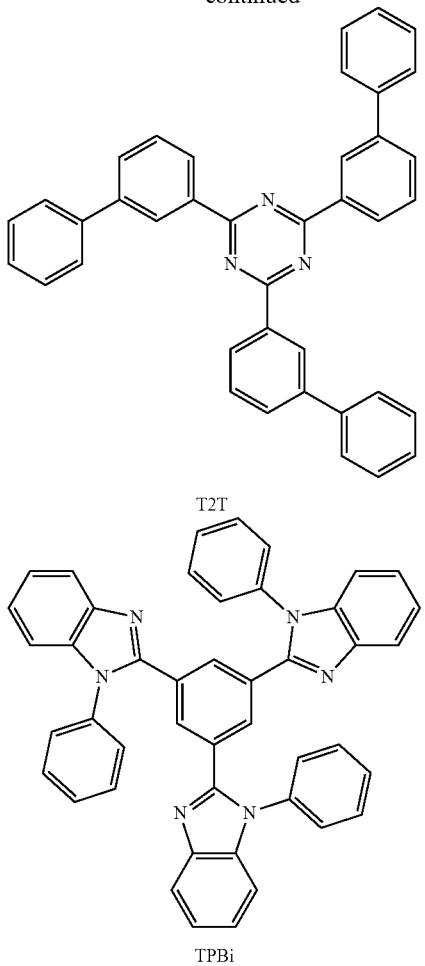

T2T

TPBi

Comparative Examples 1-2, 2-1, 2-2, 3-1, 3-2, 4-1, and 4-2

In Comparative Examples 1-2, 2-1, 2-2, 3-1, 3-2, 4-1, and 4-2, compounds shown in Table 2 were used in forming a hole injection layer and a hole transport layer, instead of Compound 1-1.

Here, the heat treatment process after the device manufacture was omitted regarding the light-emitting devices of Comparative Examples 1-2, 2-2, 3-2, and 4-2.

Examples 1-1 to 1-3

Light-emitting devices of Examples 1-1, 1-2, and 1-3 were manufactured in the same manner as in Comparative Example 1-1, except that Compounds 1-2, 1-3, and 1-4 were used instead of Compound 1-1 in forming a hole injection layer.

Examples 1-4 to 1-6

Light-emitting devices of Examples 1-4, 1-5, and 1-6 were manufactured in the same manner as in Comparative Example 1-1, except that Compounds 1-1 and 1-4 were co-deposited at a ratio of 9:1, 7:3, and 5:5, respectively, instead of Compound 1-1 in forming a hole injection layer.

Examples 2-1 to 2-3

Light-emitting devices of Examples 2-2, 2-3, and 2-4 were manufactured in the same manner as in Comparative Example 2-1, except that Compounds 2-2, 2-3, and 2-4 were used instead of Compound 2-1 in forming a hole injection layer.

Examples 2-4 to 2-6

Light-emitting devices of Examples 2-4, 2-5, and 2-6 were manufactured in the same manner as in Comparative Example 2-1, except that Compounds 2-1 and 2-4 were co-deposited at a ratio of 9:1, 7:3, and 5:5, respectively, instead of Compound 2-1 in forming a hole injection layer.

Examples 3-1 to 3-3

Light-emitting devices of Examples 3-1, 3-2, and 3-3 were manufactured in the same manner as in Comparative Example 3-1, except that Compounds 3-2, 3-3, and 3-4 were used instead of Compound 3-1 in forming a hole injection layer.

Examples 3-4 to 3-6

Light-emitting devices of Examples 3-4, 3-5, and 3-6 were manufactured in the same manner as in Comparative Example 3-1, except that Compounds 3-1 and 3-4 were co-deposited at a ratio of 9:1, 7:3, and 5:5, respectively, instead of Compound 3-1 in forming a hole injection layer.

Examples 4-1 to 4-3

Light-emitting devices of Examples 4-1, 4-2, and 4-3 were manufactured in the same manner as in Comparative Example 4-1, except that Compounds 4-2, 4-3, and 4-4 were used instead of Compound 4-1 in forming a hole injection layer.

Examples 4-4 to 4-6

Light-emitting devices of Examples 4-4, 4-5, and 4-6 were manufactured in the same manner as in Comparative Example 4-1, except that Compounds 4-1 and 4-4 were co-deposited at a ratio of 9:1, 7:3, and 5:5, respectively, instead of Compound 4-1 in forming a hole injection layer.

Evaluation Example 2: Evaluation of Device Performance

The driving voltage, current efficiency, and lifespan ($T_{97}$) of the light-emitting devices manufactured according to Comparative Examples 1-1 to 4-2 and Examples 1-1 to 4-6 were measured using a Keithley SMU 236 and luminance meter PR650, and the results are shown in Table 2. The lifespan ($T_{97}$) is a period of time that was taken until the luminance (@400 nit) was reduced to 97% of initial luminance (100%) after a light-emitting device was driven.

TABLE 2

| | Hole injection layer | Hole transport layer | Driving voltage (V) | Efficiency (cd/A) | Lifespan at $T_{97}$ (h) |
|---|---|---|---|---|---|
| Comparative Example 1-1 | 1-1 | 1-1 | 3.78 | 8.08 | 201 |

TABLE 2-continued

| | Hole injection layer | Hole transport layer | Driving voltage (V) | Efficiency (cd/A) | Lifespan at $T_{97}$ (h) |
|---|---|---|---|---|---|
| Comparative Example 1-2 | 1-4 | 1-4 | 3.75 | 8.39 | 259* |
| Example 1-1 | 1-2 | 1-1 | 3.73 | 8.15 | 206 |
| Example 1-2 | 1-3 | 1-1 | 3.70 | 8.31 | 217 |
| Example 1-3 | 1-4 | 1-1 | 3.66 | 8.50 | 242 |
| Example 1-4 | 1-1:1-4 (9:1) | 1-1 | 3.77 | 8.42 | 235 |
| Example 1-5 | 1-1:1-4 (7:3) | 1-1 | 3.74 | 8.44 | 234 |
| Example 1-6 | 1-1:1-4 (5:5) | 1-1 | 3.71 | 8.45 | 249 |
| Comparative Example 2-1 | 2-1 | 2-1 | 3.67 | 8.17 | 241 |
| Comparative Example 2-2 | 2-4 | 2-4 | 3.63 | 8.40 | 281* |
| Example 2-1 | 2-2 | 2-1 | 3.60 | 8.35 | 245 |
| Example 2-2 | 2-3 | 2-1 | 3.59 | 8.53 | 253 |
| Example 2-3 | 2-4 | 2-1 | 3.55 | 8.64 | 268 |
| Example 2-4 | 2-1:2-4 (9:1) | 2-1 | 3.57 | 8.57 | 267 |
| Example 2-5 | 2-1:2-4 (7:3) | 2-1 | 3.56 | 8.53 | 255 |
| Example 2-6 | 2-1:2-4 (5:5) | 2-1 | 3.55 | 8.61 | 264 |
| Comparative Example 3-1 | 3-1 | 3-1 | 3.85 | 7.98 | 181 |
| Comparative Example 3-2 | 3-4 | 3-4 | 3.81 | 8.15 | 228* |
| Example 3-1 | 3-2 | 3-1 | 3.80 | 8.12 | 185 |
| Example 3-2 | 3-3 | 3-1 | 3.82 | 8.15 | 196 |
| Example 3-3 | 3-4 | 3-1 | 3.77 | 8.23 | 202 |
| Example 3-4 | 3-1:3-4 (9:1) | 3-1 | 3.78 | 8.19 | 198 |
| Example 3-5 | 3-1:3-4 (7:3) | 3-1 | 3.79 | 8.20 | 192 |
| Example 3-6 | 3-1:3-4 (5:5) | 3-1 | 3.79 | 8.18 | 195 |
| Comparative Example 4-1 | 4-1 | 4-1 | 3.57 | 8.57 | 287 |
| Comparative Example 4-2 | 4-4 | 4-4 | 3.53 | 9.30 | 310* |
| Example 4-1 | 4-2 | 4-1 | 3.57 | 9.12 | 283 |
| Example 4-2 | 4-3 | 4-1 | 3.56 | 9.19 | 291 |
| Example 4-3 | 4-4 | 4-1 | 3.52 | 9.32 | 310 |
| Example 4-4 | 4-1:4-4 (9:1) | 4-1 | 3.54 | 9.20 | 294 |
| Example 4-5 | 4-1:4-4 (7:3) | 4-1 | 3.55 | 9.26 | 297 |
| Example 4-6 | 4-1:4-4 (9:1) | 4-1 | 3.54 | 9.28 | 295 |

The data marked with * are the results obtained without performing the heat treatment process after manufacturing the light-emitting device.

As shown in Table 2, the light-emitting devices of Examples in which the hole injection layer includes the compound having a glass transition temperature lower than the glass transition temperature of the compound included in the hole transport layer had lowered driving voltage, improved efficiency, and especially significantly improved lifespan, compared to the light-emitting devices of Comparative Examples in which the hole injection layer and the hole transport layer include the same compounds.

It was confirmed that the light-emitting devices according to an embodiment of the disclosure exhibited excellent effects in terms of a driving voltage, luminescence efficiency, and a lifespan.

According to the embodiments, a light-emitting device may have a low driving voltage, high efficiency, and a long lifespan.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A light-emitting device comprising:
    a first electrode;
    a second electrode facing the first electrode; and
    an interlayer disposed between the first electrode and the second electrode, wherein
    the interlayer comprises an emission layer, and a hole transport region disposed between the first electrode and the emission layer,
    the hole transport region comprises a hole injection layer, and a hole transport layer disposed between the hole injection layer and the emission layer,
    the hole injection layer comprises a first compound,
    the hole transport layer comprises a second compound,
    a glass transition temperature of the first compound is lower than a glass transition temperature of the second compound,
    the first compound is an amine compound represented by Formula 1, and
    the second compound is an amine compound represented by Formula 2:

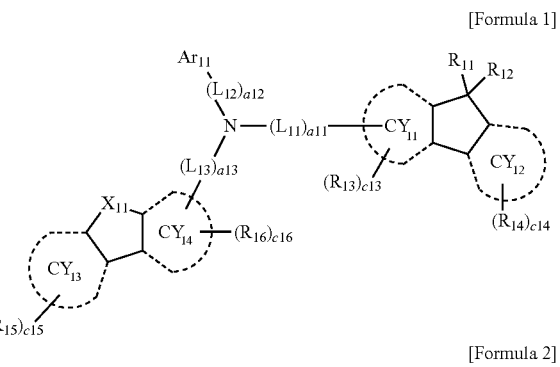

wherein in Formulae 1 and 2,
ring $CY_{11}$ to ring $CY_{14}$ and ring $CY_{21}$ to ring $CY_{24}$ are each independently a $C_3$-$C_{30}$ carbocyclic group or a $C_1$-$C_{20}$ heterocyclic group,
$L_{11}$ to $L_{13}$ and $L_{21}$ to $L_{23}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a13 and a21 to a23 are each independently an integer from 0 to 5, $Ar_{11}$ and $Ar_{21}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{11}$ is O, S, N($R_{17}$), C($R_{17}$)($R_{18}$), or Si($R_{17}$)($R_{18}$), $X_{21}$ is O, S, N($R_{27}$), C($R_{27}$)($R_{28}$), or Si($R_{27}$)($R_{28}$), $R_{11}$ and $R_{12}$ are each independently a $C_2$-$C_{11}$ alkyl group unsubstituted or substituted with at least one $R_{10a}$, $R_{21}$ and $R_{22}$ are each independently a $C_1$-$C_{10}$ alkyl group unsubstituted or substituted with at least one $R_{10a}$, $R_{21}$ and $R_{22}$ in Formula 2 are alkyl groups having fewer carbon atoms than $R_{11}$ and $R_{12}$ in Formula 1, respectively, $R_{13}$ to $R_{18}$ and $R_{23}$ to $R_{28}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —B($Q_1$)($Q_2$), —P($Q_1$)($Q_2$), or —C(=O)($Q_1$), $R_{17}$ and $R_{18}$ are optionally linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{27}$ and $R_{28}$ are optionally linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, c13, c16, c23, and c26 are each independently an integer from 1 to 3, c14, c15, c24, and c25 are each independently an integer from 1 to 4, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$, $Q_2$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein the hole injection layer further comprises a third compound having a glass transition temperature higher than the glass transition temperature of the first compound.

3. The light-emitting device of claim 2, wherein the third compound is identical to the second compound included in the hole transport layer.

4. The light-emitting device of claim 2, wherein a weight ratio of the first compound to the third compound in the hole injection layer is in a range of about 9:1 to about 1:9.

5. The light-emitting device of claim 1, wherein $Ar_{11}$ and $Ar_{21}$ in Formulae 1 and 2 are each independently a cyclopentyl group, a cyclohexyl group, a cycloheptyl group, a cyclopentenyl group, a cyclohexenyl group, a phenyl group, a biphenyl group, a terphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrycenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bi, dibenzothiophenylfluorenyl group, an azacarbazolyl group, a diazacarbazolyl group, an azadibenzofuranyl group, an azadibenzothiophenyl group, an azadibenzosilolyl group, an imidazopyridinyl group, or an imidazopyrimidinyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkyl group substituted with at least one phenyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrycenyl group, a perylenyl group, a pentaphenyl group, a hexacenyl group, a pentacenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a triazinyl group, an indolyl group, an isoindolyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, a dibenzofuranyl group, a dibenzothiophenyl group, a dibenzosilolyl group, a carbazolyl group, a benzocarbazolyl group, a dibenzocarbazolyl group, an azafluorenyl group, an azaspiro-bi, dibenzothiophenylfluorenyl group, an azacarbazolyl group, a diazacarbazolyl group, an azadibenzofuranyl group, an azadibenzothiophenyl group, an azadibenzosilolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or a combination thereof.

6. The light-emitting device of claim 1, wherein
$R_{11}$ and $R_{12}$ in Formula 1 are each independently a $C_2$-$C_6$ alkyl group unsubstituted or substituted with at least one $R_{10a}$, and
$R_{21}$ and $R_{22}$ in Formula 2 are each independently a $C_1$-$C_5$ alkyl group unsubstituted or substituted with at least one $R_{10a}$.

7. The light-emitting device of claim 1, wherein
$R_{11}$ and $R_{12}$ in Formula 1 are each independently an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, a 1-methylbutyl group, an n-hexyl group, a 1,3-dimethylbutyl group, a 3,3-dimethylbutyl group, a 2-ethylbutyl group, a 2-ethyl-2-methylpropyl group, an n-heptyl group, an n-octyl group, an n-nonyl group, an n-decyl group, or an n-undecyl group, and
$R_{21}$ and $R_{22}$ in Formula 2 are each independently a methyl group, an ethyl group, an n-propyl group, an iso-propyl group, an n-butyl group, an iso-butyl group, a sec-butyl group, a tert-butyl group, an n-pentyl group, a tert-pentyl group, a neo-pentyl group, an iso-pentyl group, a sec-pentyl group, a 3-pentyl group, a sec-isopentyl group, a 1-methylbutyl group, an n-hexyl group, a 1,3-dimethylbutyl group, a 3,3-dimethylbutyl group, a 2-ethylbutyl group, a 2-ethyl-2-methylpropyl group, an n-heptyl group, an n-octyl group, an n-nonyl group, or an n-decyl group.

8. The light-emitting device of claim 1, wherein
$R_{11}$ and $R_{12}$ in Formula 1 are identical to each other, and
$R_{21}$ and $R_{22}$ in Formula 2 are identical to each other.

9. The light-emitting device of claim 1, wherein
the hole injection layer comprises two or more different first compounds represented by Formula 1, and
at least one of the two or more different first compounds has a glass transition temperature lower than the glass transition temperature of the second compound.

10. The light-emitting device of claim 1, wherein the hole injection layer further comprises a p-dopant.

11. The light-emitting device of claim 1, wherein the hole transport region further comprises an emission auxiliary layer, an electron blocking layer, or a combination thereof.

12. The light-emitting device of claim 1, wherein the hole transport region further comprises an electron blocking layer disposed between the hole transport layer and the emission layer.

13. The light-emitting device of claim 1, wherein
the interlayer further comprises an electron transport region disposed between the emission layer and the second electrode, and
the electron transport region comprises a buffer layer, a hole blocking layer, an electron control layer, an electron transport layer, an electron injection layer, or a combination thereof.

14. The light-emitting device of claim 13, wherein the electron transport region comprises a hole blocking layer, an electron transport layer, and an electron injection layer that are sequentially disposed on the emission layer.

15. A method of manufacturing a light-emitting device, the method comprising:
forming a hole injection layer on a first electrode, the hole injection layer comprising a first compound;
forming a hole transport layer on the hole injection layer, the hole transport layer including a second compound having a glass transition temperature higher than a glass transition temperature of the first compound;
forming an emission layer on the hole transport layer;
forming a second electrode on the emission layer to form a light-emitting device; and
performing heat treatment on the light-emitting device, wherein
the first compound is an amine compound represented by Formula 1, and
the second compound is an amine compound represented by Formula 2:

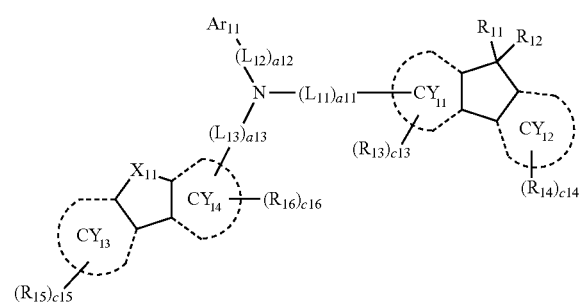

[Formula 1]

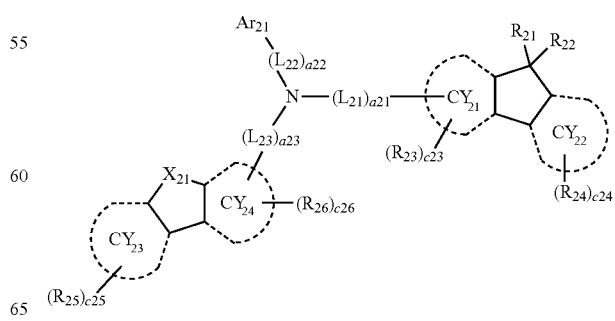

[Formula 2]

wherein in Formulae 1 and 2, ring $CY_{11}$ to ring $CY_{14}$ and ring $CY_{21}$ to ring $CY_{24}$ are each independently a $C_3$-$C_{30}$ carbocyclic group or a $C_1$-$C_{20}$ heterocyclic group, $L_{11}$ to $L_{13}$ and $L_{21}$ to $L_{23}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 to a13 and a21 to a23 are each independently an integer from 0 to 5, $Ar_{11}$ and $Ar_{21}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{11}$ is O, S, $N(R_{17})$, $C(R_{17})(R_{18})$, or $Si(R_{17})(R_{18})$, $X_{21}$ is O, S, $N(R_{27})$, $C(R_{27})(R_{28})$, or $Si(R_{27})(R_{28})$, $R_{11}$ and $R_{12}$ are each independently a $C_2$-$C_{11}$ alkyl group unsubstituted or substituted with at least one $R_{10a}$, $R_{21}$ and $R_{22}$ are each independently a $C_1$-$C_{10}$ alkyl group unsubstituted or substituted with at least one $R_{10a}$, $R_{21}$ and $R_{22}$ in Formula 2 are alkyl groups having fewer carbon atoms than $R_{11}$ and $R_{12}$ in Formula 1, respectively, $R_{13}$ to $R_{18}$ and $R_{23}$ to $R_{28}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$B(Q_1)(Q_2)$, —$P(Q_1)(Q_2)$, or —$C(\text{=O})(Q_1)$, $R_{17}$ and $R_{18}$ are optionally linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{27}$ and $R_{28}$ are optionally linked to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$, to form a $C_8$-$C_{60}$ polycyclic group unsubstituted or substituted with at least one $R_{10a}$, c13, c16, c23, and c26 are each independently an integer from 1 to 3, c14, c15, c24, and c25 are each independently an integer from 1 to 4, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —$N(Q_{11})(Q_{12})$, —$B(Q_{11})(Q_{12})$, —$C(\text{=O})(Q_{11})$, —$S(\text{=O})_2(Q_{11})$, —$P(\text{=O})(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —$N(Q_{21})(Q_{22})$, —$B(Q_{21})(Q_{22})$, —$C(\text{=O})(Q_{21})$, —$S(\text{=O})_2(Q_{21})$, —$P(\text{=O})(Q_{21})(Q_{22})$, or a combination thereof; or —Si$(Q_{31})(Q_{32})(Q_{33})$, —$N(Q_{31})(Q_{32})$, —$B(Q_{31})(Q_{32})$, —$C(\text{=O})(Q_{31})$, —$S(\text{=O})_2(Q_{31})$, —$P(\text{=O})(Q_{31})(Q_{32})$, and $Q_1$, $Q_2$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

16. An electronic apparatus comprising the light-emitting device of claim 1.

17. The electronic apparatus of claim 16, wherein
the electronic apparatus further comprises a thin-film transistor,
the thin-film transistor comprises a source electrode and a drain electrode, and
the first electrode of the light-emitting device is in electrical contact with one of the source electrode and the drain electrode of the thin-film transistor.

18. The electronic apparatus of claim 16, wherein the electronic apparatus further comprises a color filter, a color conversion layer, a touch screen layer, a polarization layer, or a combination thereof.

19. The electronic apparatus of claim 16, wherein the electronic apparatus is applied to displays, light sources, lighting, personal computers, mobile personal computer, mobile phones, digital cameras, electronic organizers, electronic dictionaries, electronic game machines, medical instruments, electronic thermometers, sphygmomanometers, blood glucose meters, pulse measurement devices, pulse wave measurement devices, electrocardiogram displays, ultrasonic diagnostic devices, endoscope displays, fish finders, meters for a vehicle, meters for an aircraft, meters for a vessel, or projectors.

* * * * *